US012593608B2

(12) United States Patent
Um et al.

(10) Patent No.: US 12,593,608 B2
(45) Date of Patent: Mar. 31, 2026

(54) LIGHT EMITTING ELEMENT

(71) Applicant: Samsung Display Co., Ltd., Yongin-si (KR)

(72) Inventors: Hyunah Um, Seoul (KR); Minje Kim, Suwon-si (KR); Youngjin Park, Suwon-si (KR); Heechoon Ahn, Seoul (KR); Juhui Yun, Suwon-si (KR); Yeseul Lee, Hwaseong-si (KR); Yirang Im, Daejeon (KR)

(73) Assignee: Samsung Display Co., Ltd., Yongin-si (KR)

( * ) Notice: Subject to any disclaimer, the term of this patent is extended or adjusted under 35 U.S.C. 154(b) by 987 days.

(21) Appl. No.: 17/748,389

(22) Filed: May 19, 2022

(65) Prior Publication Data

US 2023/0129321 A1 Apr. 27, 2023

(30) Foreign Application Priority Data

Sep. 13, 2021 (KR) ........................ 10-2021-0121858

(51) Int. Cl.

*H10K 85/60* (2023.01)
*H10K 85/30* (2023.01)
*H10K 85/40* (2023.01)
*H10K 50/16* (2023.01)

(52) U.S. Cl.

CPC ....... *H10K 85/6572* (2023.02); *H10K 85/346* (2023.02); *H10K 85/40* (2023.02); *H10K 85/654* (2023.02); *H10K 85/6574* (2023.02); *H10K 50/16* (2023.02)

(58) Field of Classification Search

None
See application file for complete search history.

(56) References Cited

U.S. PATENT DOCUMENTS

| | | | | |
|---|---|---|---|---|
| 10,431,766 | B2 | 10/2019 | Ito et al. | |
| 10,727,417 | B2 | 7/2020 | Lee et al. | |
| 11,678,498 | B2 * | 6/2023 | Cho | H10K 85/622 428/690 |
| 2015/0318487 | A1 * | 11/2015 | Ito | H10K 50/165 257/40 |
| 2016/0072075 | A1 * | 3/2016 | Lee | H10K 85/6572 257/40 |
| 2017/0005276 | A1 | 1/2017 | Kim et al. | |
| 2017/0117485 | A1 * | 4/2017 | Cho | C07D 405/14 |
| 2019/0221751 | A1 * | 7/2019 | Cho | H10K 85/6574 |
| 2020/0168819 | A1 | 5/2020 | Ahn et al. | |
| 2020/0235307 | A1 * | 7/2020 | Cho | H10K 85/654 |
| 2020/0274073 | A1 | 8/2020 | Hur et al. | |
| 2021/0074918 | A1 | 3/2021 | Kim et al. | |
| 2021/0074940 | A1 * | 3/2021 | Song | H10K 50/11 |
| 2022/0077406 | A1 * | 3/2022 | Doh | H10K 85/658 |
| 2022/0238818 | A1 * | 7/2022 | Lee | H10K 50/166 |
| 2023/0180604 | A1 * | 6/2023 | Ahn | C07D 413/04 428/690 |
| 2023/0200105 | A1 * | 6/2023 | Yamazaki | H10K 85/621 257/40 |

FOREIGN PATENT DOCUMENTS

| | | | | |
|---|---|---|---|---|
| KR | 10-2015-0024491 A | | 3/2015 | |
| KR | 20150024491 A | * | 3/2015 | H10K 85/6572 |
| KR | 10-2015-0108332 A | | 9/2015 | |
| KR | 10-2015-0126756 | | 11/2015 | |
| KR | 10-2020-0062465 | | 6/2020 | |
| KR | 10-2020-0104469 | | 9/2020 | |
| KR | 10-2021-0016971 | | 2/2021 | |
| KR | 10-2021-0031584 | | 3/2021 | |

OTHER PUBLICATIONS

Machine translation of KR-20150024491-A, translation generated Jun. 2025, 35 pages. (Year: 2025).*

* cited by examiner

*Primary Examiner* — Robert S Loewe
(74) *Attorney, Agent, or Firm* — Womble Bond Dickinson (US) LLP

(57) ABSTRACT

A light emitting element according to an embodiment includes a first electrode, a second electrode disposed on the first electrode, an emission layer disposed between the first electrode and the second electrode, and a double buffer layer including a first layer disposed on the emission layer and a second layer disposed on the first layer. The first layer includes a first compound, the second layer includes a second compound which is different from the first compound, and the first compound and the second compound are each independently represented by Formula 1 or Formula 2, thereby contributing to increased efficiency and increased life of a light emitting element.

[Formula 1]

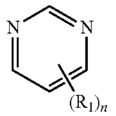

[Formula 2]

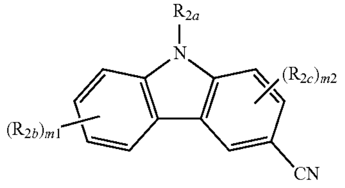

20 Claims, 8 Drawing Sheets

LIGHT EMITTING ELEMENT

CROSS-REFERENCE TO RELATED APPLICATION(S)

This application claims priority to and benefits of Korean Patent Application No. 10-2021-0121858 under 35 U.S.C. § 119, filed on Sep. 13, 2021 in the Korean Intellectual Property Office, the entire contents of which are incorporated herein by reference.

BACKGROUND

1. Technical Field

The disclosure relates to a light emitting element including a polycyclic compound in an emission layer.

2. Description of the Related Art

Active development an organic electroluminescence display as an image display. The organic electroluminescence display is different from a liquid crystal display and is a so-called self-luminescent display in which holes and electrons respectively injected from a first electrode and a second electrode recombine in an emission layer so that a light emitting material in the emission layer emits light to achieve display.

In the application of a light emitting element to an image display, there is a demand for decreasing driving voltage and increasing emission efficiency and life of the light emitting element, and continuous development is required on materials for a light emitting element which is capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element showing high efficiency.

An embodiment provides a light emitting element which may include a first electrode; a second electrode disposed on the first electrode; an emission layer disposed between the first electrode and the second electrode; and a double buffer layer including a first layer disposed on the emission layer and a second layer disposed on the first layer, wherein the first layer may include a first compound, the second layer may include a second compound which is different from the first compound, and the first compound and the second compound may each independently include a pyrimidine group or a carbazole group.

In an embodiment, the first compound and the second compound may each independently be represented by Formula 1 or Formula 2.

[Formula 1]

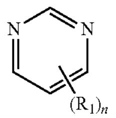

In Formula 1, $R_1$ may be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and n may be an integer from 0 to 4.

[Formula 2]

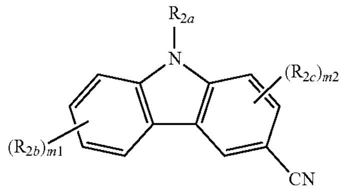

In Formula 2, $R_{2a}$, $R_{2b}$, and $R_{2c}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; m1 may be an integer from 0 to 4; and m2 may be an integer from 0 to 3.

In an embodiment, the emission layer may include a third compound represented by Formula 1 or Formula 2, a fourth compound represented by Formula 3, and a fifth compound represented by Formula 4, wherein the third compound may be different from at least one of the first compound and the second compound.

[Formula 3]

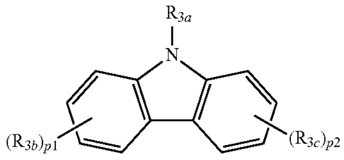

In Formula 3, $R_{3a}$, $R_{3b}$, and $R_{3c}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and p1 and p2 may each independently be an integer from 0 to 4.

[Formula 4]

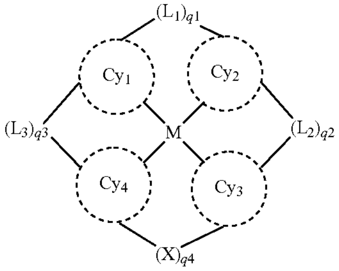

In Formula 4, M may be Pt, Pd, Cu, Au, or Os; X may be O or $C(R_{4a})(R_{4b})$; $Cy_1$, $Cy_2$, $Cy_3$, and $Cy_4$ may each independently be a substituted or unsubstituted hydrocarbon ring of 5 to 60 ring-forming carbon atoms, or a substituted or unsubstituted heterocycle of 1 to 60 ring-forming carbon atoms; $L_1$ to $L_3$ may each independently be a direct linkage,

*—O—*, *—S—*,

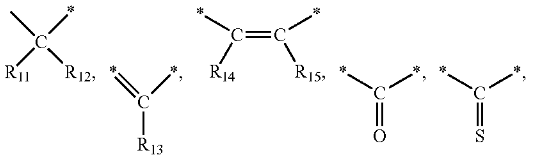

*—C≡C—*,

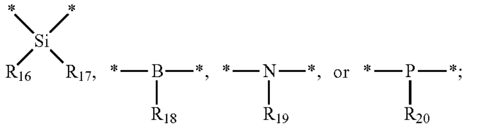

q1 to q4 may each independently be 0 or 1; and $R_{4a}$, $R_{4b}$, and $R_{11}$ to $R_{20}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In an embodiment, at least one of the first compound, the second compound, and the third compound may be represented by Formula 1, and the at least one of the first compound, the second compound, and the third compound that is represented by Formula 1 may be represented by Formula 1-1.

[Formula 1-1]

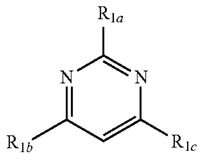

In Formula 1-1, $R_{1a}$, $R_{1b}$, and $R_{1c}$ may each independently be a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In an embodiment, at least one of the first compound, the second compound, and the third compound may be represented by Formula 2, and the at least one of the first compound, the second compound, and the third compound that is represented by Formula 2 may be represented by any one of Formula 2-1, Formula 2-2, or Formula 2-3.

[Formula 2-1]

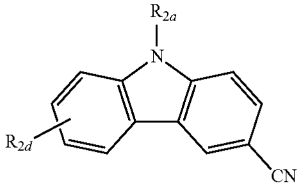

[Formula 2-2]

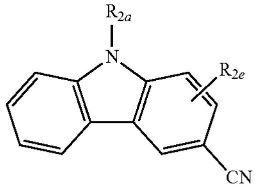

[Formula 2-3]

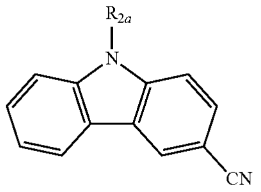

In Formula 2-1 to Formula 2-3, $R_{2a}$, and $R_{2c}$ may each independently be a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and $R_{2a}$ is the same as defined in Formula 2.

In an embodiment, the fourth compound represented by Formula 3 may be represented by Formula 3-1.

[Formula 3-1]

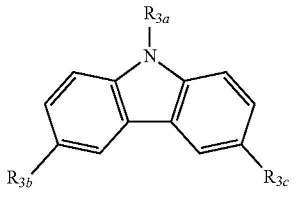

In Formula 3-1, $R_{3a}$, $R_{3b}$, and $R_{3c}$ are the same as defined in Formula 3.
In an embodiment, in Formula 4, M may be Pt.
In an embodiment, the first compound, the second compound, and the third compound may each independently include at least one selected from Compound Group 1.
[Compound Group 1]
E1
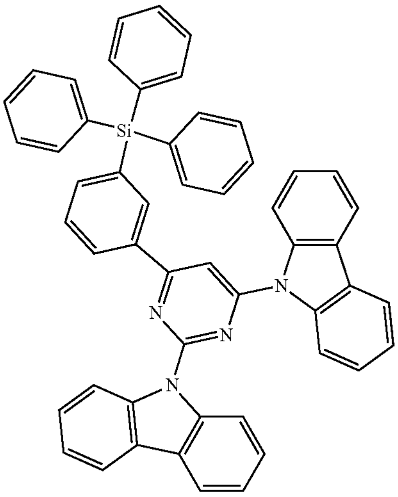
E2
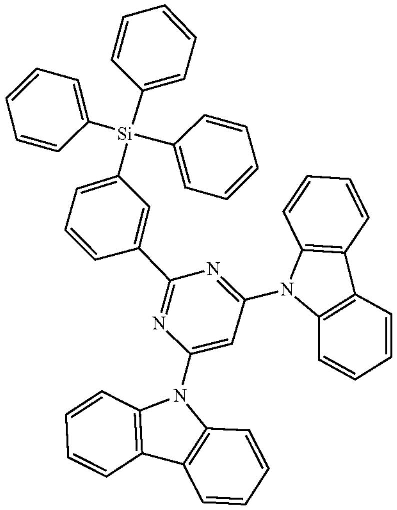
E3
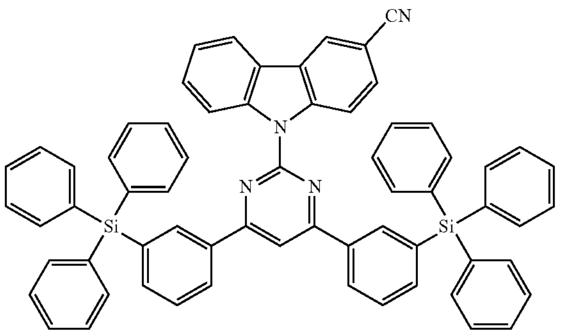
-continued
E4
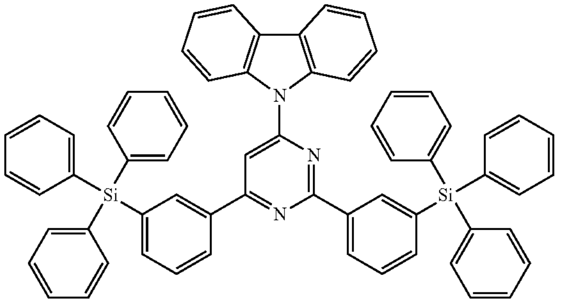
E5
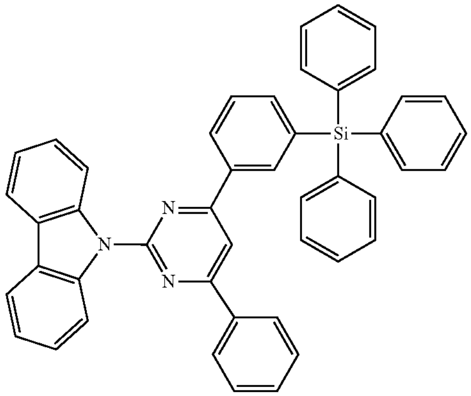
E6
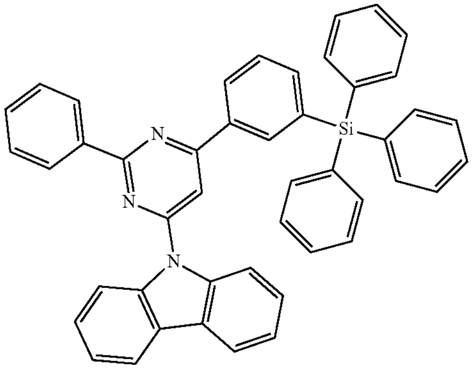
E7
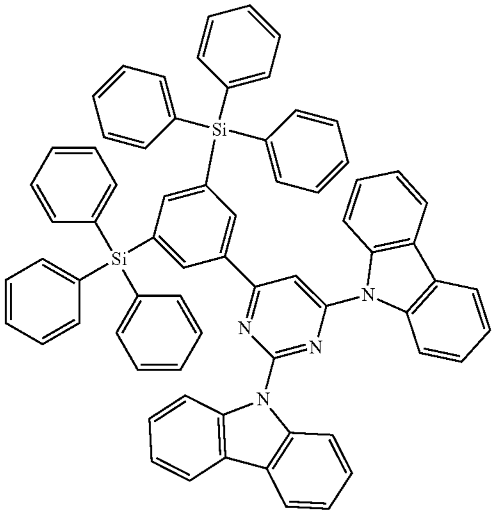

-continued
E8
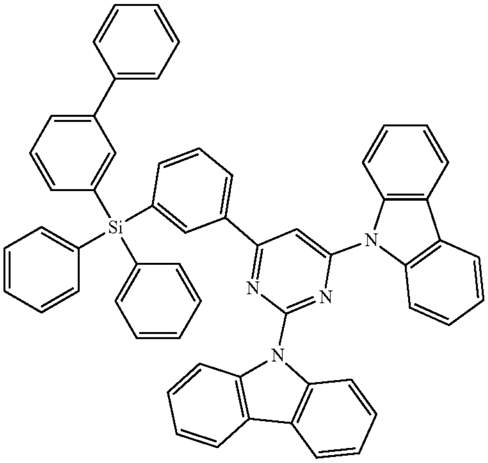
E9
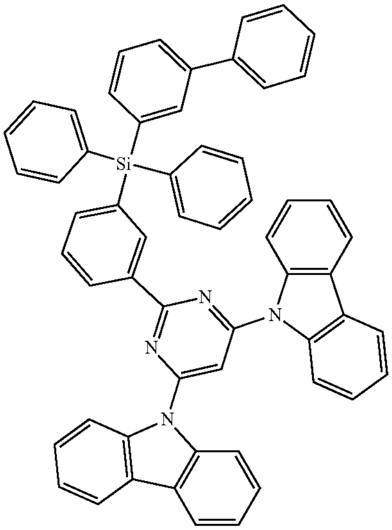
E10
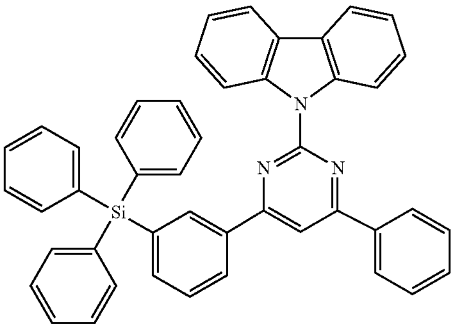
-continued
E11
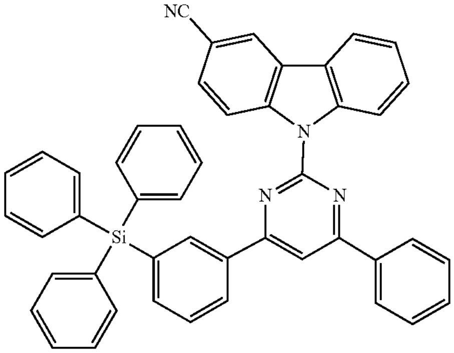
E12
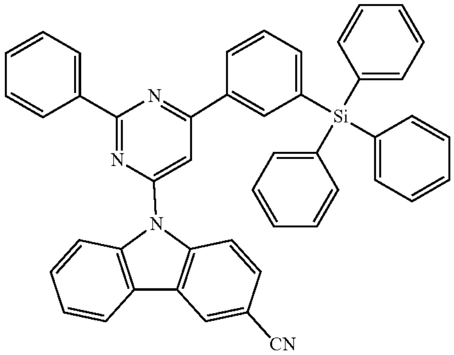
E13
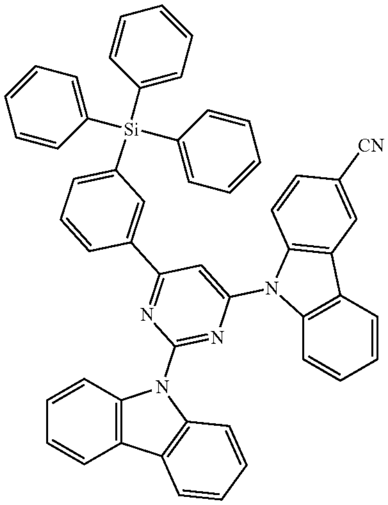
E14
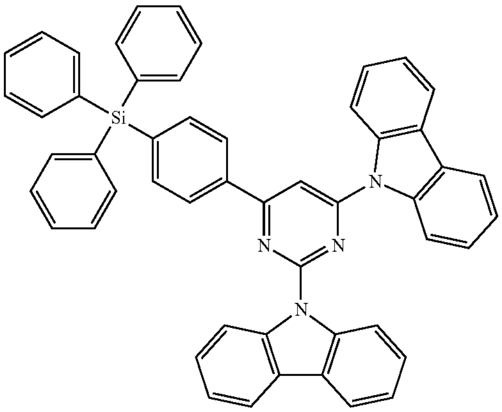

-continued
E15
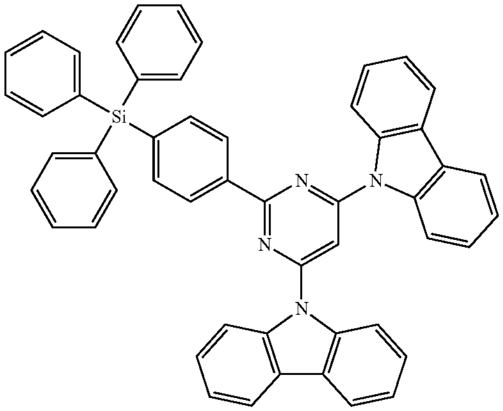
E16
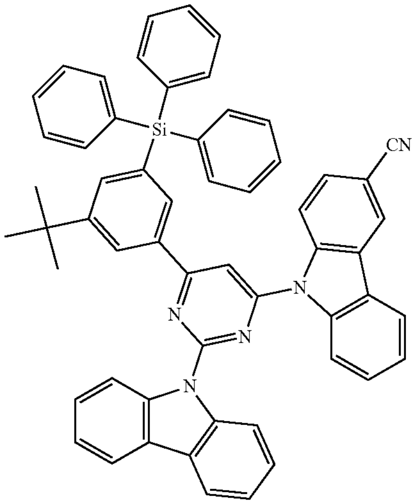
E17
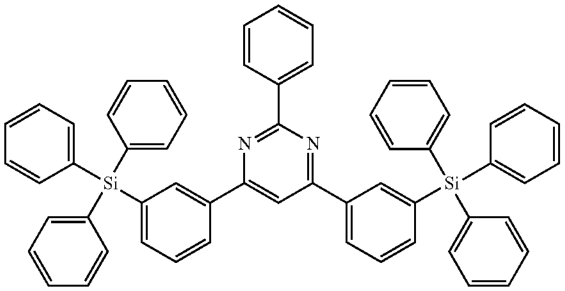
E18
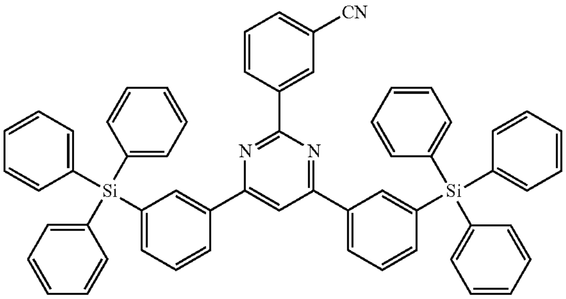
-continued
E19
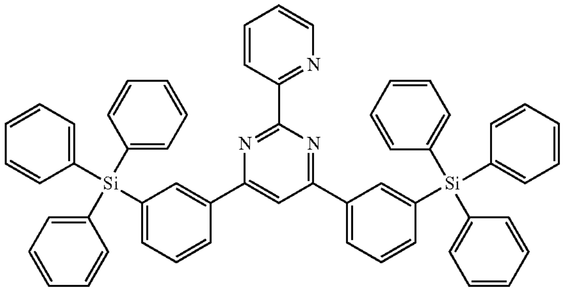
E20
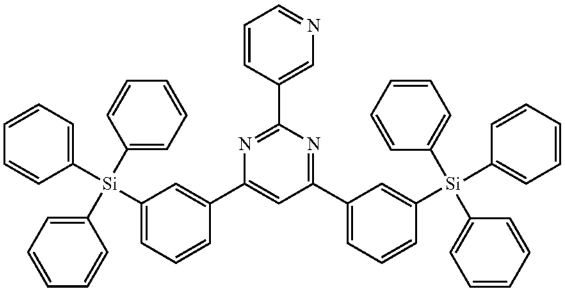
E21
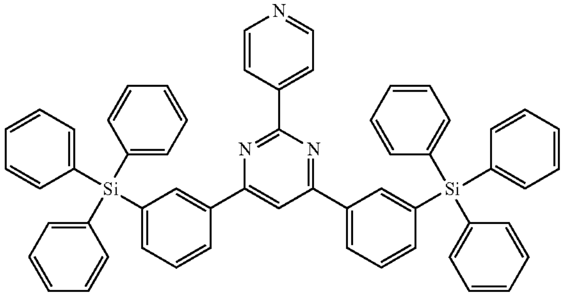
E22
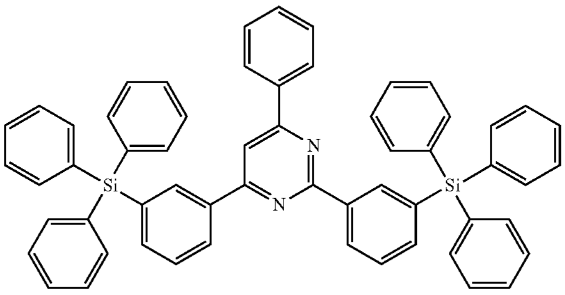
E23
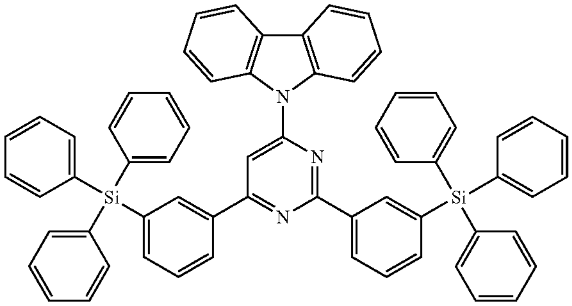

-continued
E24
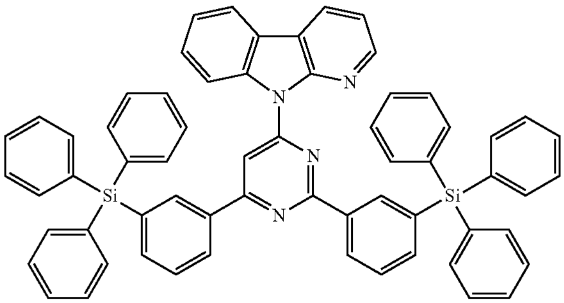
E25
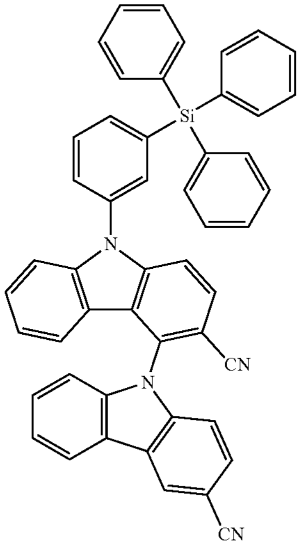
E26
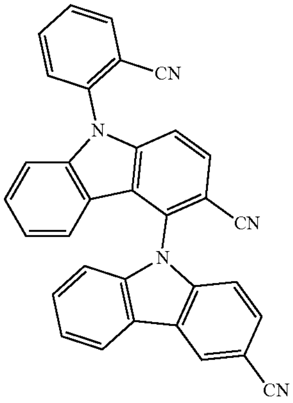
-continued
E27
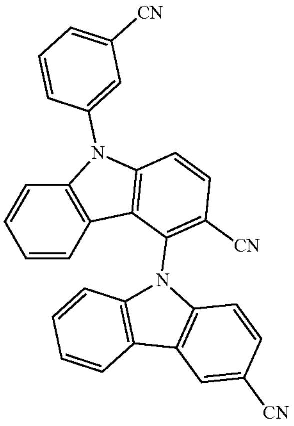
E28
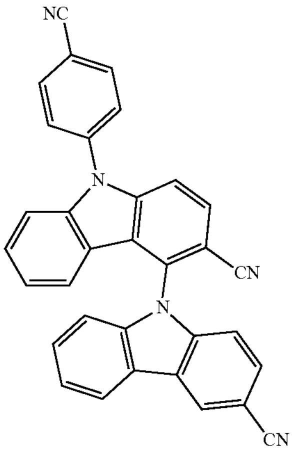
E29
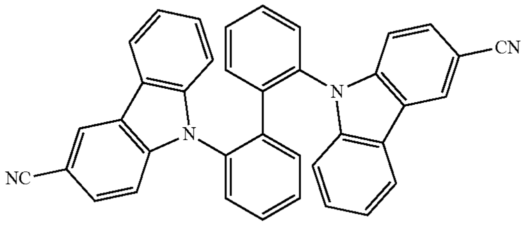
E30
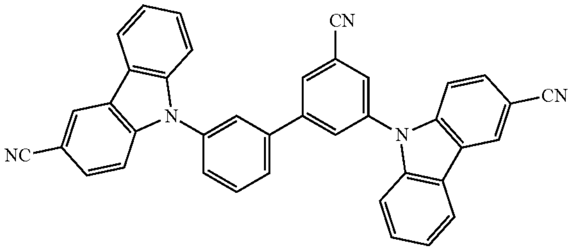

-continued
E31
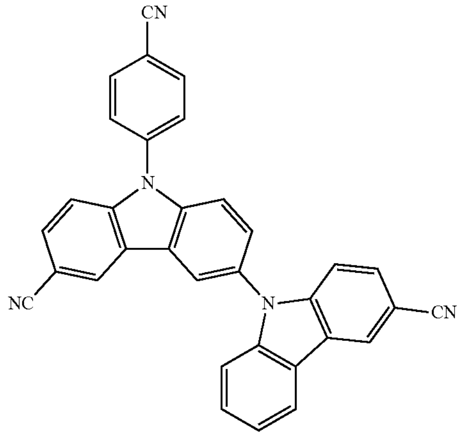
E32
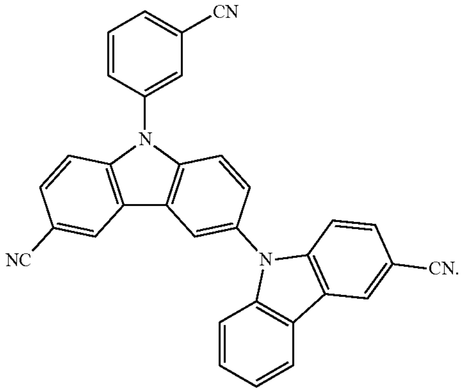
In an embodiment, the fourth compound may include at least one selected from Compound Group 2.
[Compound Group 2]
H1
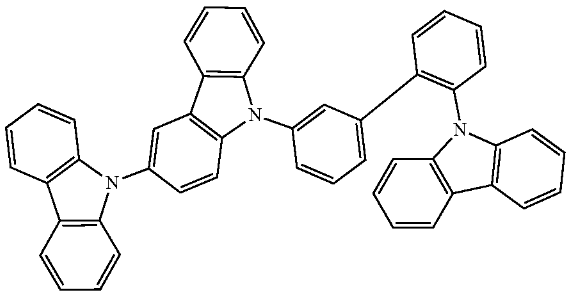
H2
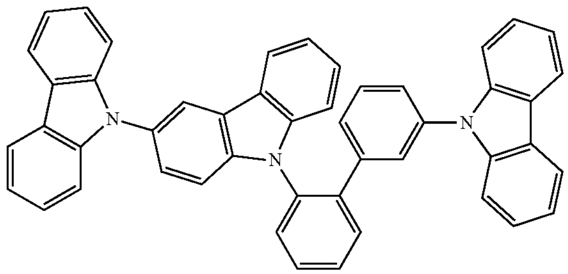
-continued
H3
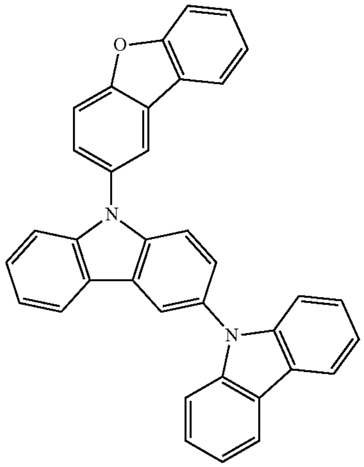
H4
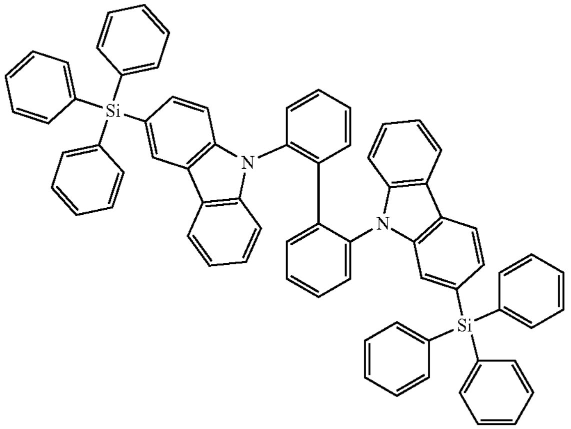
H5
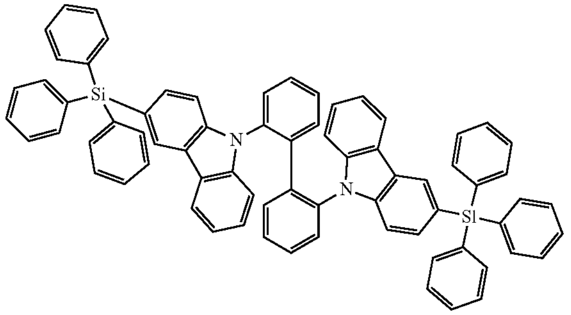
H6
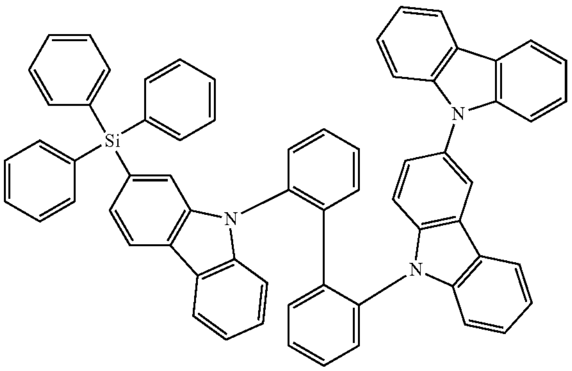

-continued
H7
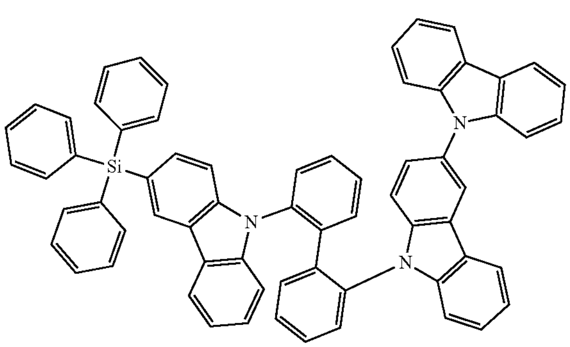
H8
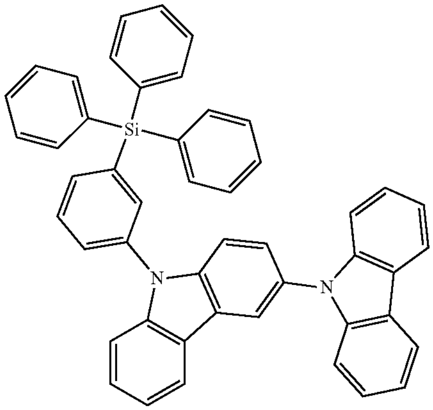
H9
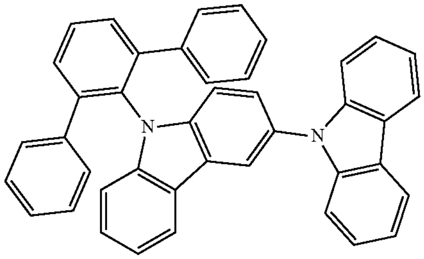
H10
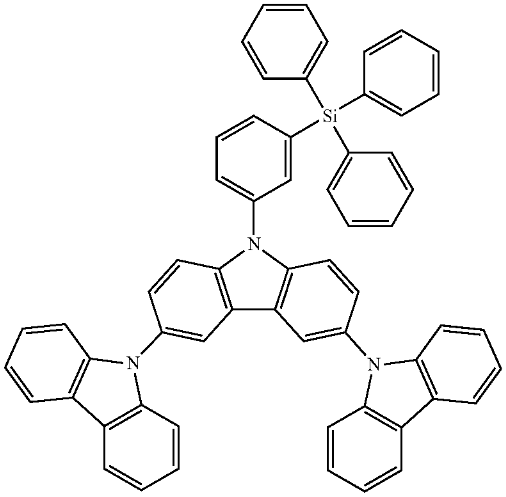
-continued
H11
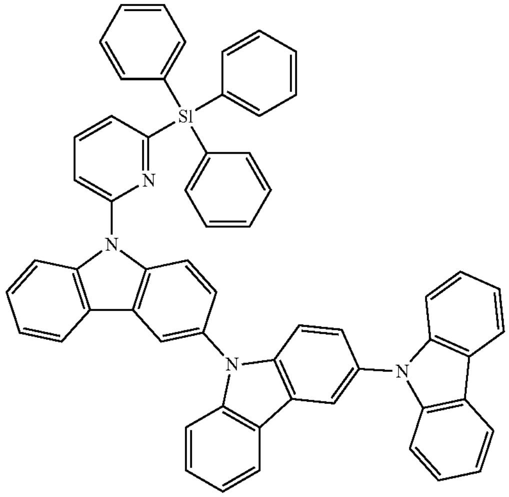
H12
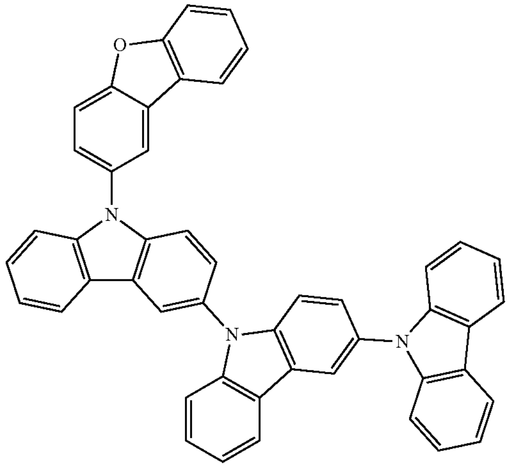
H13
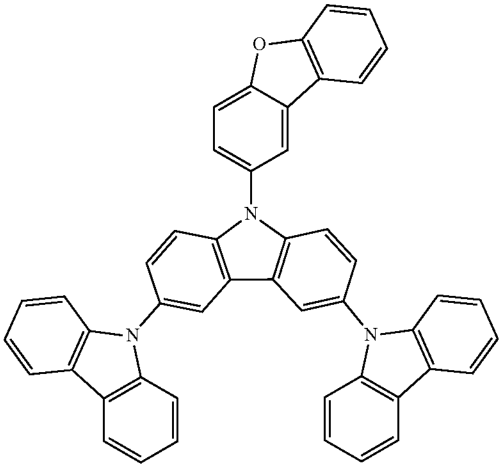

-continued
H14
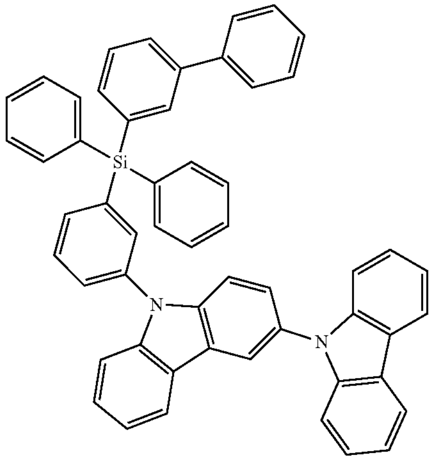
H15
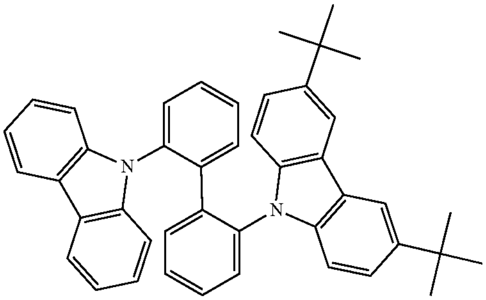
H16
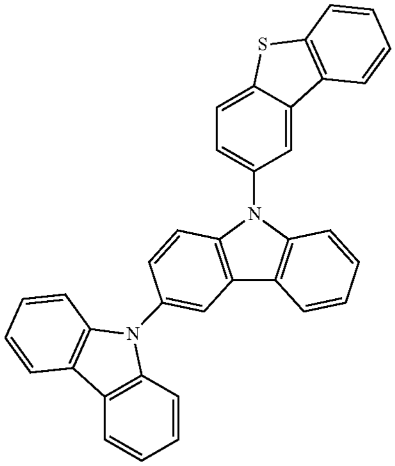
-continued
H17
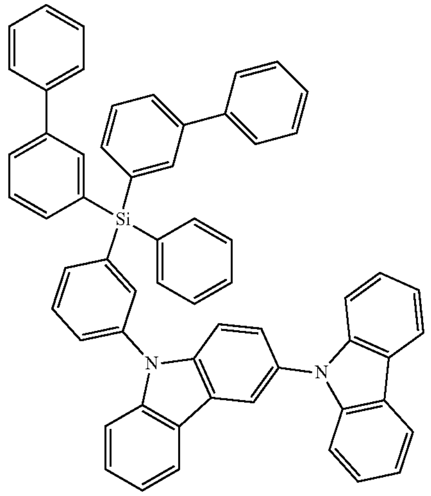
H18
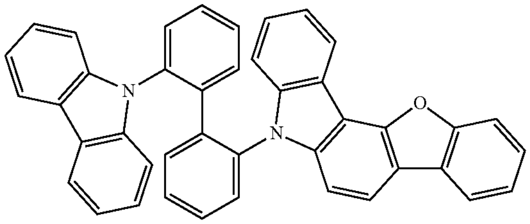
H19
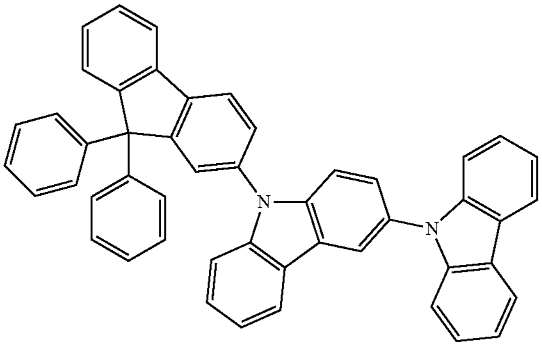
H20
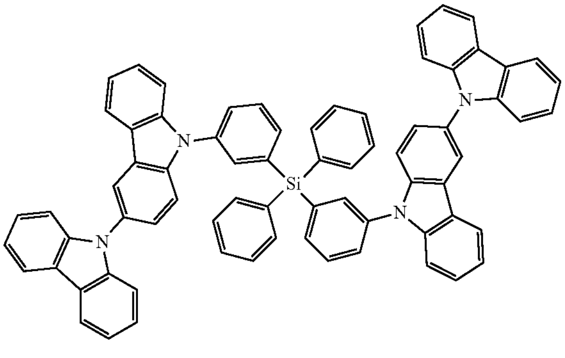

-continued
H21
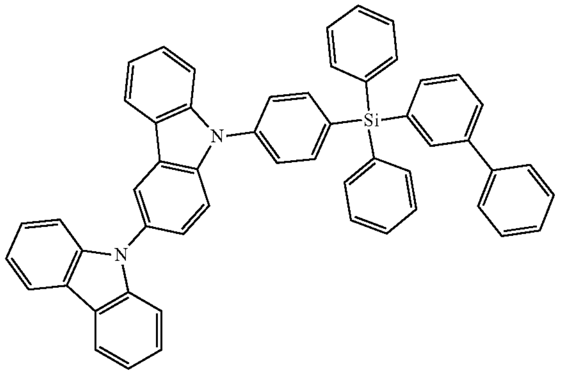
H22
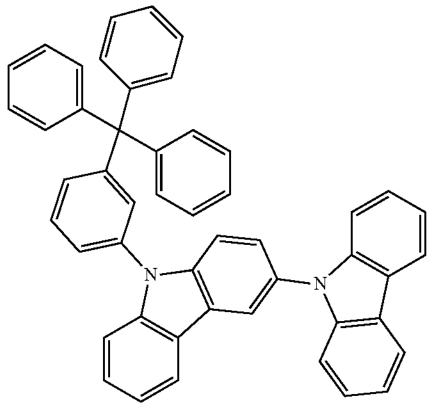
H23
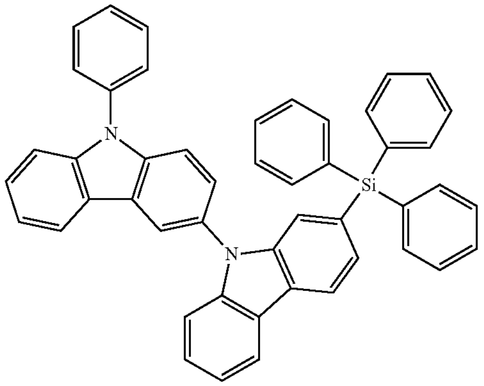
-continued
H24
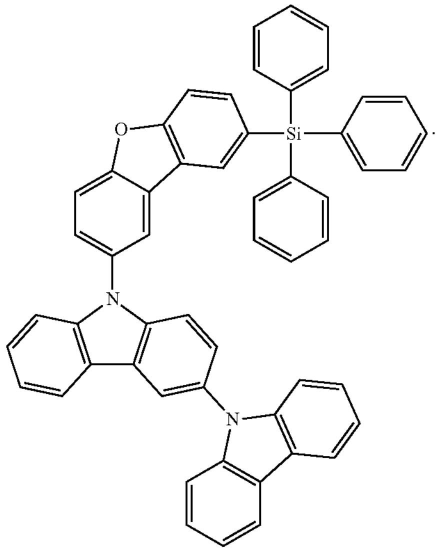
In an embodiment, the fifth compound may include at least one selected from Compound Group 3.
[Compound Group 3]
BD1
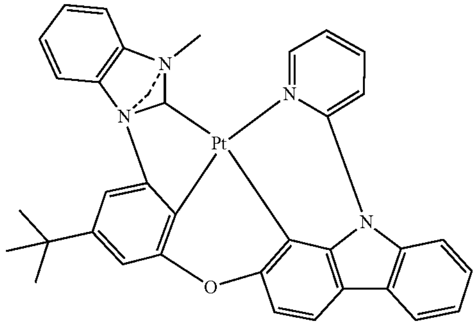
BD2
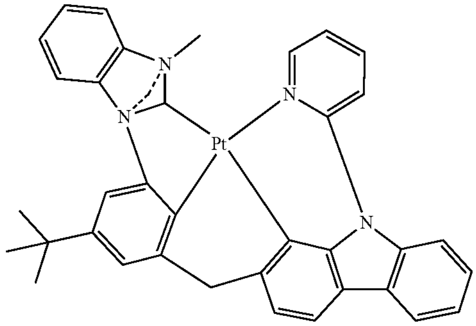

-continued

BD3

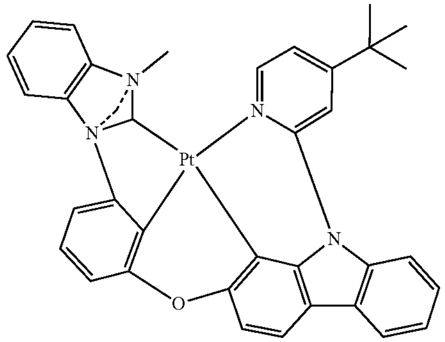

BD4

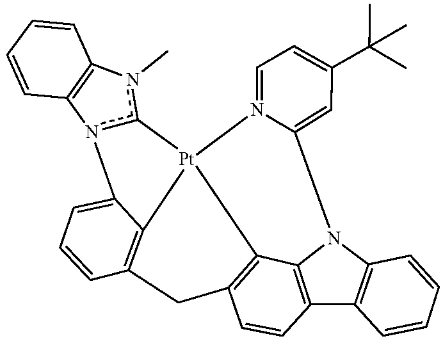

BD4

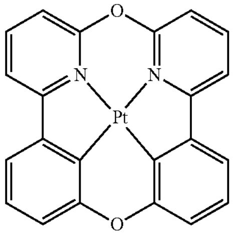

BD6

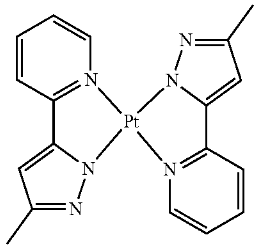

BD7

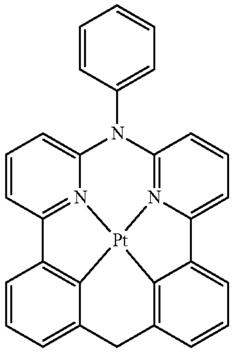

-continued

BD8

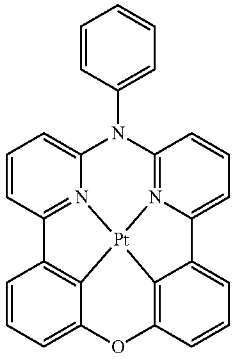

.

In an embodiment, the light emitting element may further include an electron transport region disposed between the double buffer layer and the second electrode.

An embodiment provides a light emitting element which may include a first electrode; a second electrode disposed on the first electrode; an emission layer disposed between the first electrode and the second electrode; and a double buffer layer including a first layer disposed on the emission layer and a second layer disposed on the first layer, wherein the first layer may include a first compound, the second layer may include a second compound which is different from the first compound, and the first compound and the second compound may each independently be represented by Formula 1 or Formula 2.

[Formula 1]

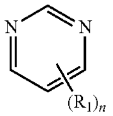

In Formula 1, $R_1$ may be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and n may be an integer from 0 to 4.

[Formula 2]

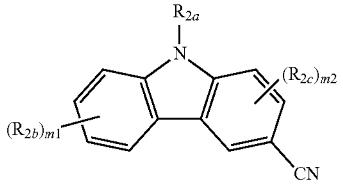

In Formula 2, $R_{2a}$, $R_{2b}$, and $R_{2c}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; m1 may be an integer from 0 to 4; and m2 may be an integer from 0 to 3.

In an embodiment, $R_{1a}$, $R_{1b}$, and $R_{1c}$ may each independently include at least one substituent selected from Substituent Group S-1.

[Substituent Group S-1]

A1

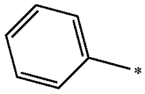

A2

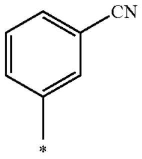

A3

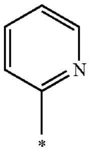

A4

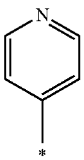

A5

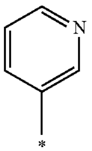

A6

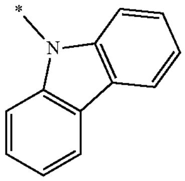

A7

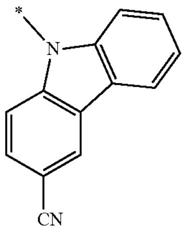

-continued

A8

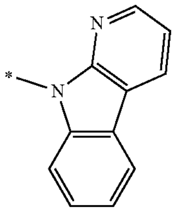

A9

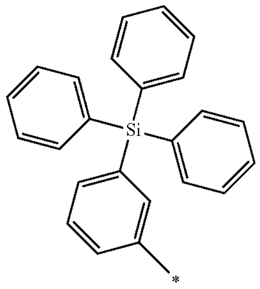

A10

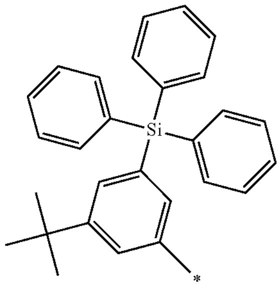

A11

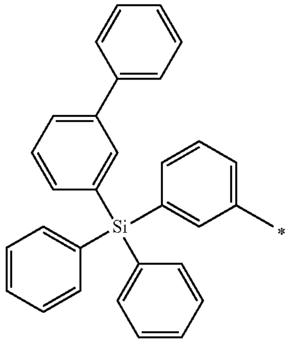

A12

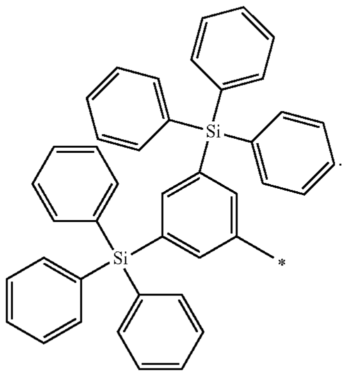

In an embodiment, $R_{2a}$ may include at least one substituent selected from Substituent Group S-2.

[Substituent Group S-2]

B1

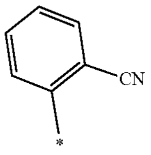

B2

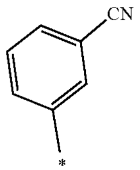

B3

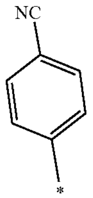

B4

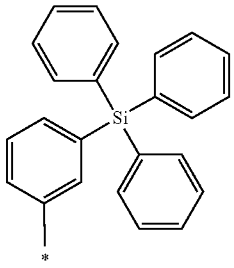

B5

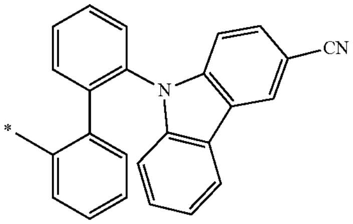

B6

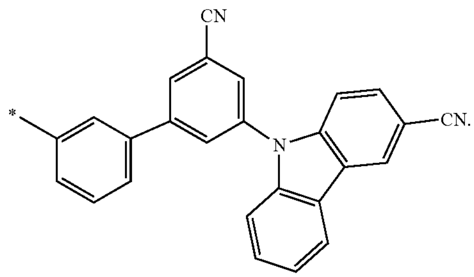

In an embodiment, $R_{2b}$ and $R_{2c}$ may each independently be a hydrogen atom or a substituted or unsubstituted carbazole group.

An embodiment provides a light emitting element which may include a first electrode; a second electrode disposed on the first electrode; an emission layer disposed between the first electrode and the second electrode; a double buffer layer including a first layer disposed on the emission layer and a second layer disposed on the first layer; and an electron transport region disposed on the double buffer layer, wherein the first layer may include a first compound, the second layer may include a second compound which is different from the first compound, the emission layer may include a third compound which is different from at least one of the first compound and the second compound, and the first compound, the second compound and the third compound may each independently be represented by Formula 1 or Formula 2.

[Formula 1]

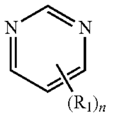

In Formula 1, $R_1$ may be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; and n may be an integer from 0 to 4.

[Formula 2]

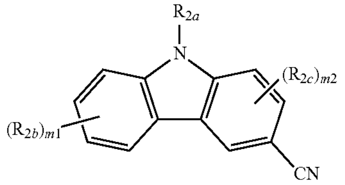

In Formula 2, $R_{2a}$, $R_{2b}$, and $R_{2c}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring; m1 may be an integer from 0 to 4; and m2 may be an integer from 0 to 3.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
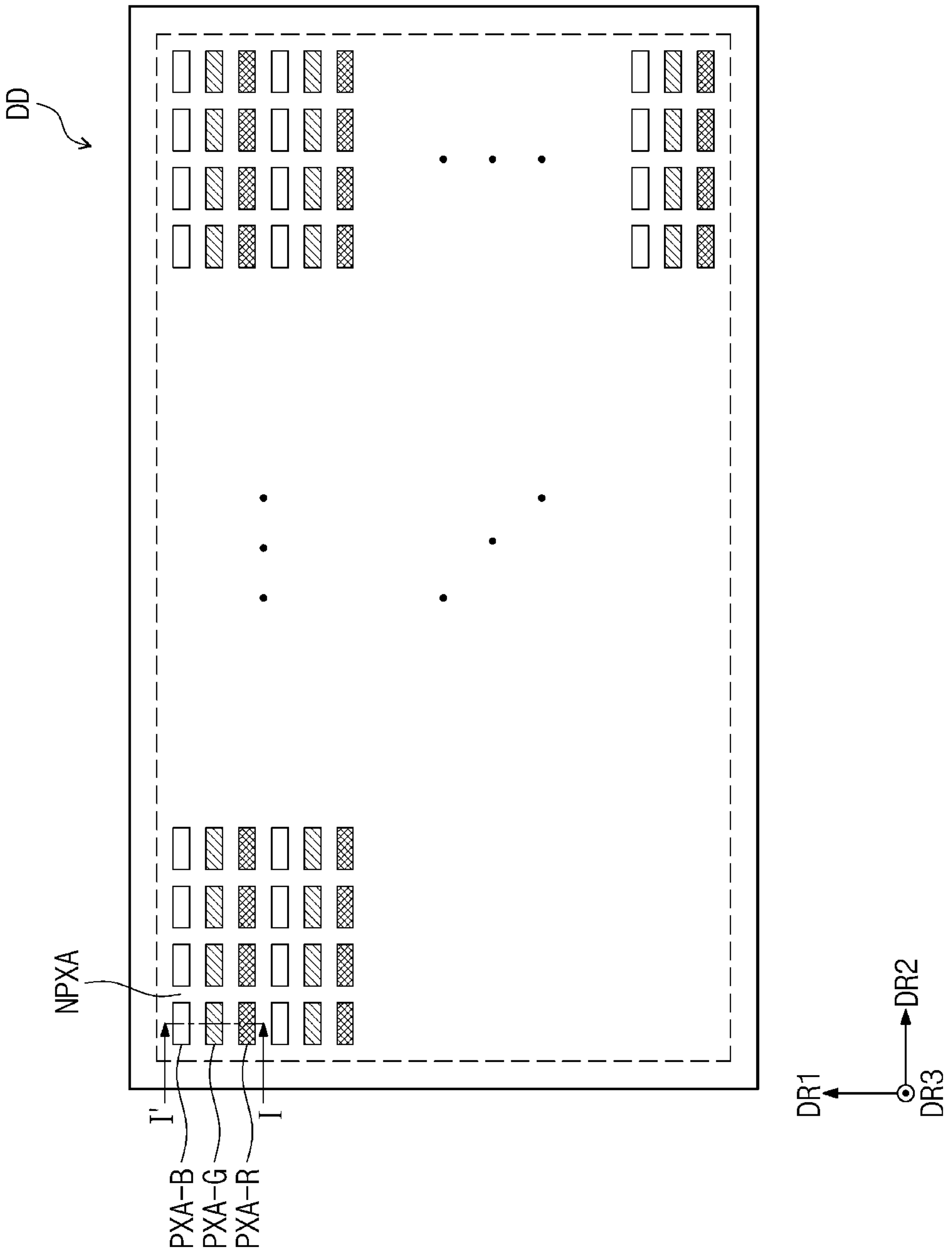
FIG. 1 is a plan view showing a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group, or may be interpreted as a phenyl group substituted with a phenyl group.

In the description, the term "combined with an adjacent group to form a ring" may mean a group that is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring that is formed by the combination of adjacent groups may itself be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, in 4,5-dimethylphenanthrene, two methyl groups may be interpreted as "adjacent groups" to each other.

In the description, examples of a halogen atom may include a fluorine atom, a chlorine atom, a bromine atom, or an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, a cycloalkyl group may be a cyclic type alkyl group having one or more rings in its structure. The number of carbon atoms in the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., without limitation.

In the description, an alkenyl group may be a hydrocarbon group including one or more carbon-carbon double bonds in the middle or at a terminus of an alkyl group having 2 or more carbon atoms. The alkenyl group may be a linear chain or a branched chain. The number of carbon atoms in the alkenyl group is not specifically limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, an alkynyl group may be a hydrocarbon group including one or more carbon-carbon triple bonds in the middle or at a terminus of an alkyl group having 2 or more carbon atoms. The alkynyl group may be a linear chain or a branched chain. The number of carbon atoms in the alkynyl group is not specifically limited, but may be 2 to 30, 2 to 20, or 2 to 10. Examples of the alkynyl group may include an ethynyl group, a propynyl group, etc., without limitation.

In the description, a hydrocarbon ring group may be any functional group or substituent derived from an aliphatic hydrocarbon ring. The hydrocarbon ring group may be a saturated hydrocarbon ring group of 5 to 20 ring-forming carbon atoms.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, a fluorenyl group may be substituted, and two substituents may be combined with each other to form a spiro structure. Examples of substituted fluorenyl groups are as follows but embodiments are not limited thereto.

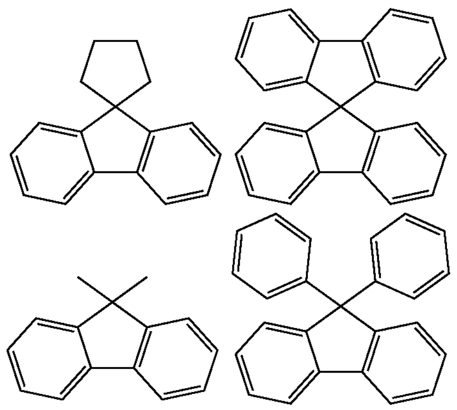

In the description, a heterocyclic group may be any functional group or substituent derived from a ring including one or more of B, O, N, P, Si, or S as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may each independently be monocyclic or polycyclic.

In the description, if the heterocyclic group includes two or more heteroatoms, the two or more heteroatoms may be the same as or different from each other. The heterocyclic group may be a monocyclic heterocyclic group or a polycyclic heterocyclic group, and the heterocyclic group may be a heteroaryl group. The number of ring-forming carbon atoms in the heterocyclic group may be 2 to 30, 2 to 20, and 2 to 10.

In the description, an aliphatic heterocyclic group may include one or more of B, O, N, P, Si, or S as heteroatoms. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, a heteroaryl group may include one or more of B, O, N, P, Si, or S as heteroatoms. If the heteroaryl group includes two or more heteroatoms, the two or more heteroatoms may be the same as or different from each other. The heteroaryl group may be a monocyclic heterocyclic group or a polycyclic heterocyclic group. The number of ring-forming carbon atoms in the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the same explanation on the above-described aryl group may be applied to an arylene group, except that the arylene group is a divalent group. The same explanation on the above-described heteroaryl group may be applied to a heteroarylene group, except that the heteroarylene group is a divalent group.

In the description, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the number of carbon atoms in an amino group is not specifically limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., without limitation.

In the description, the number of carbon atoms in a carbonyl group is not specifically limited, but may be 1 to 40, 1 to 30, or 1 to 20. For example, a carbonyl group may have one of the structures as shown below, but is not limited thereto.

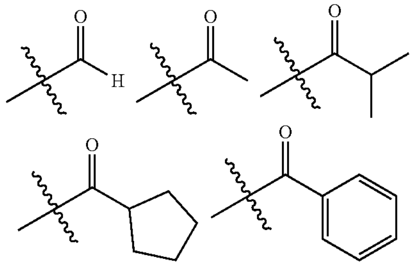

In the description, the number of carbon atoms in a sulfinyl group or a sulfonyl group is not specifically limited, but may be 1 to 30. The sulfinyl group may be an alkyl sulfinyl group or an aryl sulfinyl group. The sulfonyl group may be an alkyl sulfonyl group or an aryl sulfonyl group.

In the description, a thio group may be an alkyl thio group or an aryl thio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, an oxy group may be an oxygen atom that is bonded to an alkyl group or an aryl group as defined above. The oxy group may be an alkoxy group or an aryl oxy group. The alkoxy group may be a linear, a branched, or a cyclic chain. The number of carbon atoms in the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments are not limited thereto.

In the description, a boron group may be a boron atom that is bonded to an alkyl group or an aryl group as defined above. The boron group may be an alkyl boron group or an aryl boron group. Examples of the boron group may include a trimethylboron group, a triethylboron group, a t-butylmethylboron group, a triphenylboron group, a diphenylboron group, a phenylboron group, etc., without limitation.

In the description, the number of carbon atoms in an amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, alkyl groups in an alkylthio group, an alkylsulfoxy group, an alkylaryl group, an alkylamino group, an alkylboron group, an alkyl silyl group, or an alkyl amine group may be the same as the examples of the above-described alkyl group.

In the description, aryl groups in an aryloxy group, an arylthio group, an arylsulfoxy group, an aryl amino group, an arylboron group, or an aryl silyl group may be the same as the examples of the above-described aryl group.

In the description, a direct linkage may be a single bond.

In the description,

and -* each represents a bonding position to a neighboring atom.

Hereinafter, embodiments will be explained with reference to the drawings.

Figure 2:
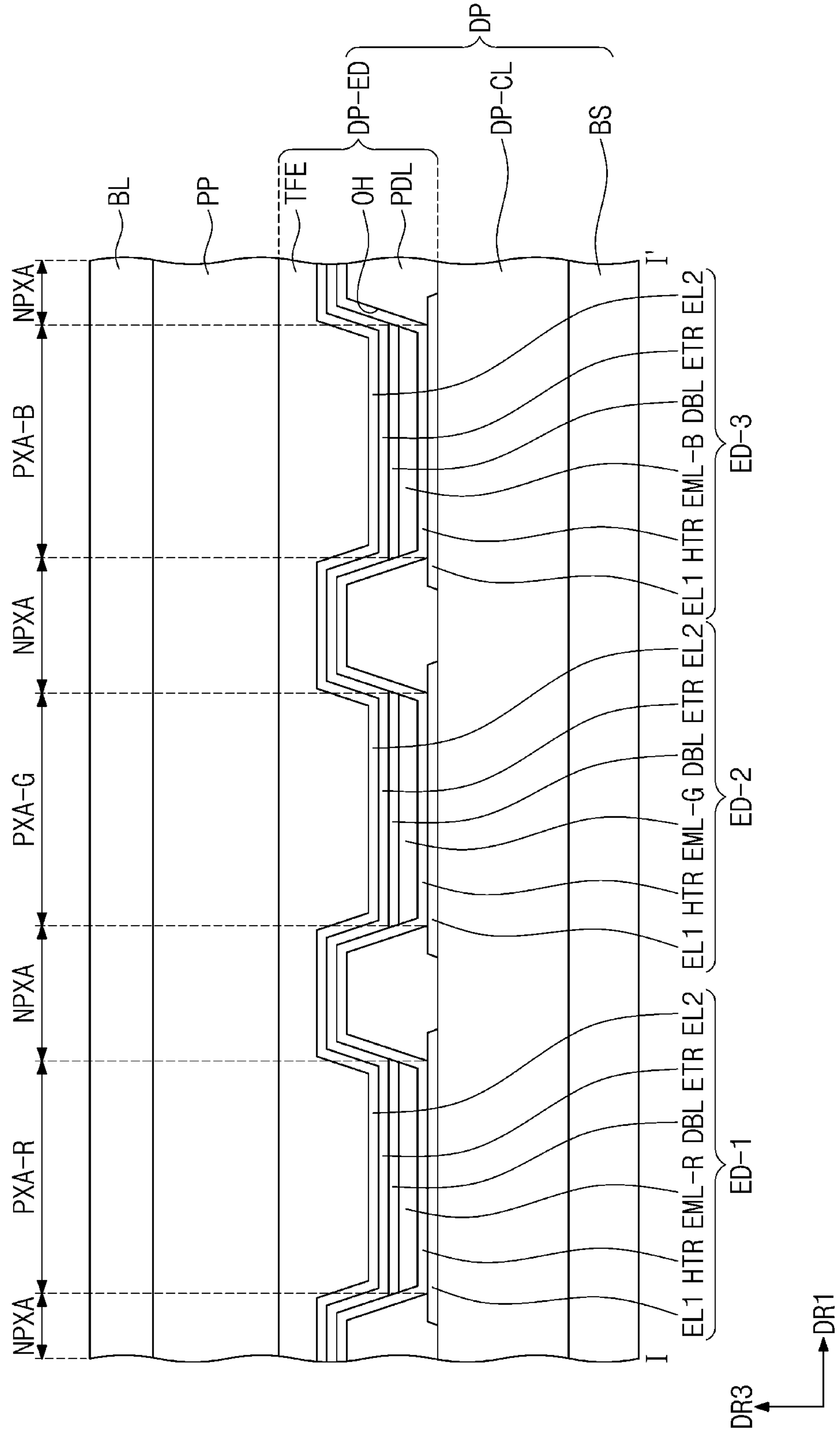
FIG. 2 is a schematic cross-sectional view showing a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I' of FIG. 1.

The display apparatus DD may include a display panel DP and an optical layer PP disposed on the display panel DP. The display panel DP includes light emitting elements ED-1, ED-2, and ED-3. The display apparatus DD may include multiples of each of the light emitting elements ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a plugging layer (not shown). The plugging layer (not shown) may be disposed between a display device layer DP-ED and a base substrate BL. The plugging layer (not shown) may be an organic layer. The plugging layer (not shown) may include at least one of an acrylic resin, a silicon-based resin, or an epoxy-based resin.

The display panel DP may include a base layer BS, a circuit layer DP-CL provided on the base layer BS, and a display device layer DP-ED. The display device layer DP-ED may include a pixel definition layer PDL, light emitting elements ED-1, ED-2, and ED-3 disposed in the pixel definition layer PDL, and an encapsulating layer TFE disposed on the light emitting elements ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the light emitting elements ED-1, ED-2, and ED-3 of the display device layer DP-ED.

Each of the light emitting elements ED-1, ED-2, and ED-3 may have a structure of a light emitting element ED of embodiments according to FIG. 3 to FIG. 6, which will be explained later. Each of the light emitting elements ED-1, ED-2, and ED-3 may include a first electrode EL1, a hole transport region HTR, emission layers EMLL-R, EML-G, and EMLL-B, a double buffer layer DBL, an electron transport region ETR, and a second electrode EL2.

FIG. 2 shows an embodiment where the emission layers EMLL-R, EML-G, and EMLL-B and the double buffer layer DBL of light emitting elements ED-1, ED-2, and ED-3 are disposed in openings OH defined in a pixel definition layer PDL, and a hole transport region HTR, an electron transport region ETR, and a second electrode EL2 are each provided as common layers for all of the light emitting elements ED-1, ED-2, and ED-3. However, embodiments are not limited thereto. Although not shown in FIG. 2, in an embodiment, the hole transport region HTR and the electron transport region ETR may each be patterned and provided in the openings OH defined in the pixel definition layer PDL. For example, in an embodiment, the hole transport region HTR, the emission layers EML-R, EML-G, and EML-B, and the electron transport region ETR of the light emitting elements ED-1, ED-2 and ED-3 may each be patterned by an ink jet printing method and provided.

Although not shown in FIG. 2, in an embodiment, the double buffer layer DBL may be provided as a common layer for all of the light emitting elements ED-1, ED-2, and ED-3.

An encapsulating layer TFE may cover the light emitting elements ED-1, ED-2, and ED-3. The encapsulating layer TFE may encapsulate the display device layer DP-ED. The encapsulating layer TFE may be a thin film encapsulating layer. The encapsulating layer TFE may be a single layer or a stack of multiple layers. The encapsulating layer TFE may include at least one insulating layer. The encapsulating layer TFE according to an embodiment may include at least one inorganic layer (hereinafter, an encapsulating inorganic layer). The encapsulating layer TFE according to an embodiment may include at least one organic layer (hereinafter, an encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be disposed on the second electrode EL2 and may be disposed to fill the openings OH.

Referring to FIG. 1 and FIG. 2, the display apparatus DD may include non-luminous areas NPXA and luminous areas PXA-R, PXA-G, and PXA-B. The luminous areas PXA-R, PXA-G, and PXA-B may each be an area emitting light produced from the light emitting elements ED-1, ED-2, and ED-3, respectively. The luminous areas PXA-R, PXA-G, and PXA-B may be spaced apart from each other in a plan view.

The luminous areas PXA-R, PXA-G, and PXA-B may be areas separated by the pixel definition layer PDL. The non-luminous areas NPXA may be areas between neighboring luminous areas PXA-R, PXA-G, and PXA-B and may be areas corresponding to the pixel definition layer PDL. For example, in an embodiment, each of the luminous areas PXA-R, PXA-G, and PXA-B may correspond to a pixel. The pixel definition layer PDL may separate the light emitting elements ED-1, ED-2, and ED-3. The emission layers EML-R, EML-G, and EML-B of the light emitting elements ED-1, ED-2, and ED-3 may be disposed in the openings OH defined in the pixel definition layer PDL and separated from each other.

The luminous areas PXA-R, PXA-G, and PXA-B may be divided into groups according to the color of light produced from the light emitting elements ED-1, ED-2, and ED-3. In the display apparatus DD of an embodiment shown in FIG. 1 and FIG. 2, three luminous areas PXA-R, PXA-G, and PXA-B emitting red light, green light, and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, light emitting elements ED-1, ED-2, and ED-3 may emit light having different wavelength regions. For example, in an embodiment, the display apparatus DD may include a first light emitting element ED-1 emitting red light, a second light emitting element ED-2 emitting green light, and a third light emitting element ED-3 emitting blue light. For example, the red luminous area PXA-R, the green luminous area PXA-G, and the blue luminous area PXA-B of the display apparatus DD may respectively correspond to the first light emitting element ED-1, the second light emitting element ED-2, and the third light emitting element ED-3.

However, embodiments are not limited thereto, and the first to third light emitting elements ED-1, ED-2, and ED-3 may emit light in a same wavelength region, or at least one thereof may emit light in a different wavelength region. For example, the first to third light emitting elements ED-1, ED-2, and ED-3 may all emit blue light.

The luminous areas PXA-R, PXA-G, and PXA-B in the display apparatus DD according to an embodiment may be arranged in a stripe configuration. Referring to FIG. 1, red luminous areas PXA-R, green luminous areas PXA-G, and blue luminous areas PXA-B may be arranged along a second directional axis DR2. In another embodiment, the red luminous area PXA-R, the green luminous area PXA-G, and the blue luminous area PXA-B may be arranged by turns along a first directional axis DR1.

In FIG. 1 and FIG. 2, the areas of the luminous areas PXA-R, PXA-G, and PXA-B are shown as similar in size, but embodiments are not limited thereto. The areas of the luminous areas PXA-R, PXA-G, and PXA-B may be different from each other according to a wavelength region of light emitted. The areas of the luminous areas PXA-R, PXA-G, and PXA-B may be areas in a plan view that are defined by the first directional axis DR1 and the second directional axis DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the display quality characteristics which are required for the display apparatus DD. For example, the arrangement type of the luminous areas PXA-R, PXA-G, and PXA-B may be a PENTILE™ configuration or a diamond configuration.

In an embodiment, the areas of the luminous areas PXA-R, PXA-G, and PXA-B may be different from each other. For example, in an embodiment, an area of the green luminous area PXA-G may be smaller in size than an area of the blue luminous area PXA-B, but embodiments are not limited thereto.

Figure 3:
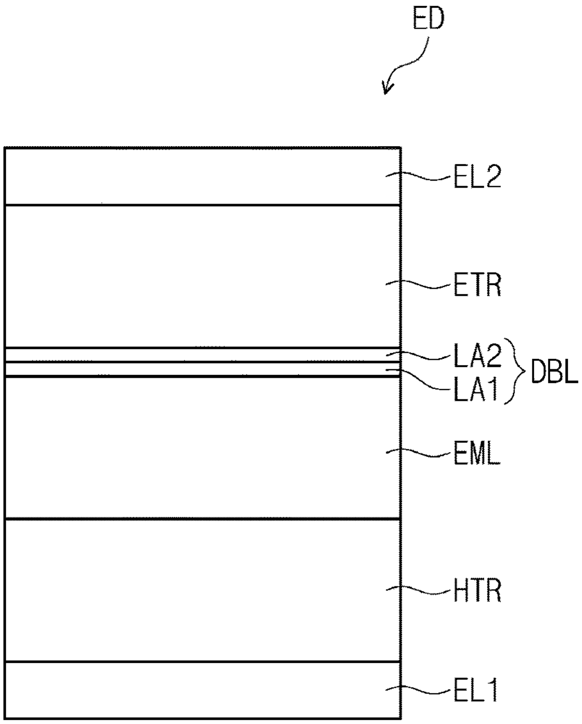
FIG. 3 is a schematic cross-sectional view showing a light emitting element according to an embodiment.
Figure 4:
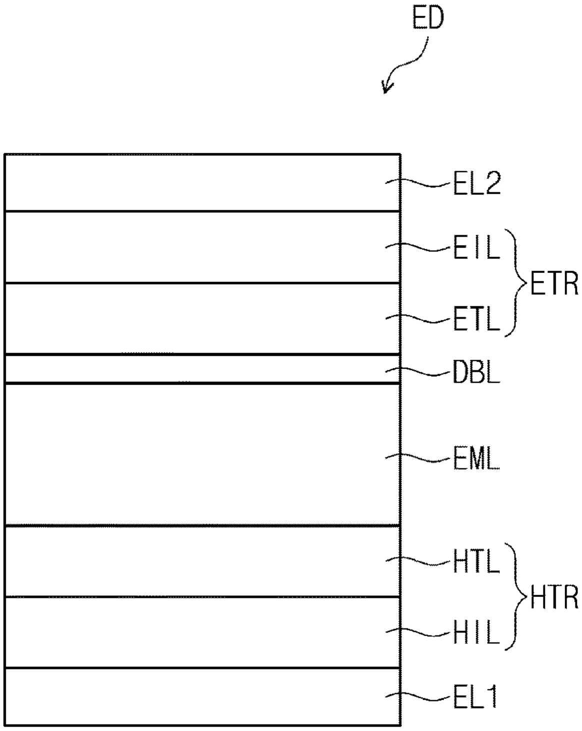
FIG. 4 is a schematic cross-sectional view showing a light emitting element according to an embodiment.
Figure 5:
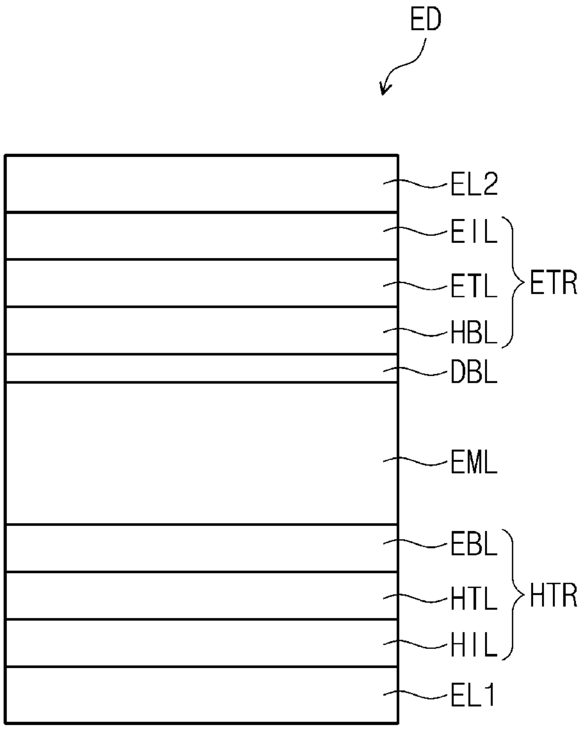
FIG. 5 is a schematic cross-sectional view showing a light emitting element according to an embodiment.
Figure 6:
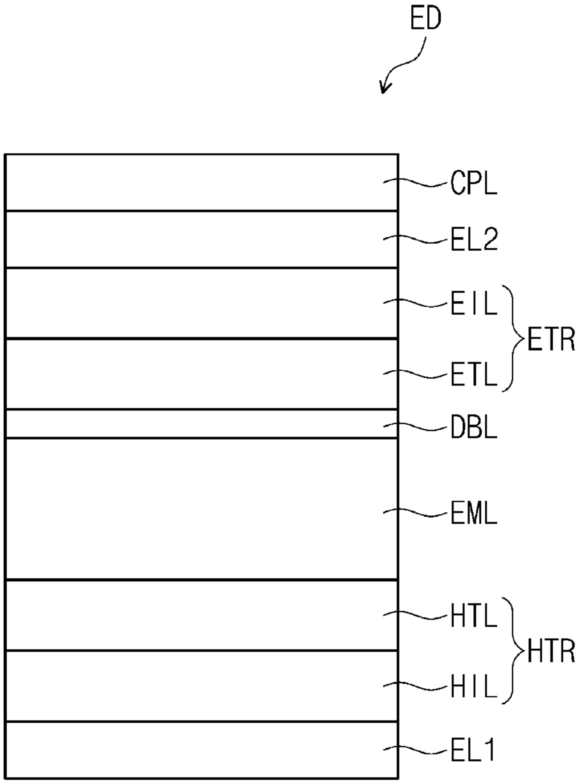
FIG. 6 is a schematic cross-sectional view showing a light emitting element according to an embodiment.

Hereinafter, FIG. 3 to FIG. 6 are each a schematic cross-sectional view showing a light emitting element according to embodiments. The light emitting element ED according to an embodiment may include a first electrode EL1, a hole transport region HTR, an emission layer EML, a double buffer layer DBL, an electron transport region ETR, and a second electrode EL2, stacked in that order. The double buffer layer DBL is disposed between the emission layer EML and the electron transport region ETR. The double buffer layer DBL includes a first layer LA1 disposed on the emission layer EML and a second layer LA2 disposed on the first layer LA1. In FIG. 4 to FIG. 6, a first layer LA1 and a second layer LA2 are omitted, and only a double buffer layer DBL is shown in brief.

In comparison to FIG. 3, FIG. 4 shows a schematic cross-sectional view of a light emitting element ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting element ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting element ED of an embodiment that includes a capping layer CPL disposed on the second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, compounds thereof, or mixtures thereof (for example, a mixture of Ag and Mg). In another embodiment, the first electrode EL1 may have a structure including multiple layers including a reflective layer or a transflective layer formed of the above materials, and a transmissive conductive layer formed of ITO, IZO, ZnO, or ITZO. For example, the first electrode EL1 may have a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission auxiliary layer (not shown), or an electron blocking layer EBL. A thickness of the hole transport region HTR may be, for example, in a range of about 50 Å to about 15,000 Å.

The hole transport region HTR may be a layer formed of a single material, a layer formed of different materials, or a multilayer structure including layers formed of different materials.

For example, the hole transport region HTR may have the structure of a single layer of a hole injection layer HIL or a hole transport layer HTL, or may have a structure of a single layer formed of a hole injection material and a hole transport material. In other embodiments, the hole transport region HTR may have a structure of a single layer formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1.

[Formula H-1]

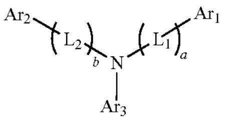

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently be an integer from 0 to 10. If a or b is 2 or more, multiple $L_1$ groups and multiple $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In still another embodiment, the compound represented by Formula H-1 may be a carbazole-based compound in which at least one of $Ar_1$ and $Ar_2$ includes a substituted or unsubstituted carbazole group, or the compound represented by Formula H-1 may be a fluorene-based compound in which at least one of $Ar_1$ and $Ar_2$ includes a substituted or unsubstituted fluorene group.

The compound represented by Formula H-1 may be any one selected from Compound Group H. However, the compounds shown in Compound Group H are only examples, and the compound represented by Formula H-1 is not limited to Compound Group H.

[Compound Group H]

H-1-1

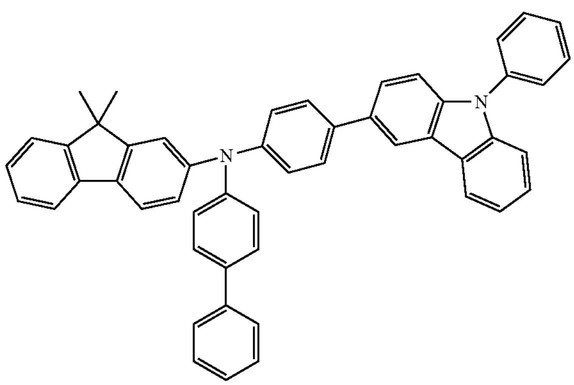

-continued

H-1-2

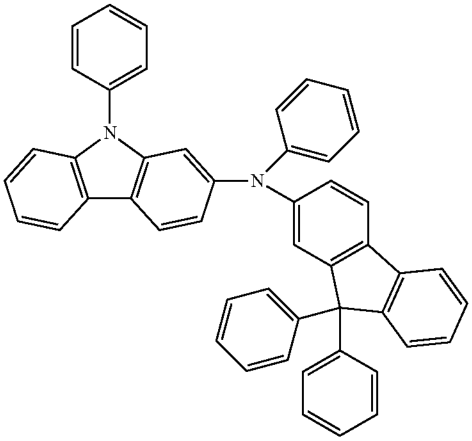

H-1-3

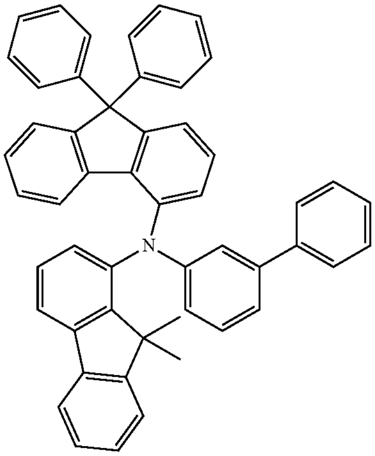

H-1-4

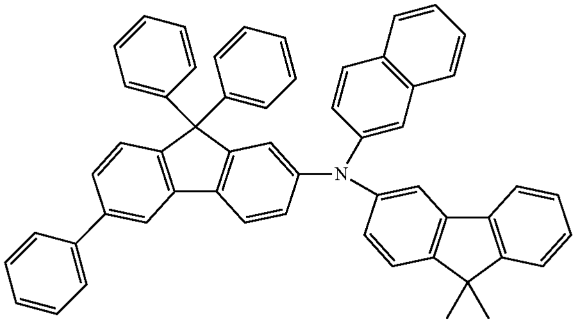

H-1-5

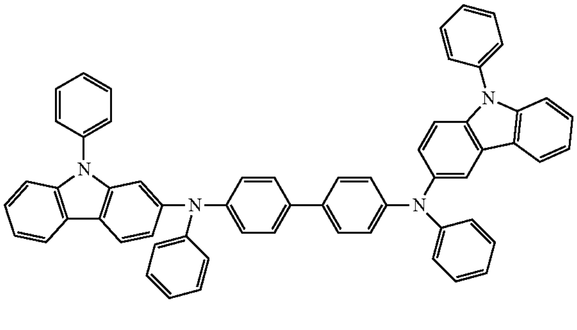

-continued
H-1-6
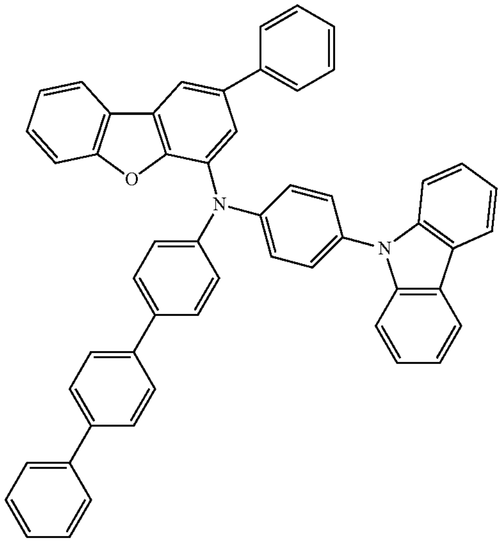
H-1-7
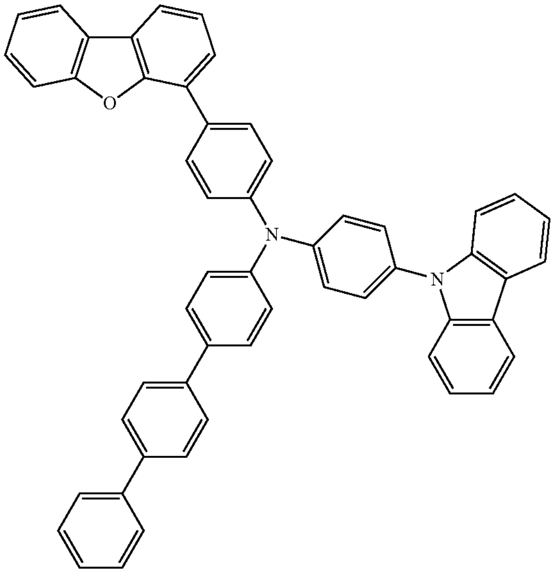
H-1-8
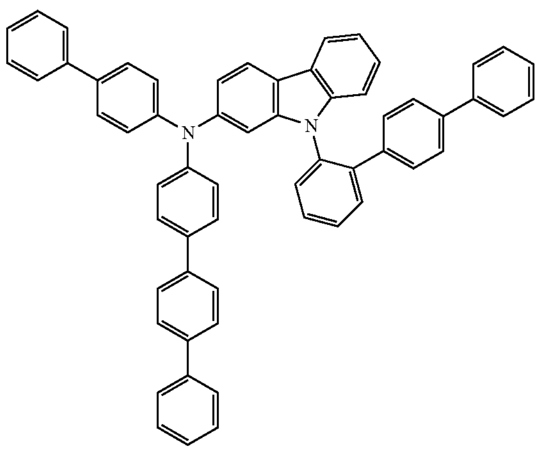
-continued
H-1-9
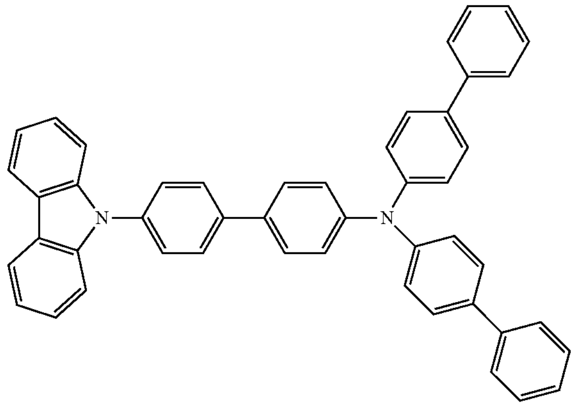
H-1-10
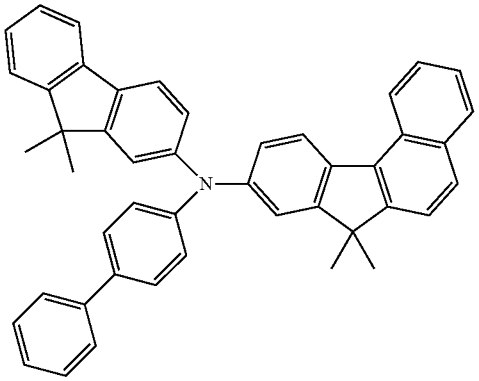
H-1-11
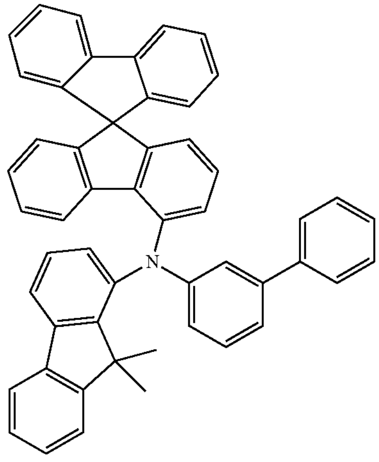

-continued
H-1-12
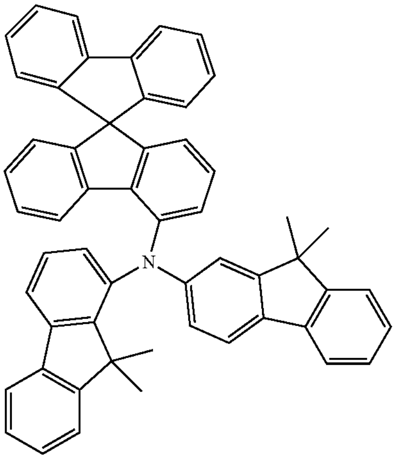
H-1-13
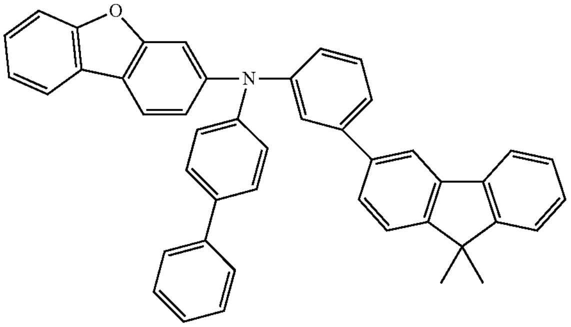
H-1-14
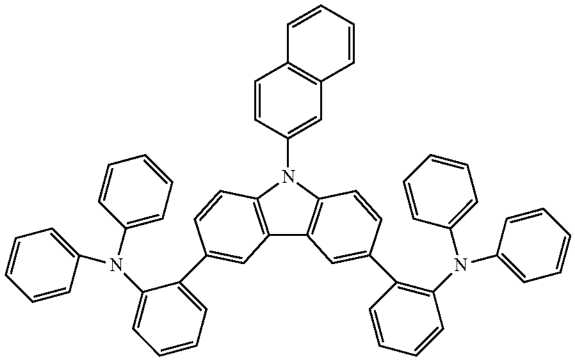
-continued
H-1-15
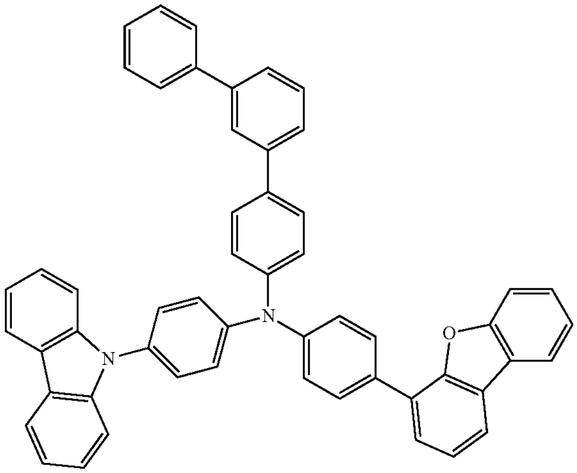
H-1-16
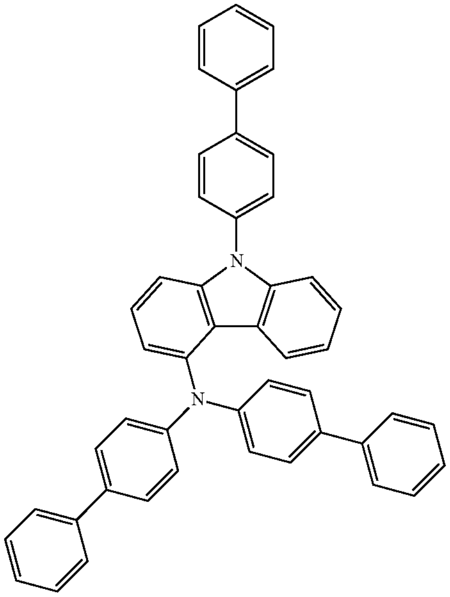
H-1-17
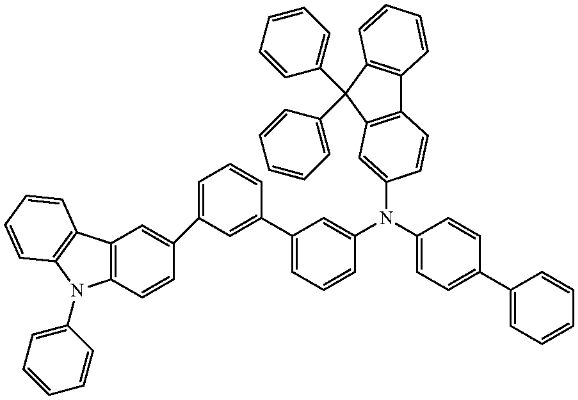

-continued

H-1-18

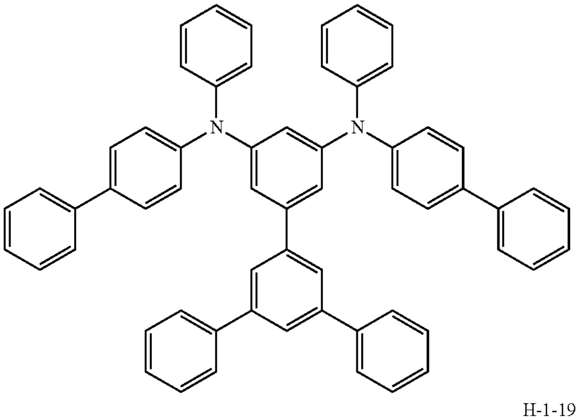

H-1-19

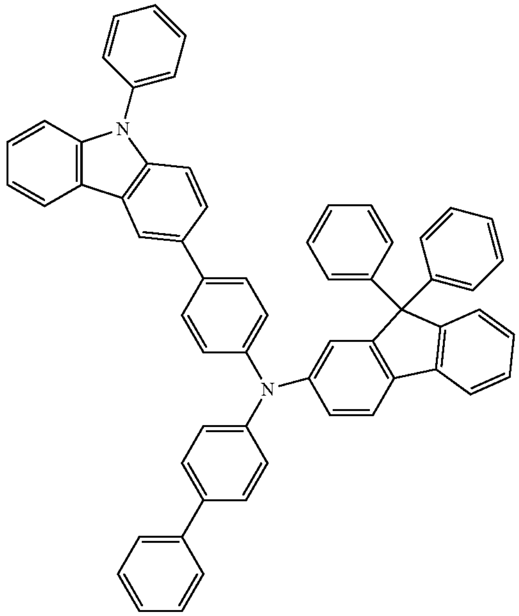

The hole transport region HTR may include a phthalocyanine compound such as copper phthalocyanine, $N^1,N^{1'}$-([1,1'-biphenyl]-4,4'-diyl)bis($N^1$-phenyl-N4,$N^4$-di-m-tolyl-benzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB or NPD), triphenylamine-containing polyetherketone (TPAPEK), 4-isopropyl-4'-methyldiphenyliodonium [tetrakis(pentafluorophenyl)borate], and dipyrazino[2,3-f:2',3'-h] quinoxaline-2,3,6,7,10,11-hexacarbonitrile (HAT-CN), or the like.

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine](TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. In case that the hole transport region HTR includes a hole injection layer HIL, a thickness of the hole injection region HIL may be, for example, in a range of about 30 Å to about 1,000 Å. In case that the hole transport region HTR includes a hole transport layer HTL, a thickness of the hole transport layer HTL may be in a range of about 30 Å to about 1,000 Å. In case that the hole transport region HTR includes an electron blocking layer, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without a substantial increase of driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of metal halide compounds, quinone derivatives, metal oxides, or cyano group-containing compounds, without limitation. For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., without limitation.

As described above, the hole transport region HTR may further include at least one of a buffer layer (not shown) and an electron blocking layer EBL, in addition to the hole injection layer HIL and the hole transport layer HTL. The buffer layer (not shown) may compensate for a resonance distance according to a wavelength of light emitted from an emission layer EML and may increase emission efficiency. Materials which may be included in the hole transport region HTR may be used as materials included in the buffer layer (not shown). The electron blocking layer EBL may block the injection of electrons from the electron transport region ETR to the hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

In the light emitting elements ED according to embodiments shown in FIG. 3 to FIG. 6, an emission layer EML may include a host and a dopant.

A double buffer layer DBL is provided between an emission layer EML and an electron transport region ETR. For example, the double buffer layer DBL is provided between the emission layer EML and an electron transport layer ETL (see FIG. 4).

The double buffer layer DBL may have a thickness in a range of about 20 Å to about 500 Å. For example, the double buffer layer DBL may have a thickness in a range of about 40 Å to about 400 Å. For example, the double buffer layer DBL may have a thickness in a range of about 50 Å to about 300 Å.

The double buffer layer DBL may have a multilayer structure including a first layer LA1 and a second layer LA2. In an embodiment, the double buffer layer DBL includes a first layer LA1 disposed on the emission layer EML and a second layer LA2 disposed on the first layer LA1. On the second layer LA2, the electron transport layer ETL (see FIG. 4) of the electron transport region ETR may be disposed.

In the light emitting element ED according to embodiments shown in FIG. 3 to FIG. 6, the double buffer layer DBL may include two different types of hosts.

Hereinafter, a host and a dopant included in the double buffer layer DBL and the emission layer EML will be explained.

The double buffer layer DBL of an embodiment includes a first compound and a second compound, which are different from each other. In an embodiment, the first layer LA1 includes the first compound, and the second layer LA2 includes the second compound.

The first compound and the second compound may each be hosts. Each of the first compound and the second compound may be an electron transport host.

Each of the first compound and the second compound includes a pyrimidine group or a carbazole group. For example, the first compound and the second compound may each independently include a pyrimidine skeleton or a carbazole skeleton The emission layer EML of an embodiment includes a third compound, a fourth compound, and a fifth compound. For example, the emission layer EML may include the third compound, the fourth compound, the fifth compound, and a sixth compound. However, the configuration of the emission layer EML is not limited thereto.

The third compound and the fourth compound may each be hosts, and the fifth compound and the sixth compound may each be dopants.

The third compound may include a pyrimidine group or a carbazole group. The third compound may be an electron transport host.

In an embodiment, the third compound may be different from at least one of the first compound and the second compound. For example, the third compound may be different from one of the first compound and the second compound and may be the same as the other of the first compound and the second compound. In an embodiment, the third compound may be the same as the first compound and different from the second compound. In another embodiment, the third compound may be different from the first compound and the same as the second compound.

For example, the third compound may be different from the first compound and from the second compound.

The fourth compound may have a structure different from the third compound. The fourth compound may be a hole transport host.

The fifth compound may be a phosphorescence dopant. The fifth compound may be an auxiliary dopant. In the light emitting element ED of an embodiment, an auxiliary dopant included in the emission layer EML transfers energy to a light emitting dopant to increase the ratio of light emitted by the light emitting dopant as fluorescent light.

The sixth compound may be a light emitting dopant. In an embodiment, the sixth compound may be a thermally activated delayed fluorescence (TADF) dopant. For example, the sixth compound may be used as a light emitting dopant emitting blue light. The sixth compound of an embodiment may be a light emitting material having a central light emission wavelength ($\lambda_{max}$) in a wavelength region equal to or less than about 490 nm. For example, the sixth compound may be a light emitting material having a central light emission wavelength in a wavelength region of about 450 nm to about 470 nm. For example, the sixth compound of an embodiment may be a blue thermally activated delayed fluorescence (TADF) dopant. However, embodiments are not limited thereto.

In an embodiment, the first compound, the second compound, and the third compound may each independently be represented by Formula 1 or Formula 2. Each of the first compound, the second compound, and the third compound may be an electron transport host.

[Formula 1]

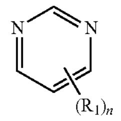

In Formula 1, $R_1$ may be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_1$ may be a hydrogen atom, a substituted or unsubstituted phenyl group, a substituted or unsubstituted pyridine group, a substituted or unsubstituted carbazole group, or a substituted or unsubstituted 9H-pyrido [2,3-b]indole group.

In Formula 1, n may be an integer from 0 to 4. A case where n is 0 may be the same as a case where n is 1 and $R_1$ is a hydrogen atom. In an embodiment, if n is 2 or more, multiple $R_1$ groups may be the same as each other, or at least one thereof may be different.

In an embodiment, at least one of the first compound, the second compound, and the third compound may be represented by Formula 1, and the at least one of the first compound, the second compound, and the third compound that is represented by Formula 1 may be represented by Formula 1-1.

[Formula 1-1]

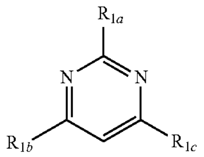

Formula 1-1 corresponds to a case of Formula 1 where n is 4, and the positions of four $R_1$ groups bonded to pyrimidine are embodied. Formula 1-1 is an embodiment where one among four $R_1$ groups is a hydrogen atom, and three $R_1$ groups are $R_{1a}$, $R_{1b}$, and $R_{1c}$.

In Formula 1-1, $R_{1a}$, $R_{1b}$, and $R_{1c}$ may each independently be a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{1a}$, $R_{1b}$, and $R_{1c}$ may each independently be a substituted or unsubstituted phenyl group, a substituted or unsubstituted pyridine group, a substituted or unsubstituted carbazole group, or a substituted or unsubstituted 9H-pyrido[2,3-b]indole group.

In an embodiment, $R_{1a}$, $R_{1b}$, and $R_{1c}$ may each independently include at least one substituent selected from Substituent Group S-1. However, embodiments are not limited thereto.

[Substituent Group S-1]

A1

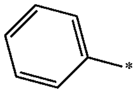

A2

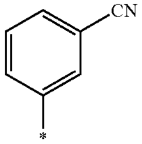

A3

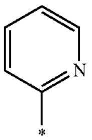

A4

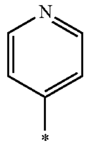

A5

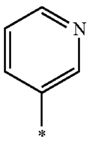

-continued

A6

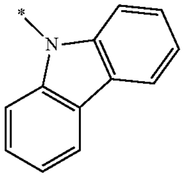

A7

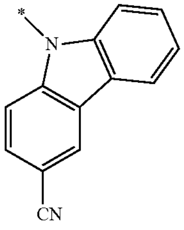

A8

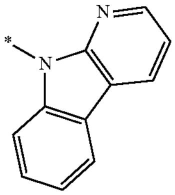

A9

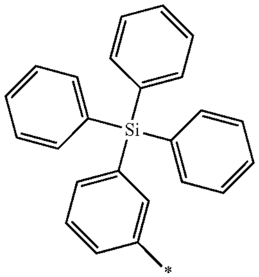

A10

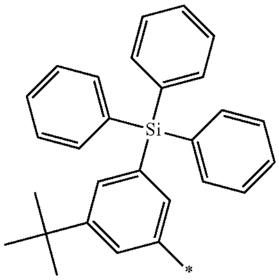

A11

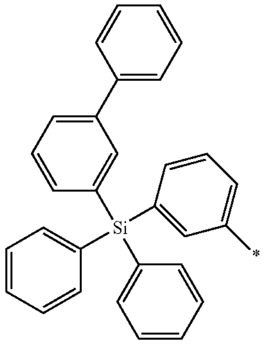

-continued

A12

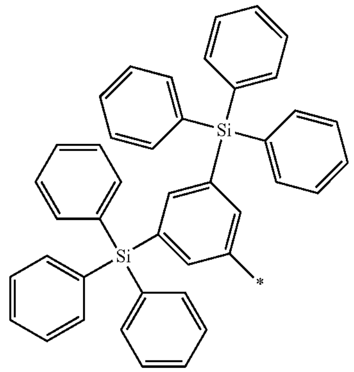

.

[Formula 2]

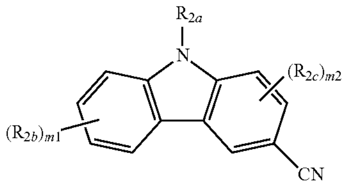

In Formula 2, $R_{2a}$, $R_{2b}$, and $R_{2c}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{2a}$ may be a substituted or unsubstituted phenyl group. For example, $R_{2b}$ and $R_{2c}$ may each independently be a hydrogen atom or a substituted or unsubstituted carbazole group.

In Formula 2, m1 may be an integer from 0 to 4. For example, m1 may be 0 or 1. A case where m1 is 0 may be the same as a case where m1 is 1 and $R_{2b}$ is a hydrogen atom. In an embodiment, if m1 is 2 or more, multiple $R_{2b}$ groups may be the same as each other, or at least one thereof may be different.

In Formula 2, m2 may be an integer from 0 to 3. For example, m2 may be 0 or 1. A case where m2 is 0 may be the same as a case where m2 is 1 and $R_{2c}$ is a hydrogen atom. In an embodiment, if m2 is 2 or more, multiple $R_{2c}$ groups may be the same as each other, or at least one thereof may be different.

In an embodiment, $R_{2a}$ may include at least one substituent selected from Substituent Group S-2.

[Substituent Group S-2]

B1

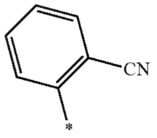

-continued

B2

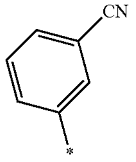

B3

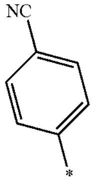

B4

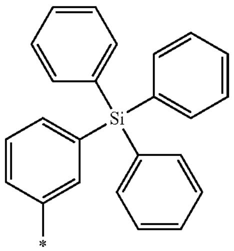

B5

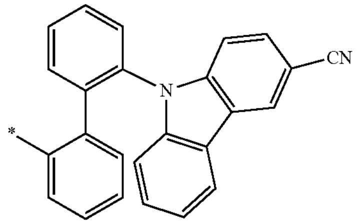

B6

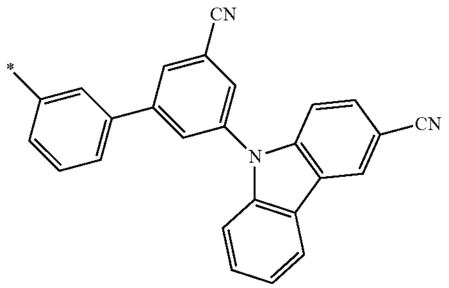

In an embodiment, $R_{2b}$ and $R_{2c}$ may each independently be a hydrogen atom or a substituted or unsubstituted carbazole group. For example, $R_{2b}$ and $R_{2c}$ may each independently be a hydrogen atom or

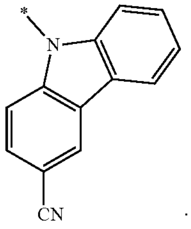 [SMILES: *n1c2ccccc2c2cc(C#N)ccc21]

.

In an embodiment, at least one of the first compound, the second compound, and the third compound may be represented by Formula 2, and the at least one of the first compound, the second compound, and the third compound that is represented by Formula 2 may be represented by any one of Formula 2-1, Formula 2-2, or Formula 2-3.

[Formula 2-1]

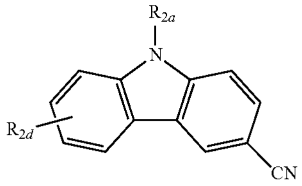

[Formula 2-2]

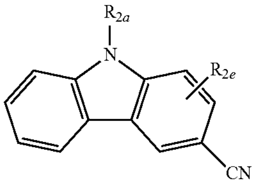

[Formula 2-3]

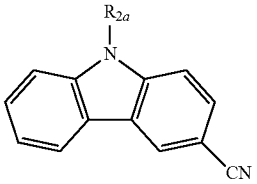

Formula 2-1 corresponds to an embodiment of Formula 2 where m1 is 1, $R_{2b}$ is $R_{2d}$, and m2 is 0.

Formula 2-2 corresponds to an embodiment of Formula 2 where m1 is 0, m2 is 1, and $R_{2c}$ is $R_{2e}$.

Formula 2-3 corresponds to an embodiment of Formula 2 where m1 and m2 are each 0.

In Formula 2-1 to Formula 2-3, $R_{2a}$ and $R_{2c}$ may each independently be a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{2a}$ and $R_{2c}$ may each independently be a substituted or unsubstituted carbazole group. For example, $R_{2d}$ and $R_{2e}$ may each independently be a group represented by C N

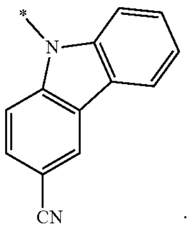 [SMILES: *n1c2ccccc2c2cc(C#N)ccc21]

.

In Formula 2-1 to Formula 2-3, $R_{2a}$ is the same as defined in Formula 2.

In an embodiment, the first compound, the second compound, and the third compound may each independently include at least one selected from Compound Group 1.

[Compound Group 1]

E1

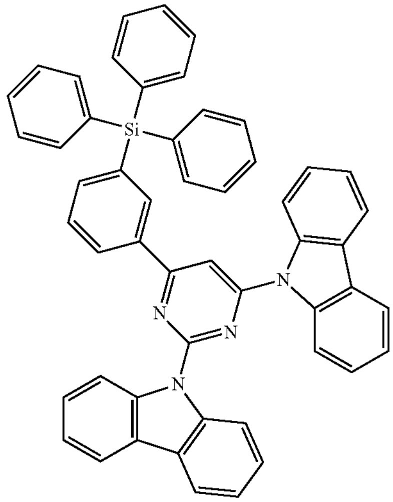

E2

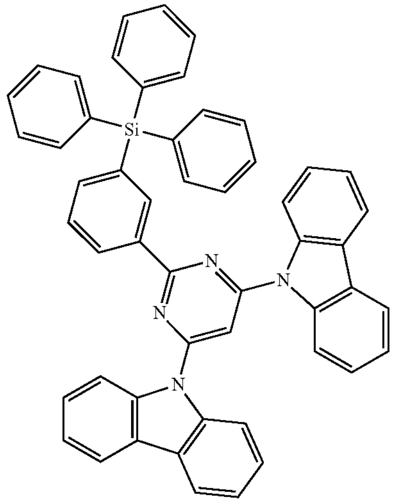

E3

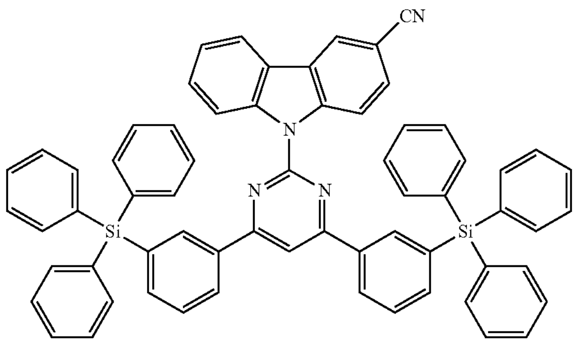

-continued
E4
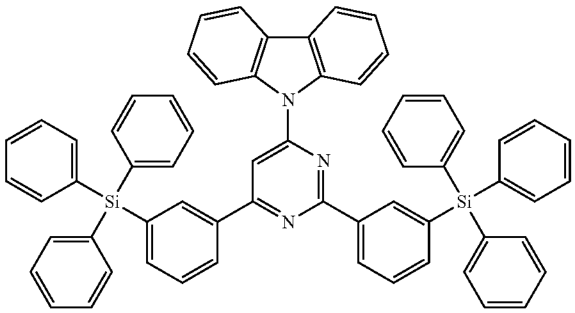
E5
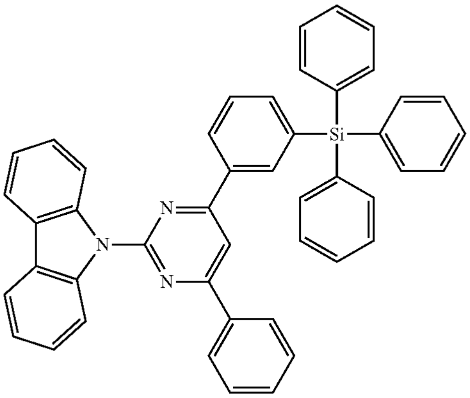
E6
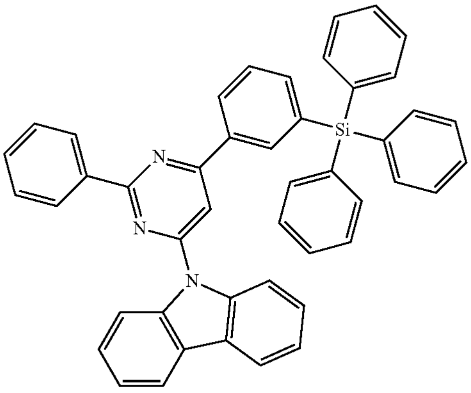
E7
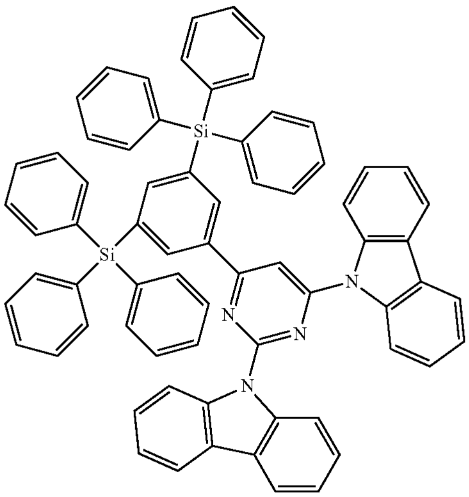
-continued
E8
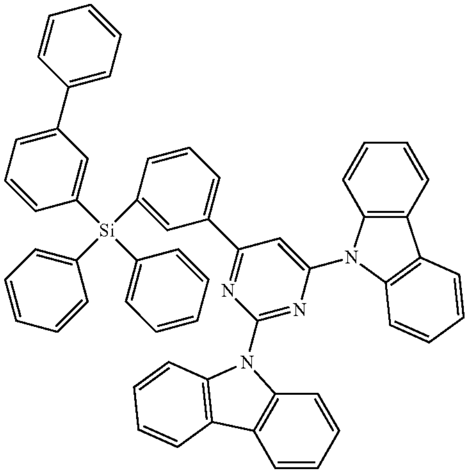
E9
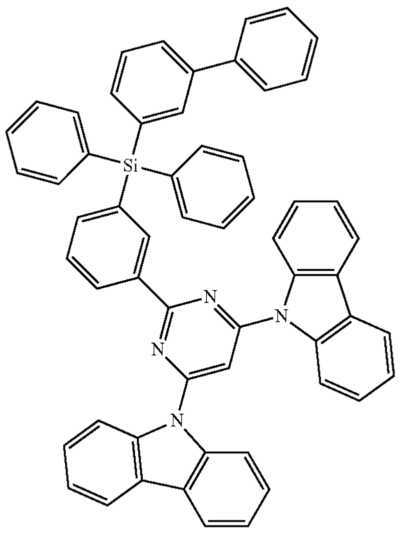
E10
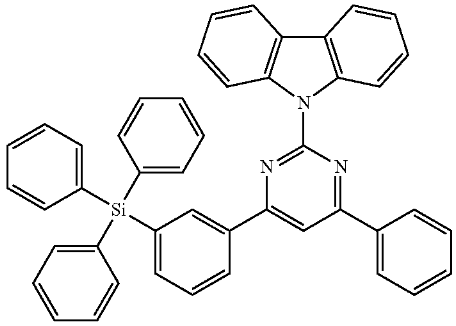

-continued
E11
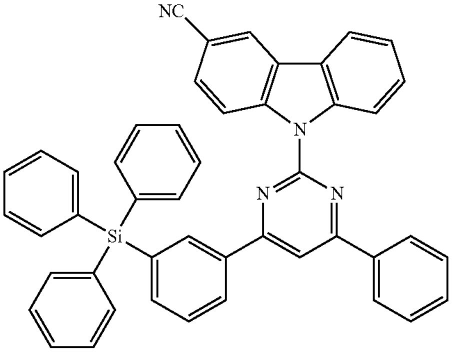
E12
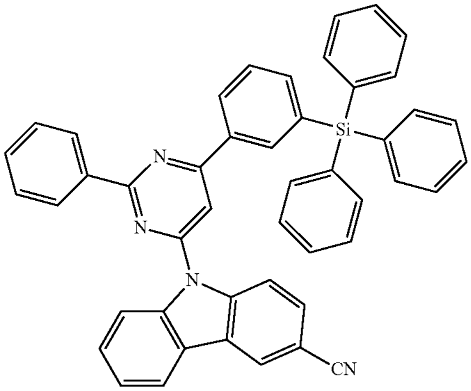
E13
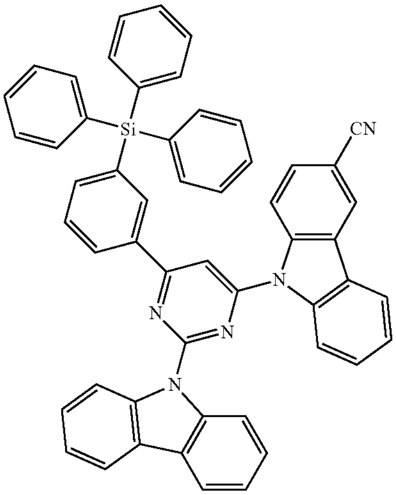
-continued
E14
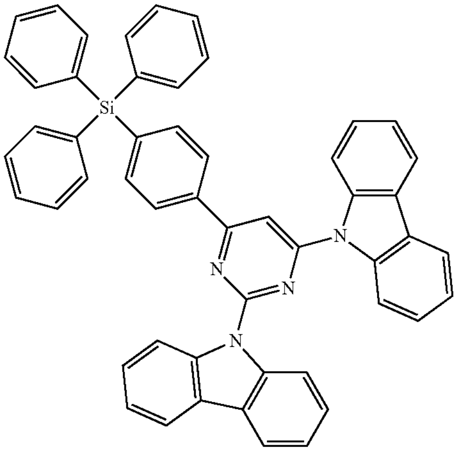
E15
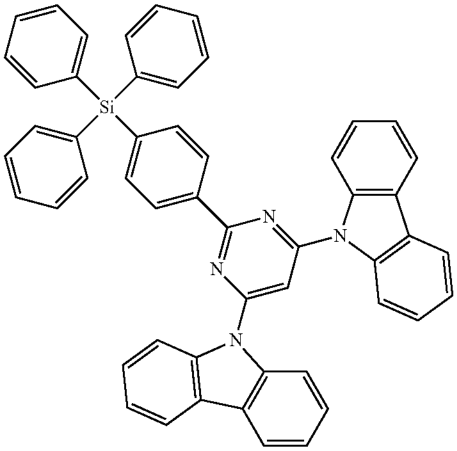
E16
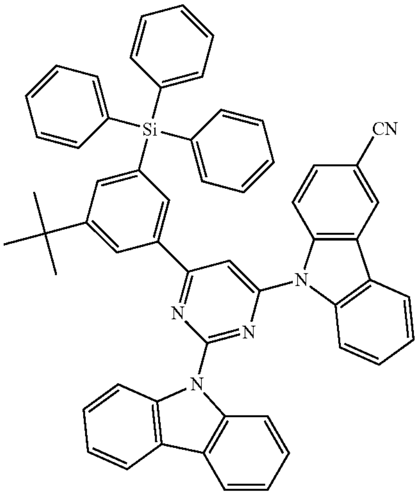

-continued
E17
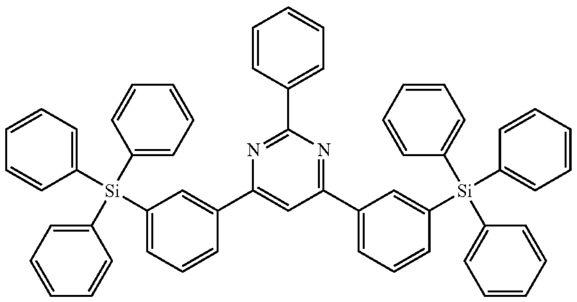
E18
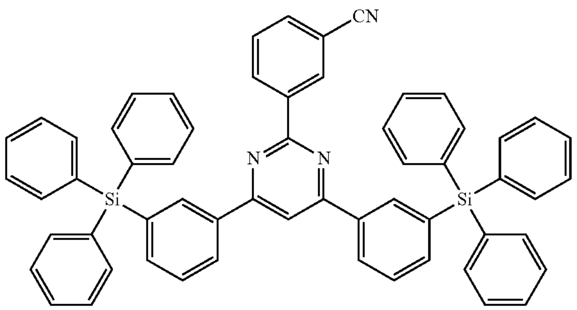
E19
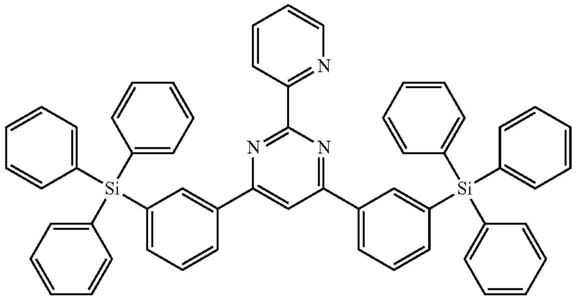
E20
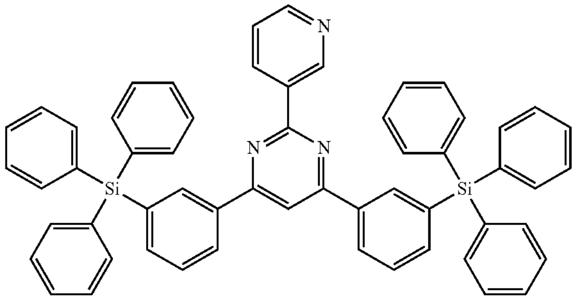
E21
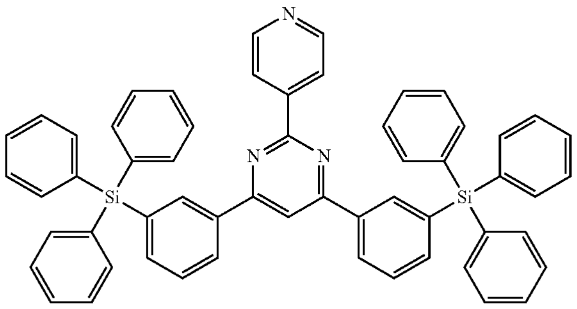
-continued
E22
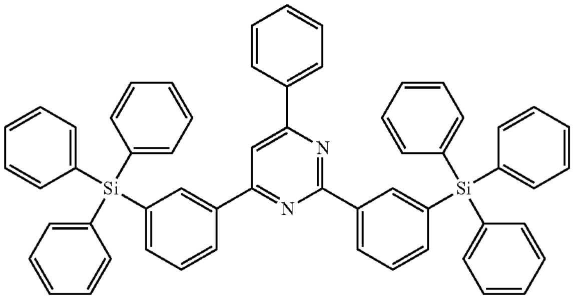
E23
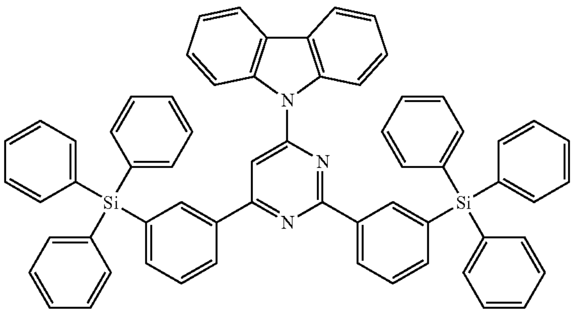
E24
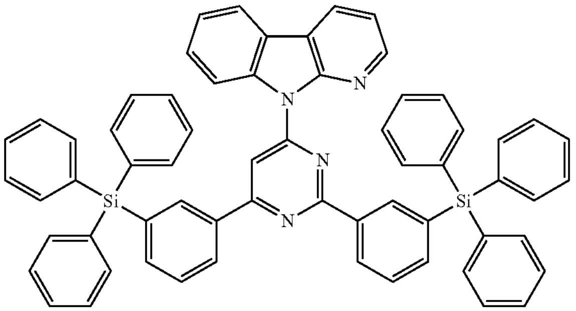
E25
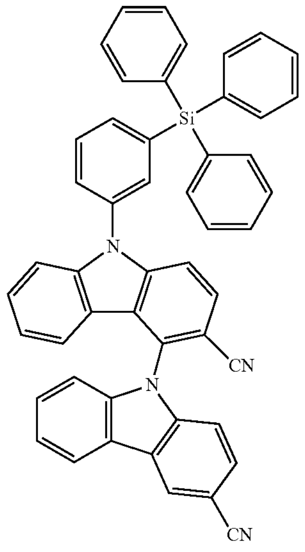

-continued

E26

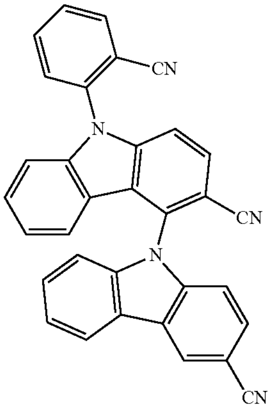

E27

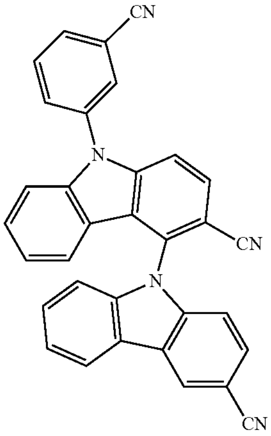

E28

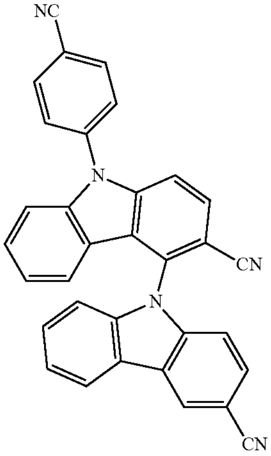

E29

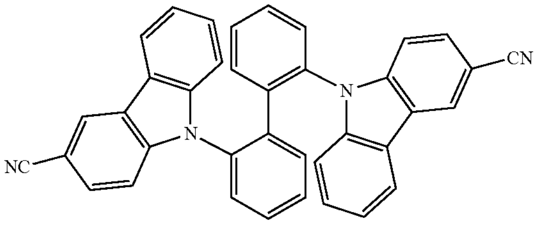

-continued

E30

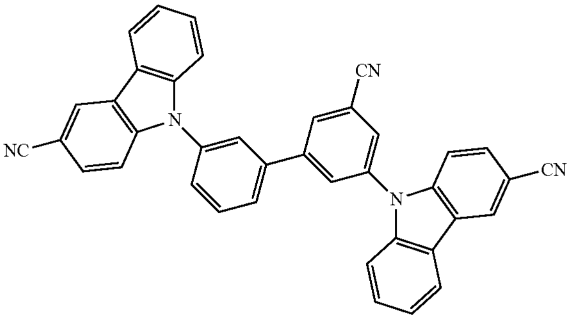

E31

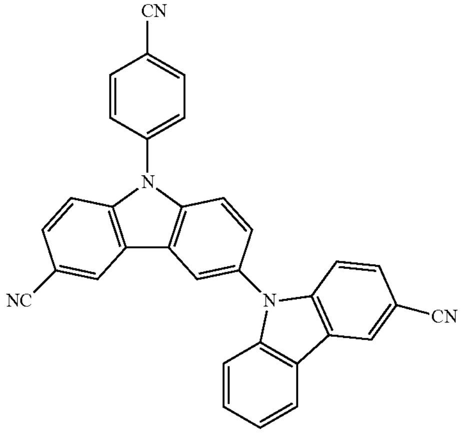

E32

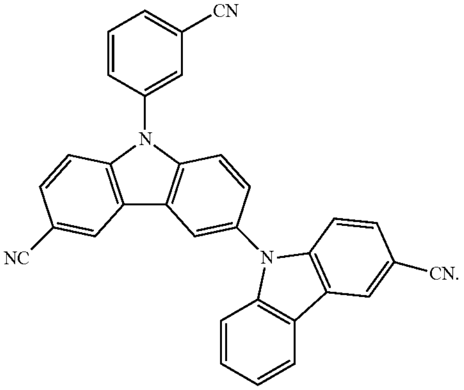

The double buffer layer DBL of an embodiment may include the above-described first compound in the first layer LA1 and the above-described second compound in the second layer LA2, may control electron injection from an electron transport region ETR to an emission layer EML, and may improve charge balance in the emission layer EML.

The light emitting element ED of an embodiment includes the double buffer layer DBL and may show high efficiency and long-life characteristics.

In an embodiment, the fourth compound may be represented by Formula 3. The fourth compound may be a hole transport host.

[Formula 3]

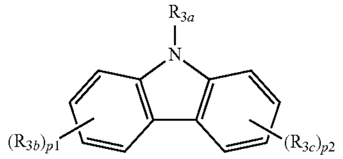

In Formula 3, $R_{3a}$, $R_{3b}$, and $R_{3c}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{3a}$ may be a substituted or unsubstituted aryl group of 6 to 30 ring-forming carbon atoms, or a substituted or unsubstituted heteroaryl group of 2 to 30 ring-forming carbon atoms. For example, $R_{3a}$ may be a substituted or unsubstituted phenyl group, a substituted or unsubstituted biphenyl group, a substituted or unsubstituted carbazole group, a substituted or unsubstituted dibenzofuran group, or a substituted or unsubstituted dibenzothiophene group. For example, $R_{3b}$ and $R_{3c}$ may each independently be a hydrogen atom, a substituted or unsubstituted silyl group, or a substituted or unsubstituted heteroaryl group of 2 to 30 ring-forming carbon atoms. For example, $R_{3b}$ and $R_{3c}$ may each independently be a hydrogen atom, a substituted or unsubstituted triphenylsilyl group, or a substituted or unsubstituted carbazole group.

In Formula 3, p1 and p2 may each independently be an integer from 0 to 4. For example, p1 and p2 may each independently be 0 or 1. A case where p1 is 0 may be the same as a case where p1 is 1 and $R_{3b}$ is a hydrogen atom. A case where p2 is 0 may be the same as a case where p2 is 1 and $R_{3c}$ is a hydrogen atom.

In an embodiment, the fourth compound represented by Formula 3 may be represented by Formula 3-1.

[Formula 3-1]

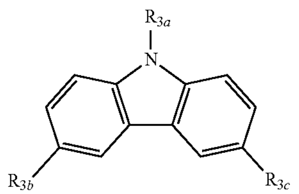

Formula 3-1 is an embodiment of Formula 3 where p1 is 1, p2 is 1, and the positions of $R_{3b}$ and $R_{3c}$ connected with a carbazole group are embodied.

In Formula 3-1, $R_{3a}$, $R_{3b}$, and $R_3$, are the same as defined in Formula 3.

In an embodiment, the fourth compound may include at least one selected from Compound Group 2.

[Compound Group 2]

H1

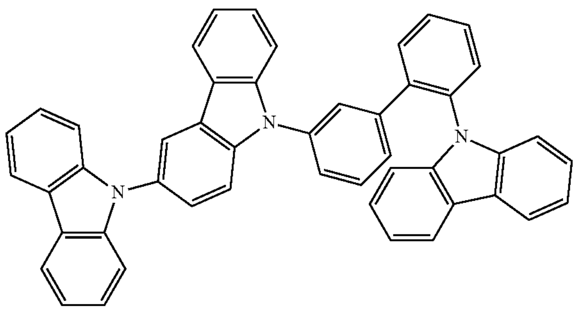

H2

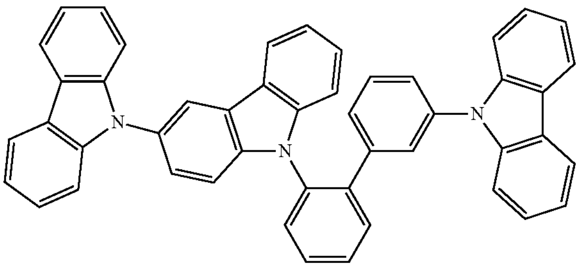

H3

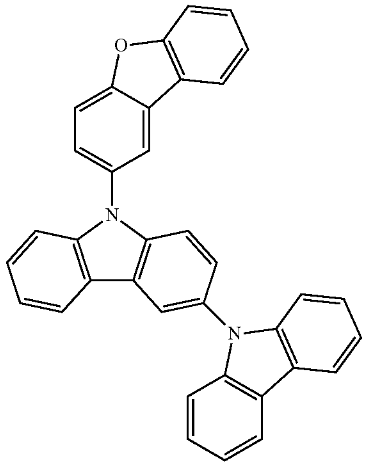

H4

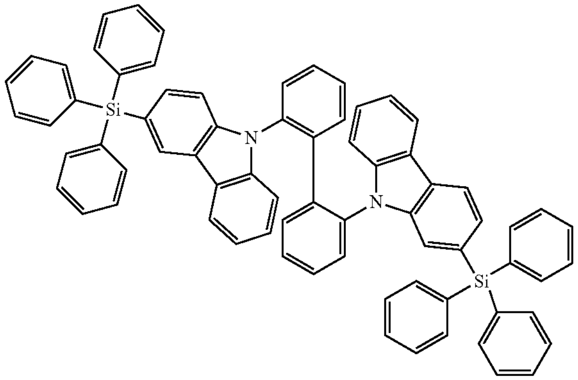

-continued
H5
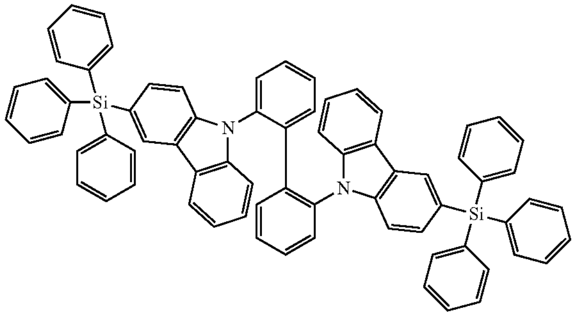
H6
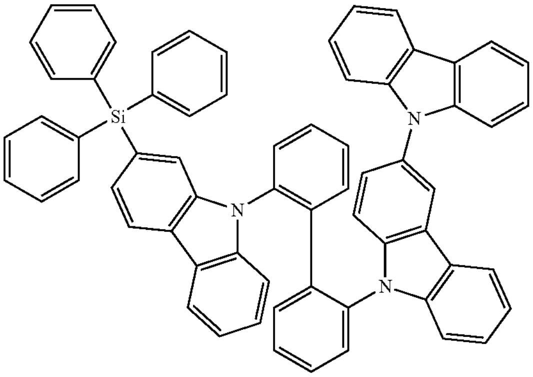
H7
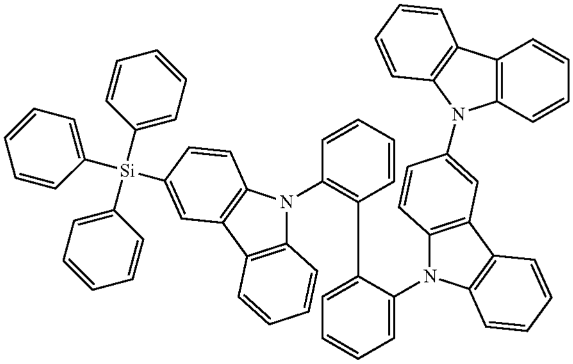
H8
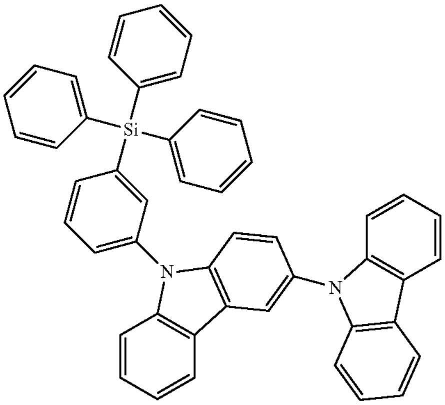
-continued
H9
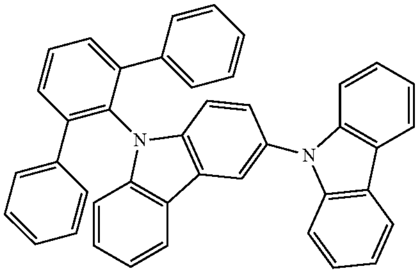
H10
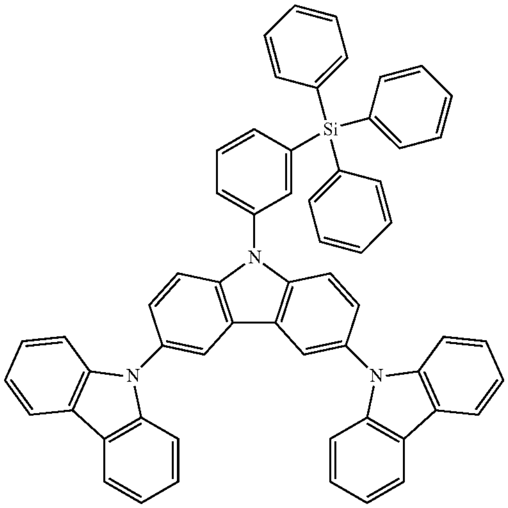
H11
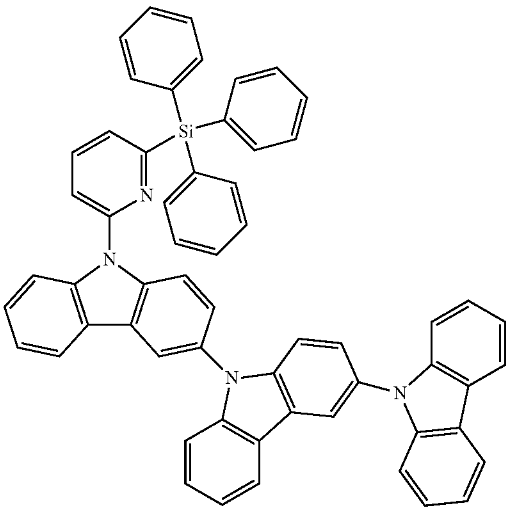

-continued
H12
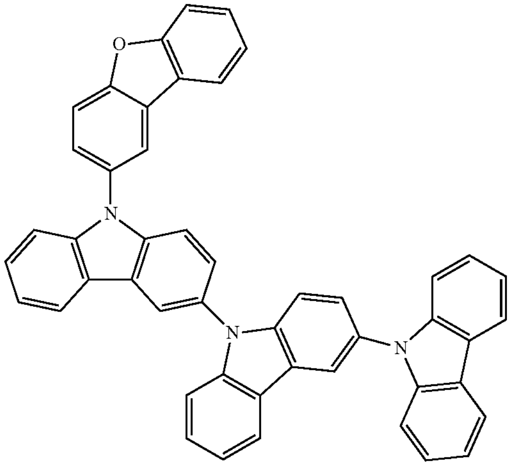
H13
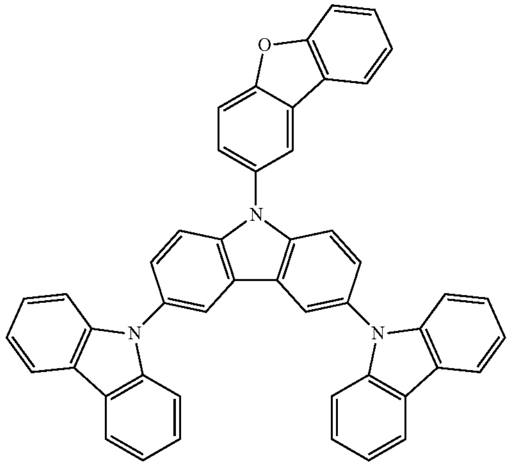
H14
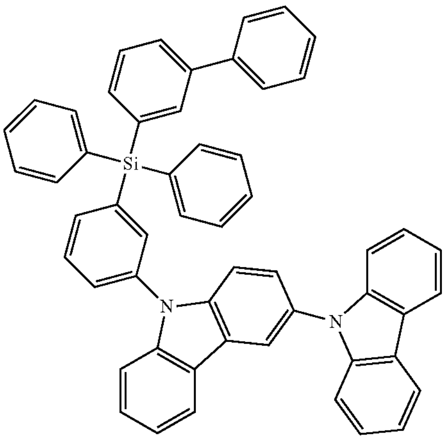
-continued
H15
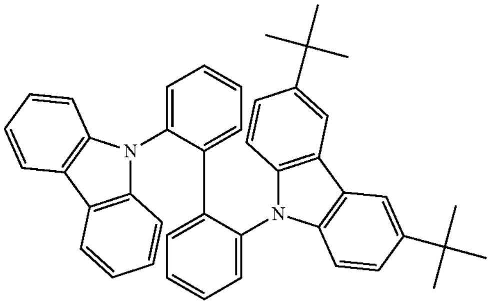
H16
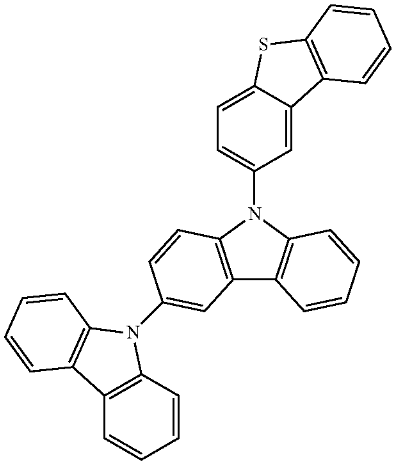
H17
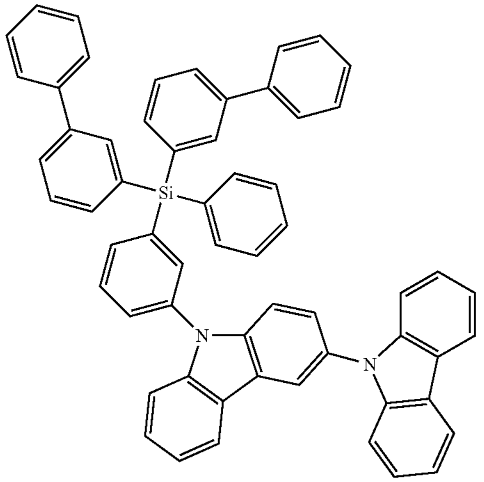
H18
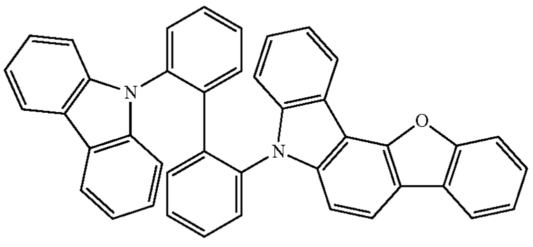

-continued

H19

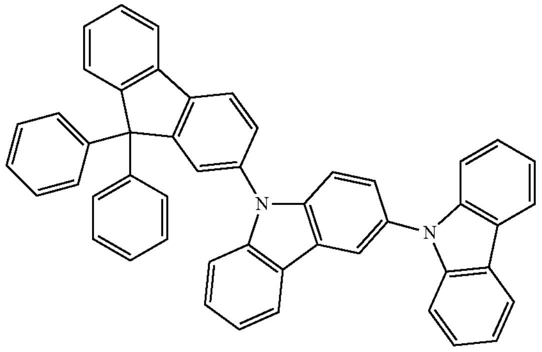

H20

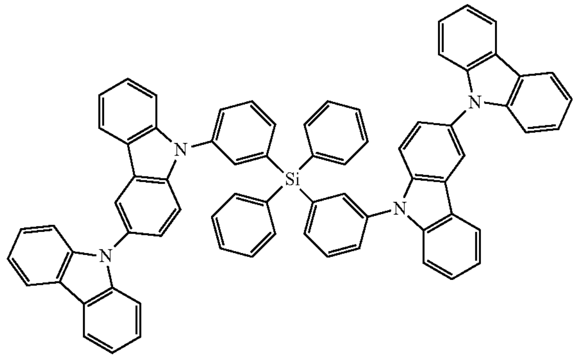

H21

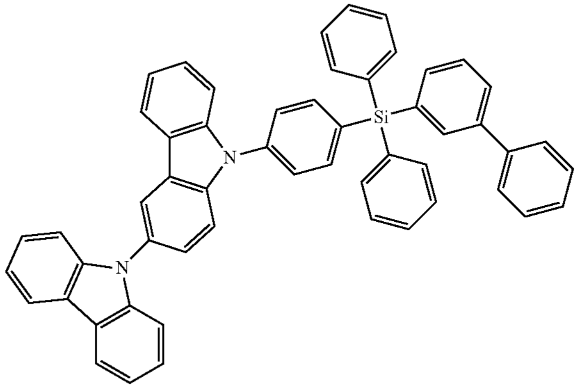

H22

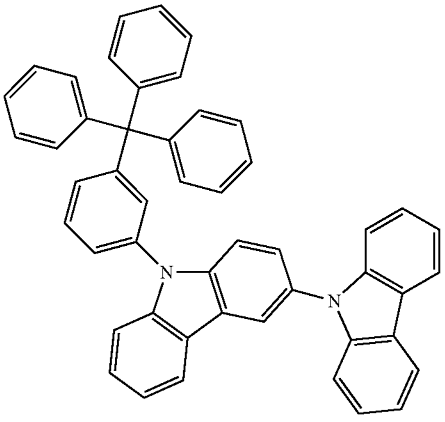

-continued

H23

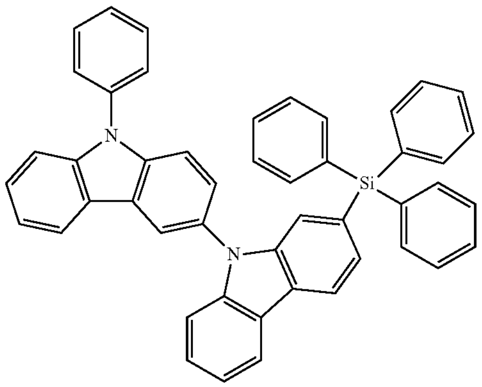

H24

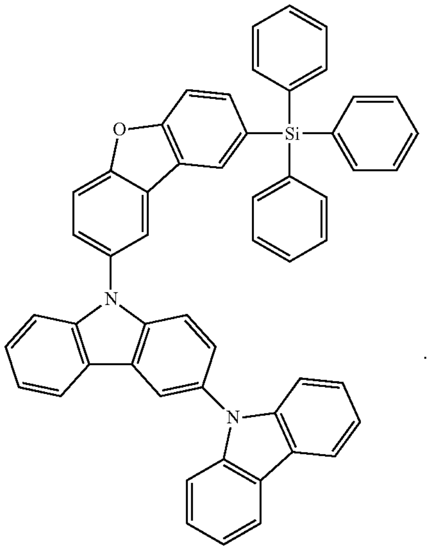

.

In an embodiment, the fifth compound may be represented by Formula 4. The fifth compound may be a phosphorescence dopant.

[Formula 4]

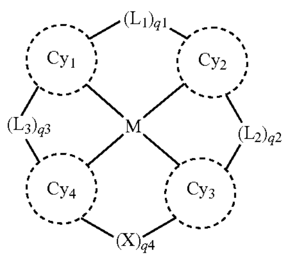

In Formula 4, M may be Pt, Pd, Cu, Au, or Os. In an embodiment, M may be Pt (platinum). The fifth compound may be an organometallic complex including Pt as a central metal, and including ligands bonded to the central metal.

In Formula 4, X may be O or $C(R_{4a})(R_{4b})$.

In Formula 4, $Cy_1$, $Cy_2$, $Cy_3$, and $Cy_4$ may each independently be a substituted or unsubstituted hydrocarbon ring of 5 to 60 ring-forming carbon atoms, or a substituted or unsubstituted heterocycle of 1 to 60 ring-forming carbon atoms. For example, $Cy_1$, $Cy_2$, $Cy_3$, and $Cy_4$ may each independently be a substituted or unsubstituted benzene, a substituted or unsubstituted pyridine, a substituted or unsubstituted imidazole, a substituted or unsubstituted benzoimidazole, or a substituted or unsubstituted carbazole.

In Formula 4, $L_1$ to $L_3$ may each independently be a direct linkage, 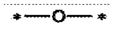 ,  ,

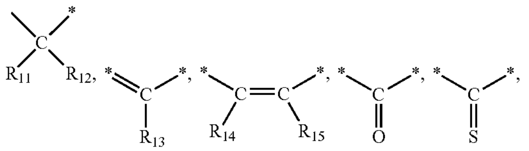

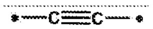 ,

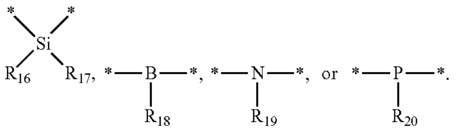

For example, $L_1$ may be  or

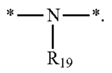

For example, $L_2$ and $L_3$ may each be a direct linkage.

In Formula 4, q1 to q4 may each independently be 0 or 1.

For example, q1 may be 0 or 1. A case where q1 is 0 may be the same as a case where $L_1$ is not present. When q1 is 0 no bond may be present between $Cy_1$ and $Cy_2$ and no group may connect $Cy_1$ and $Cy_2$.

For example, q2 may be 1.

For example, q3 may be 1.

For example, q4 may be 0 or 1. A case where q4 is 0 may be the same as a case where X is not present. When q4 is 0, no bond may be present between $Cy_3$ and $Cy_4$ and no group may connect $Cy_3$ and $Cy_4$.

In Formula 4, $R_{4a}$, $R_{4b}$, and $R_{11}$ to $R_{20}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{4a}$ and $R_{4b}$ may each independently be a hydrogen atom. For example, $R_{19}$ may be a substituted or unsubstituted phenyl group.

In an embodiment, the fifth compound may include at least one selected from Compound Group 3.

[Compound Group 3]

BD1

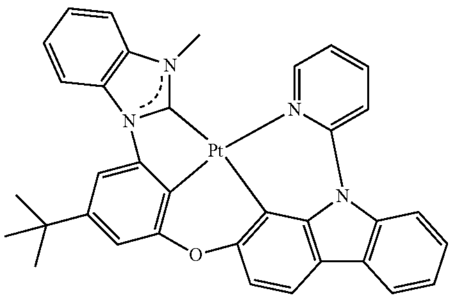

BD2

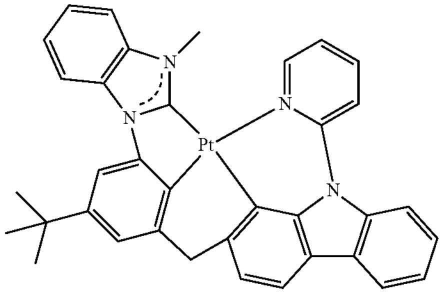

BD3

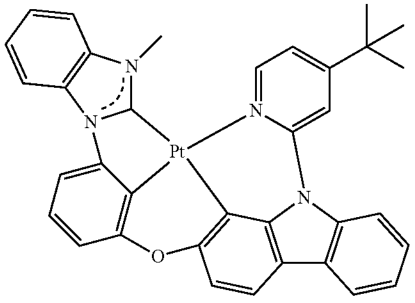

BD4

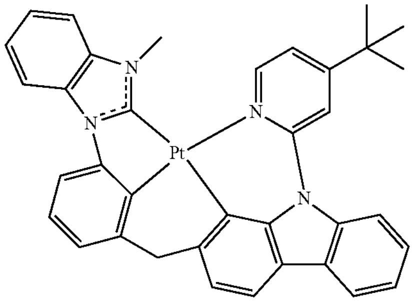

BD5

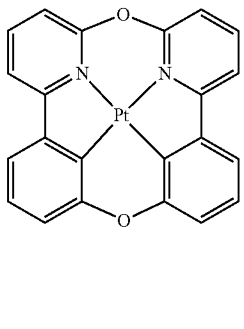

-continued

BD6

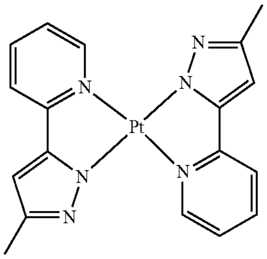

BD7

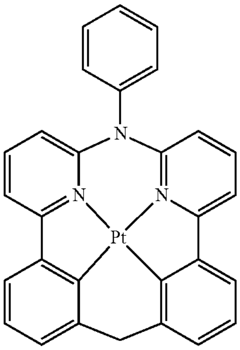

BD8

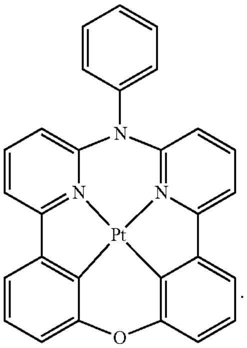

In an embodiment, the sixth compound may include a compound of the related art as a TADF dopant. For example, the sixth compound may be represented by Formula 5.

[Formula 5]

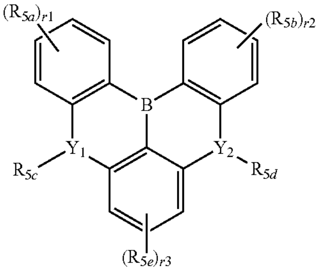

In Formula 5, $Y_1$ and $Y_2$ may each independently be O or N. For example, $Y_1$ and $Y_2$ may each be N.

In Formula 5, $R_{5a}$ to $R_{5e}$ may each independently be a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{5a}$ to $R_{5e}$ may each independently be a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. For example, $R_{5a}$ to $R_{5e}$ may each independently be a substituted or unsubstituted diphenyl amine group, a substituted or unsubstituted t-butyl group, a substituted or unsubstituted phenyl group, a substituted or unsubstituted biphenyl group, a substituted or unsubstituted terphenyl group, or a substituted or unsubstituted carbazole group. However, embodiments are not limited thereto.

For example, $R_{5e}$ may be a hydrogen atom or a substituted or unsubstituted carbazole group. However, embodiments are not limited thereto.

In Formula 5, r1 and r2 may each independently be an integer from 0 to 4. For example, r1 and r2 may each be 1.

In Formula 5, r3 may be an integer from 0 to 3. For example, r3 may be 0 or 1.

In an embodiment, the sixth compound may include at least one selected from Compound Group 4.

[Compound Group 4]

TD1

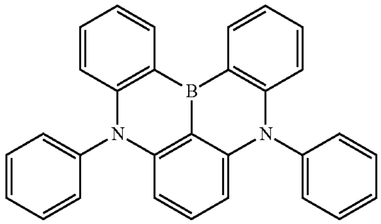

TD2

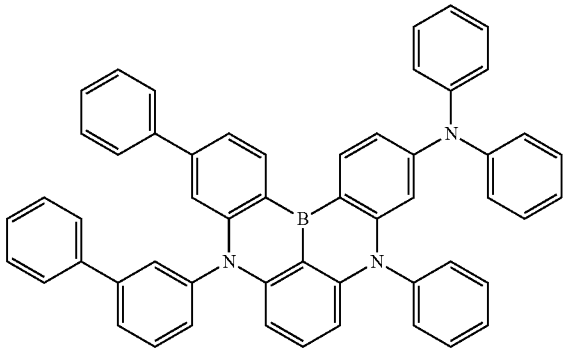

TD3

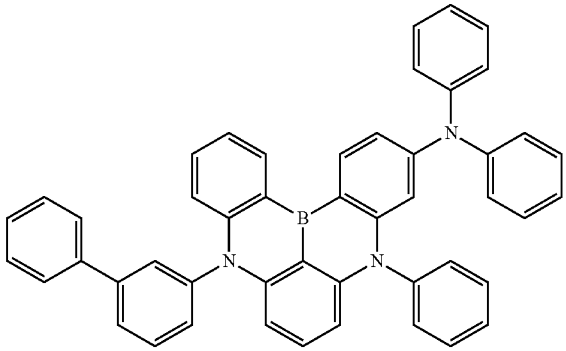

-continued
TD4
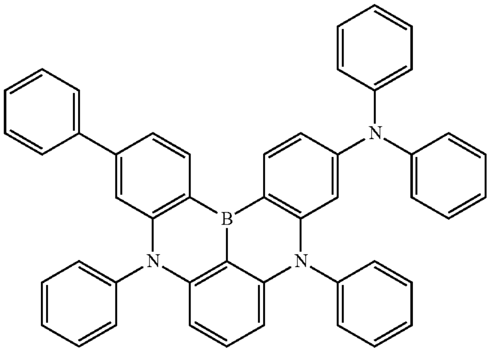
TD5
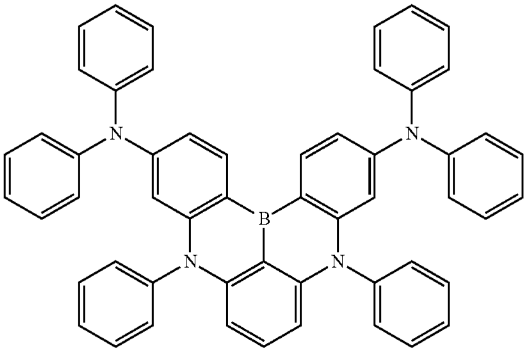
TD6
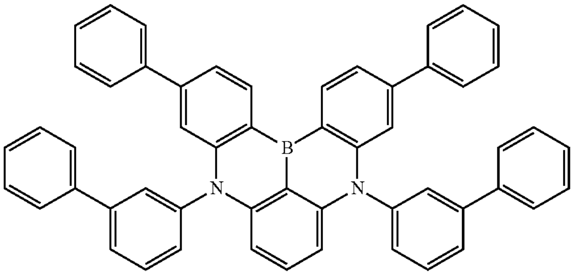
TD7
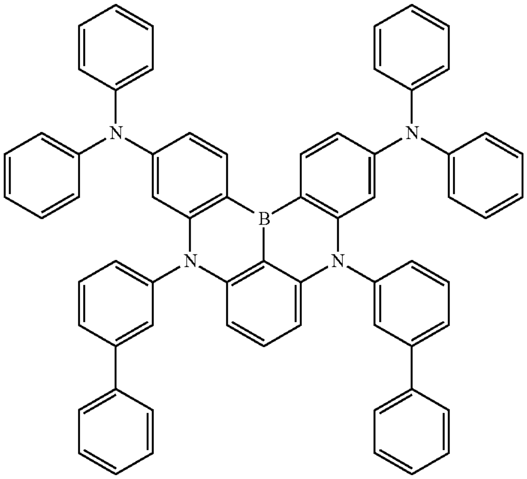
-continued
TD8
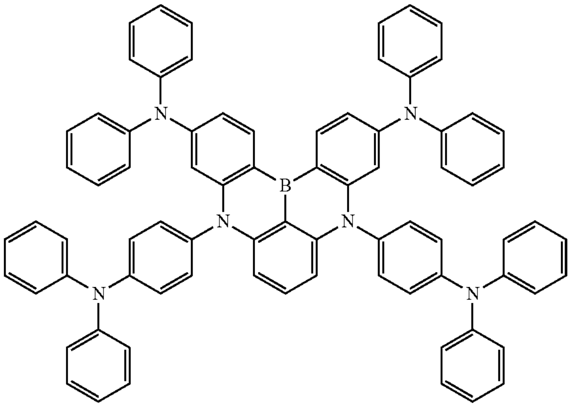
TD9
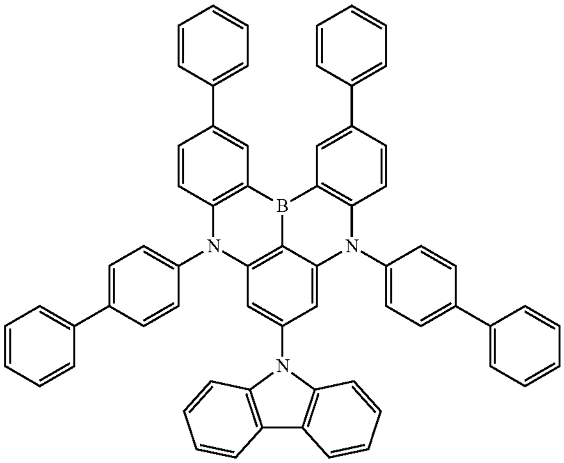
TD10
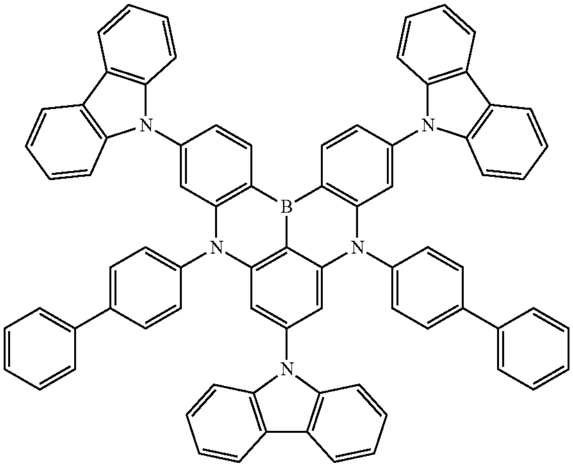

-continued

TD11

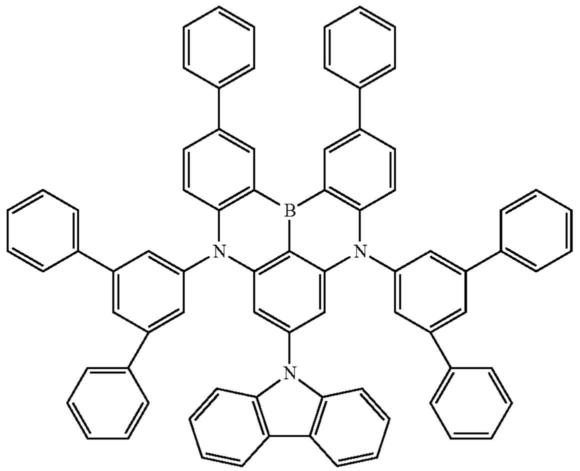

TD12

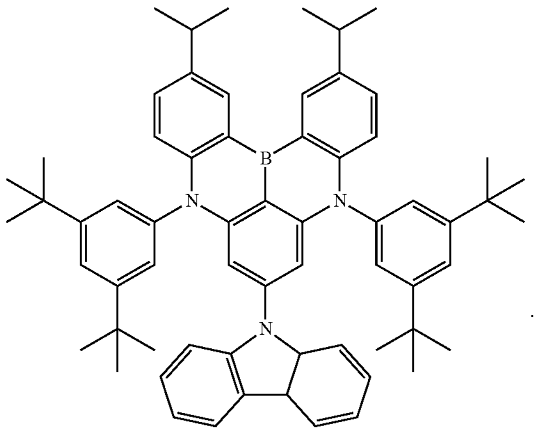

The emission layer EML of an embodiment may include the above-described third compound, fourth compound, and fifth compound. The emission layer EML of an embodiment may further include the above-described sixth compound.

In the emission layer EML, an electron transport host and a hole transport host may be combined to form an exciplex. The exciplex may transfer energy through energy transition to a phosphorescence dopant and a thermally activated delayed fluorescence (TADF) dopant to achieve light emission.

The triplet energy of the exciplex formed by the hole transport host and the electron transport host may correspond to a difference between the energy level of the lowest unoccupied molecular orbital (LUMO) of the electron transport host and the energy level of the highest occupied molecular orbital (HOMO) of the hole transport host. For example, the triplet energy of the exciplex formed by the hole transport host and the electron transport host in the light emitting element may be in a range of about 2.4 eV to about 3.0 eV. The triplet energy of the exciplex may be a value that is smaller than an energy gap of each host material. The energy gap of a host material may be a difference between the LUMO energy level of the host material and the HOMO energy level of the host material. For example, an energy gap of each of the hole transport host and the electron transport host may be equal to or greater than about 3.0 eV, and the exciplex may have the triplet energy equal to or less than about 3.0 eV.

The light emitting element ED of an embodiment includes the first compound and the second compound in the double buffer layer DBL and may show high efficiency and long-life characteristics. The first compound and the second compound included in the double buffer layer DBL may each independently be an electron transport host represented by Formula 1 or Formula 2. The light emitting element ED includes the double buffer layer DBL and may control electron injection to an emission layer EML and may improve the charge balance of the emission layer EML, thereby improving light emitting element properties.

The light emitting element ED of an embodiment includes the first compound and the second compound in the double buffer layer DBL, and includes the third compound to the fifth compound in the emission layer EML, thereby showing improved emission efficiency and increased light emitting element life.

The emission layer EML may further include light emitting materials in addition to the third compound to the fifth compound. In the light emitting element ED of an embodiment, the emission layer EML may include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting elements ED of embodiments, as shown in FIG. 3 to FIG. 6, the emission layer EML may include a host and a dopant, and the emission layer EML may include a compound represented by Formula E-1. The compound represented by Formula E-1 may be used as a fluorescence host material.

[Formula E-1]

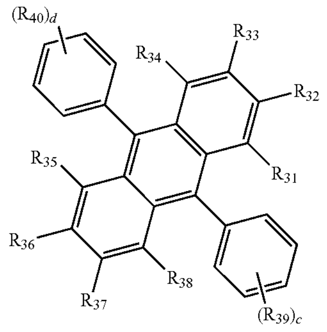

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group of 1 to 10 carbon atoms, a substituted or unsubstituted alkenyl group of 2 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_{31}$ to $R_{40}$ may be combined with an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19.

-continued
E1
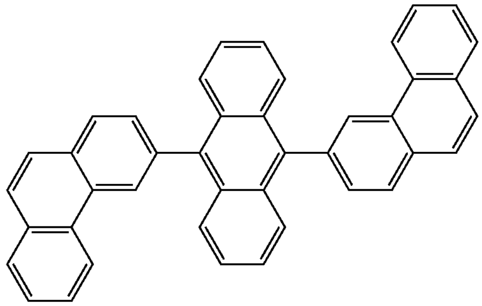
E2
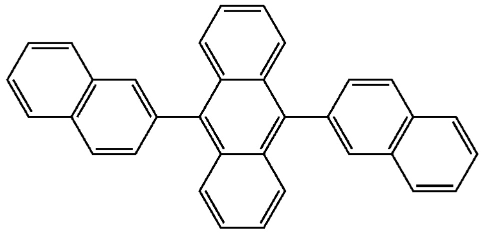
E3
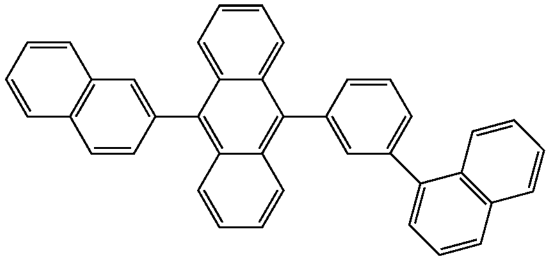
E4
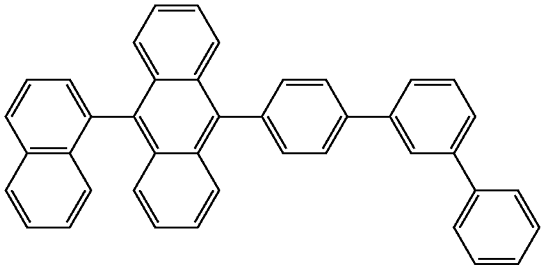
E5
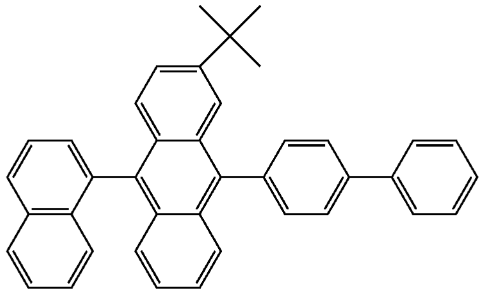
E6
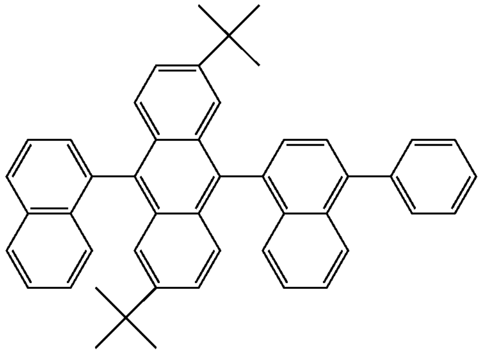
E7
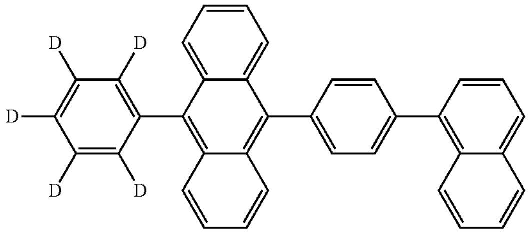
E8
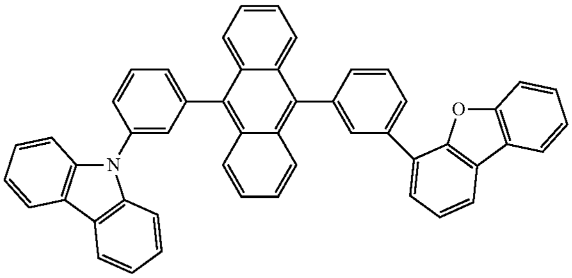
E9
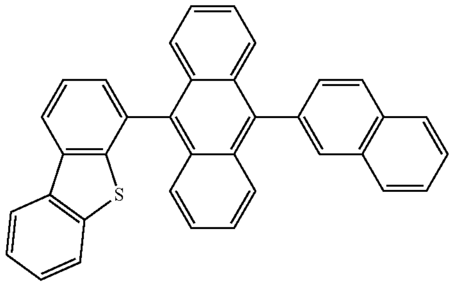
E10
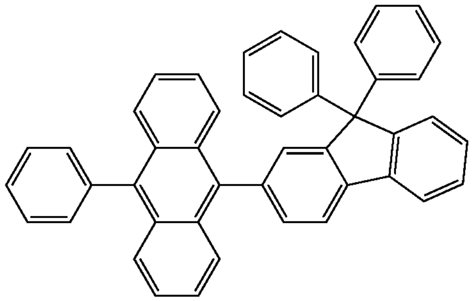

-continued
E11
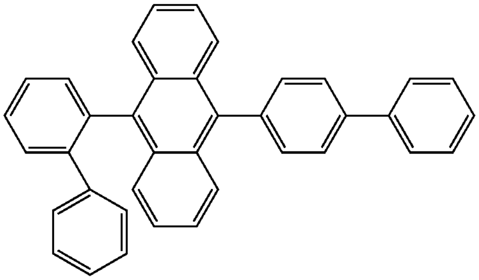
E12
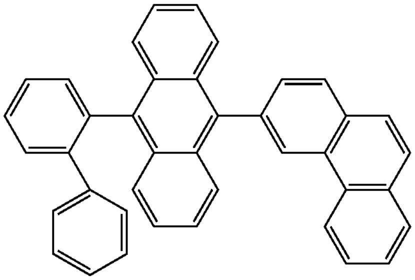
E13
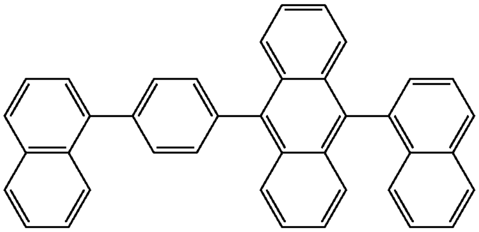
E14
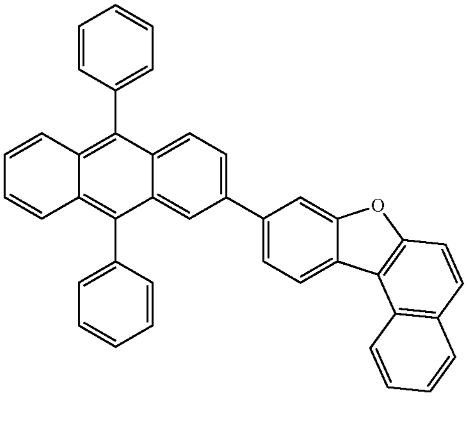
-continued
E15
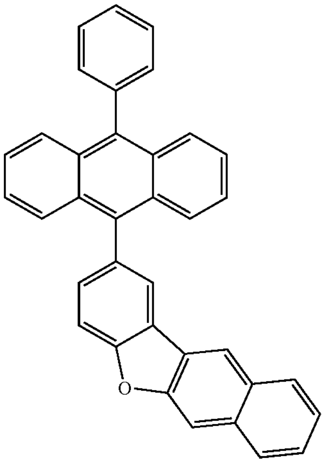
E16
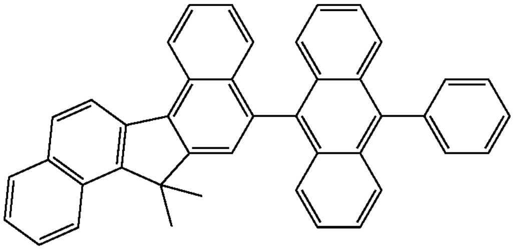
E17
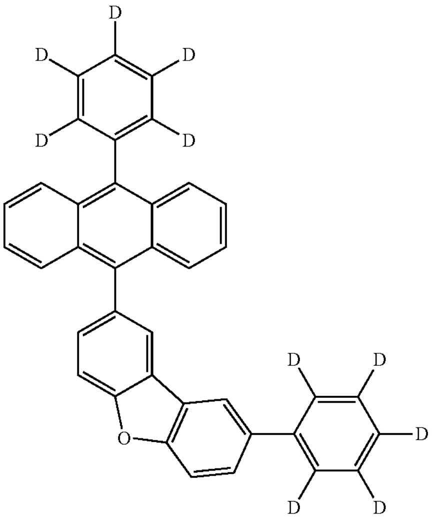
E18
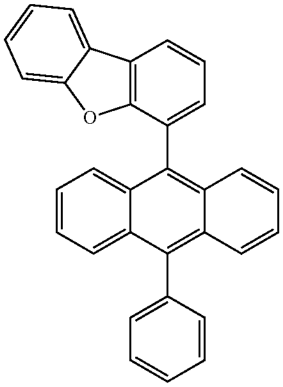

-continued

E19

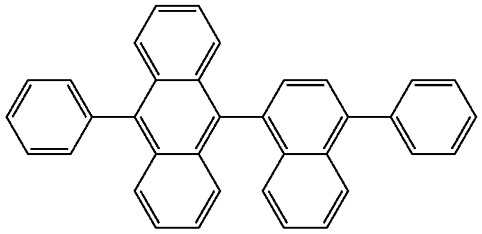

In an embodiment, the emission layer EML may include a compound represented by Formula E-2a or Formula E-2b. The compound represented by Formula E-2a or Formula E-2b may be used as a phosphorescence host material.

[Formula E-2a]

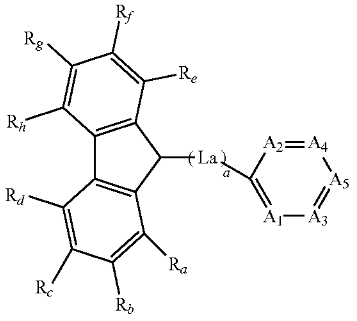

In Formula E-2a, a may be an integer from 0 to 10, and La may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple La groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1)-(L_b)_b-(Cbz2)$$

In Formula E-2b, Cbz1 and Cbz2 may each independently be an unsubstituted carbazole group, or a carbazole group substituted with an aryl group of 6 to 30 ring-forming carbon atoms. In Formula E-2b, $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer from 0 to 10, and if b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2. However, the compounds shown in Compound Group E-2 are only examples, and the compound represented by Formula E-2a or Formula E-2b is not limited to Compound Group E-2.

[Compound Group E-2]

E-2-1

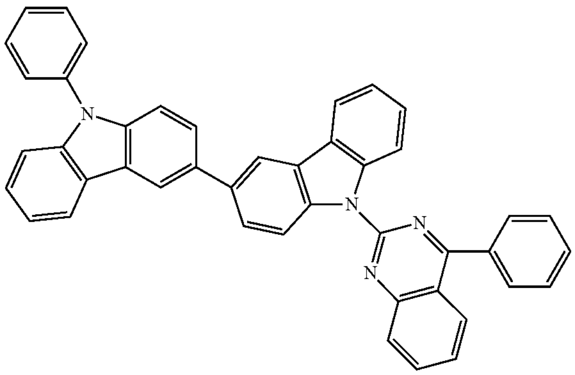

E-2-2

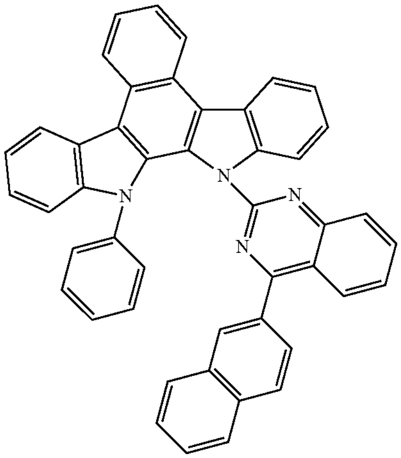

-continued
E-2-4
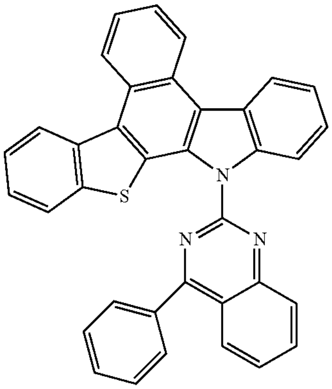
E-2-4
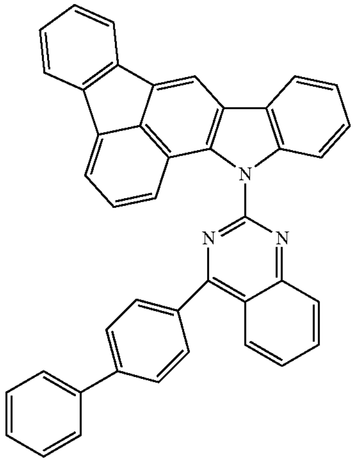
E-2-5
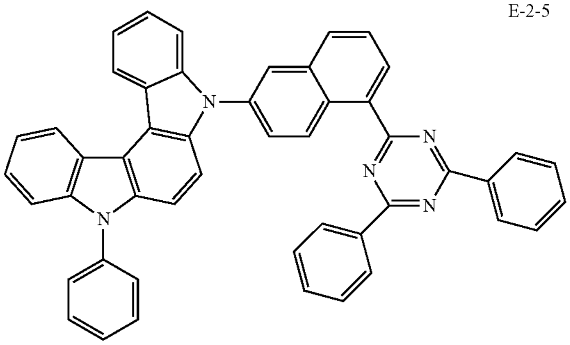
E-2-6
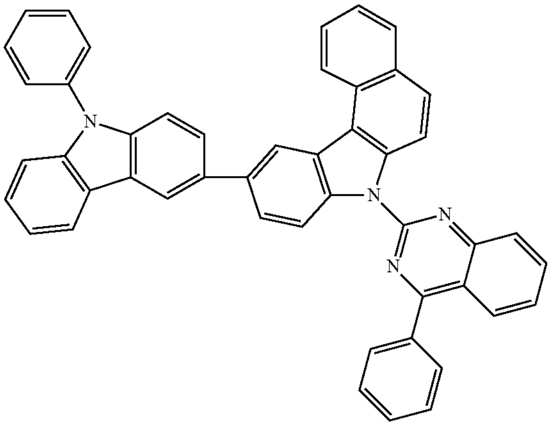
-continued
E-2-7
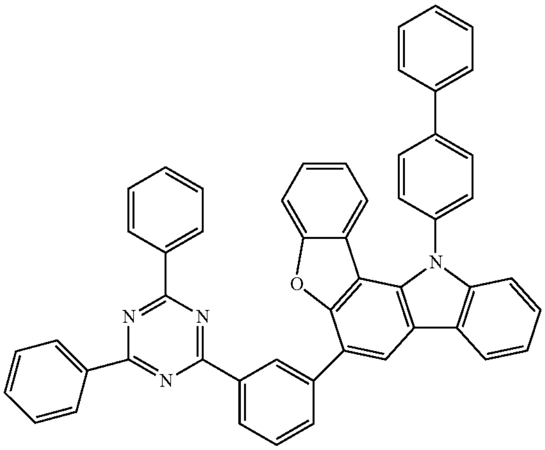
E-2-8
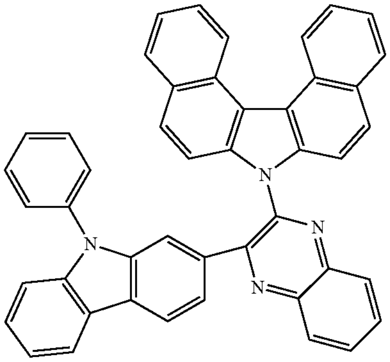
E-2-9
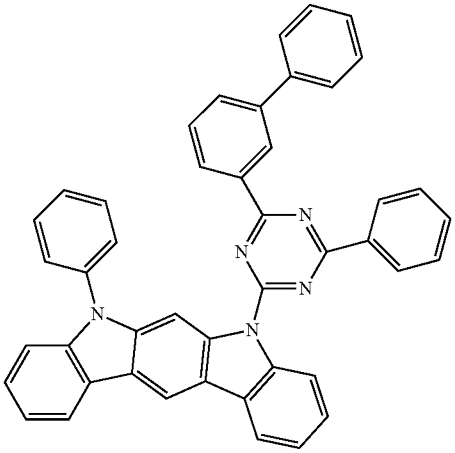

-continued
E-2-10
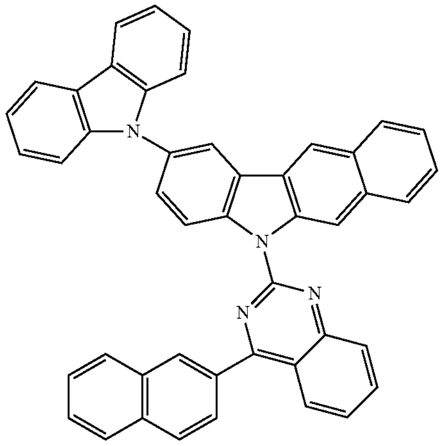
E-2-11
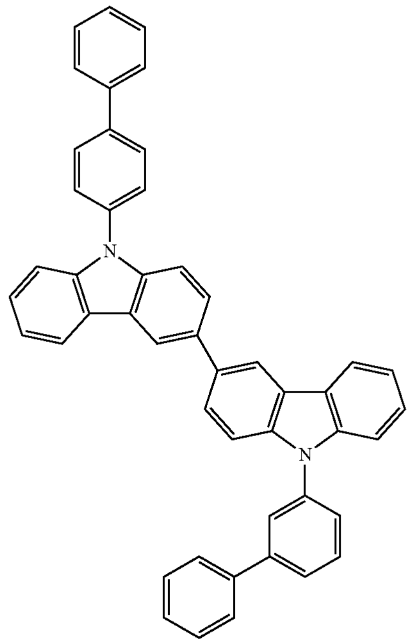
E-2-12
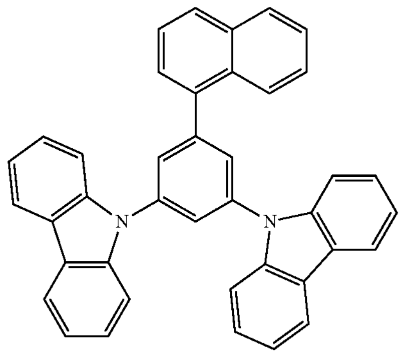
-continued
E-2-13
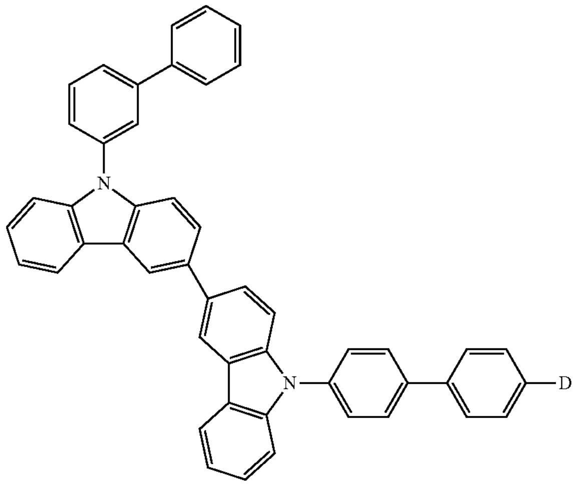
E-2-14
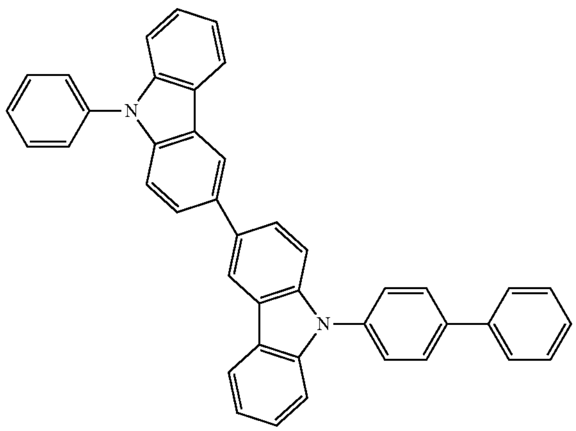
E-2-15
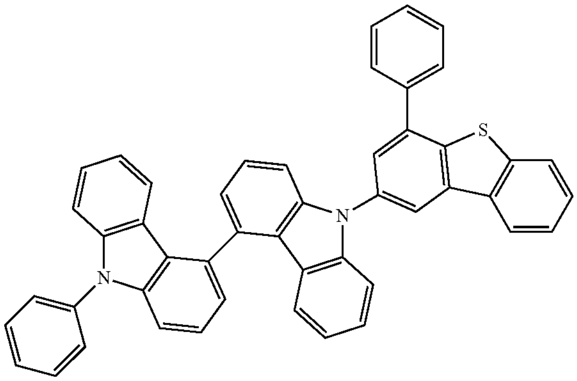

-continued
E-2-16
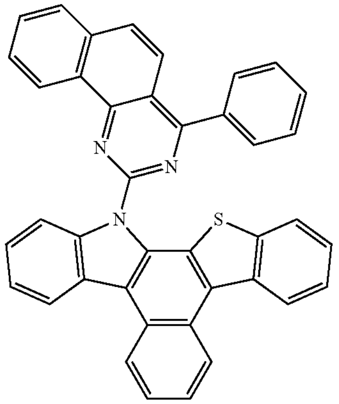
E-2-17
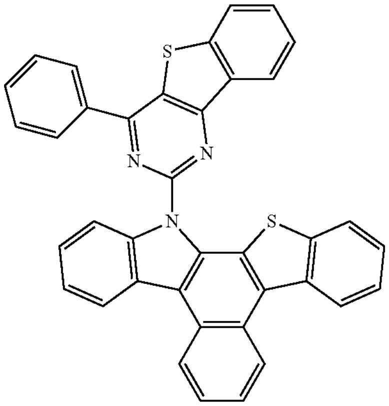
E-2-18
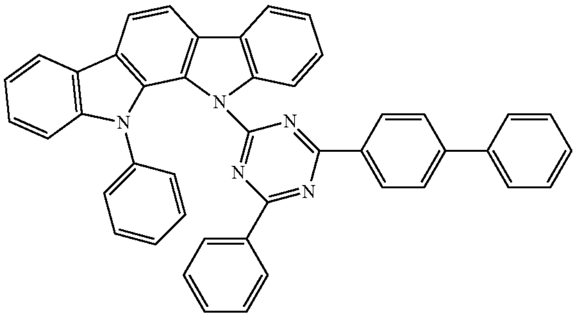
E-2-19
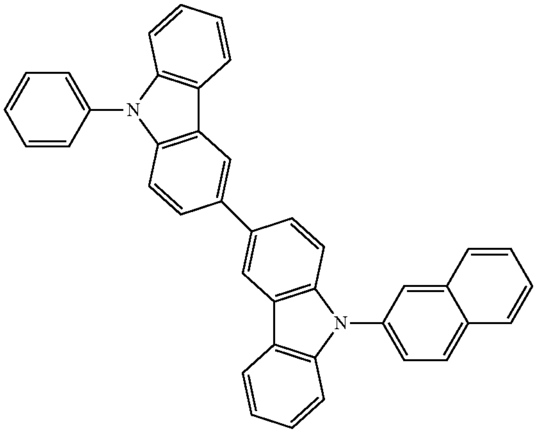
-continued
E-2-20
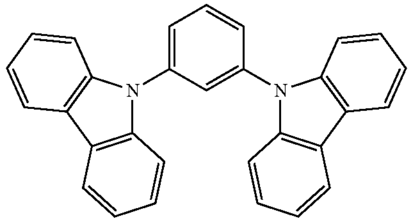
E-2-21
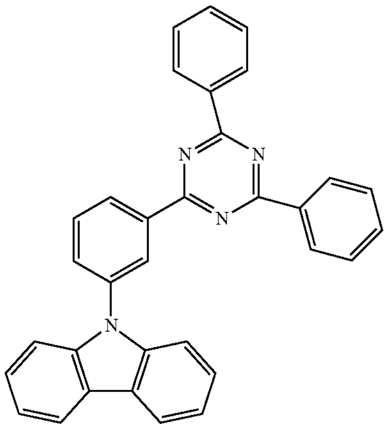
E-2-22
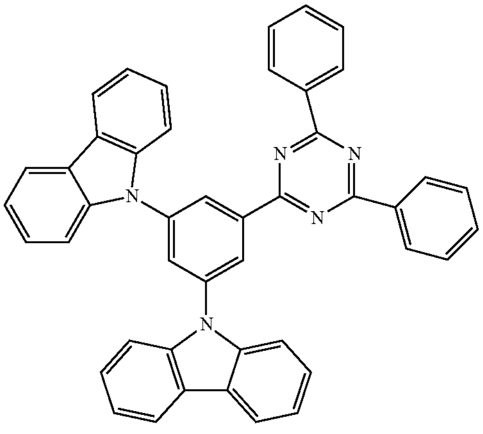
E-2-23
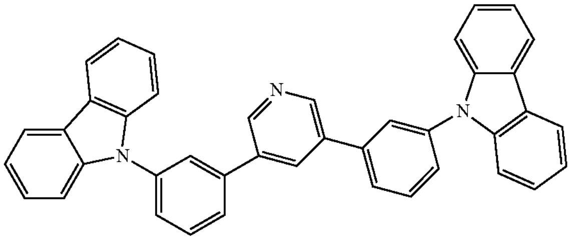

-continued

E-2-24

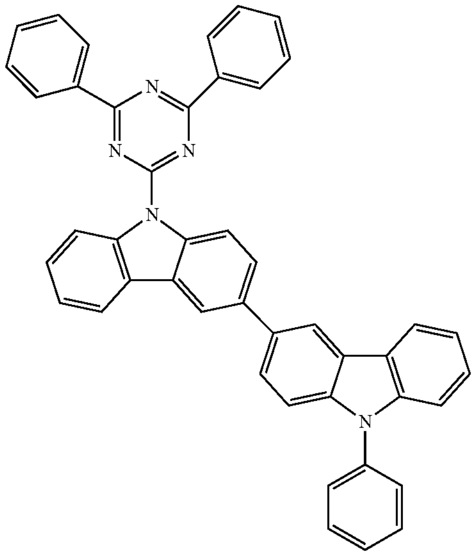

The emission layer EML may further include a material of the related art as a host material. For example, the emission layer EML may include as a host material, at least one of bis(4-(9H-carbazol-9-yl) phenyl) diphenylsilane (BCPDS), (4-(1-(4-(diphenylamino) phenyl) cyclohexyl) phenyl) diphenyl-phosphine oxide (POPCPA), bis[2-(diphenylphosphino) phenyl]ether oxide (DPEPO), 4,4'-bis(carbazol-9-yl) biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as the host material.

The emission layer EML may include a compound represented by Formula M-a. The compound represented by Formula M-a may be used as a phosphorescence dopant material.

[Formula M-a]

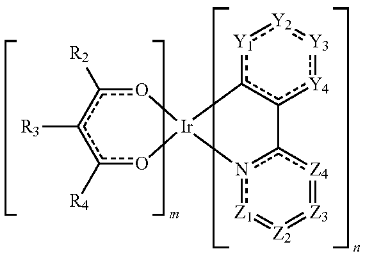

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if m is 1, n may be 2.

The compound represented by Formula M-a may be used as a phosphorescence dopant.

The compound represented by Formula M-a may be any one selected from Compounds M-a1 to M-a25. However, Compounds M-a1 to M-a25 are only examples, and the compound represented by Formula M-a is not limited to Compounds M-a1 to M-a25.

M-a1

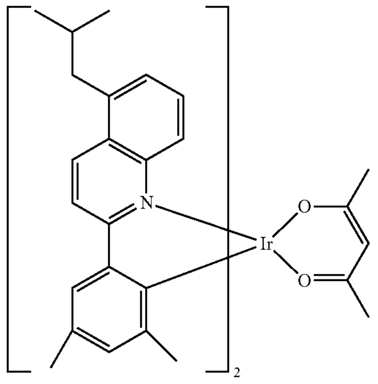

M-a2

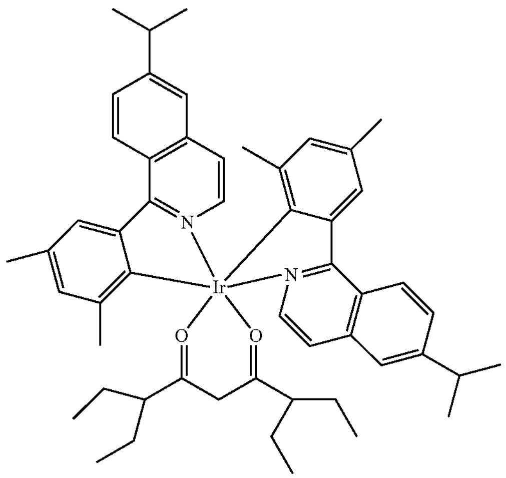

M-a3

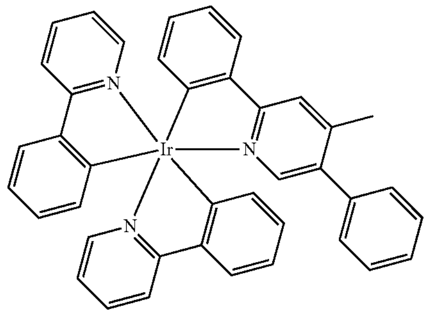

-continued
M-a4
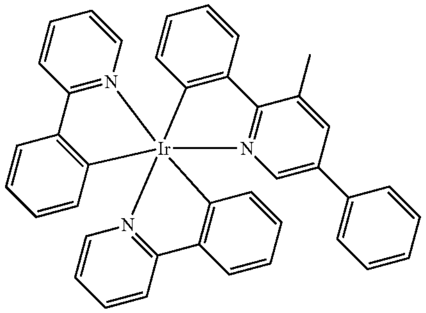
M-a5
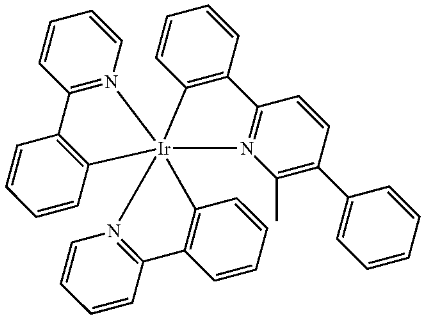
M-a6
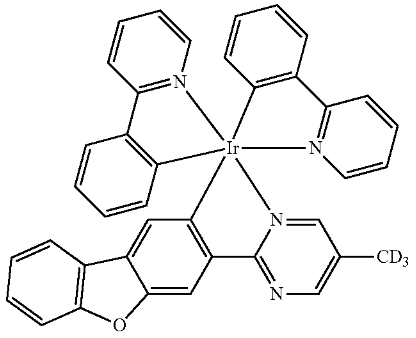
M-a7
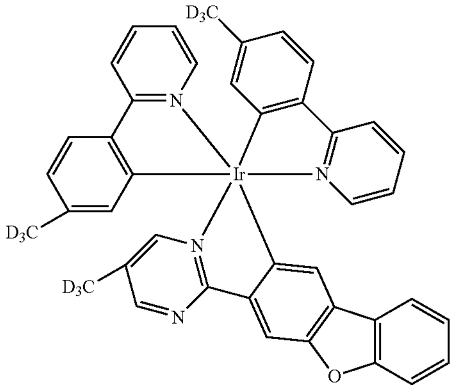
M-a8
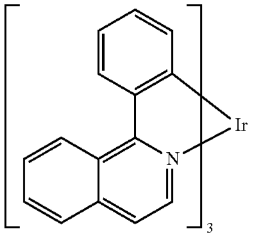
-continued
M-a9
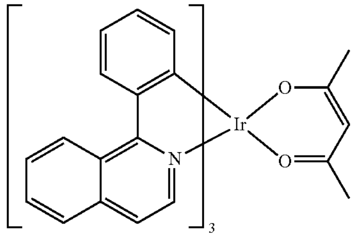
M-a10
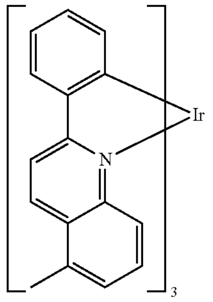
M-a11
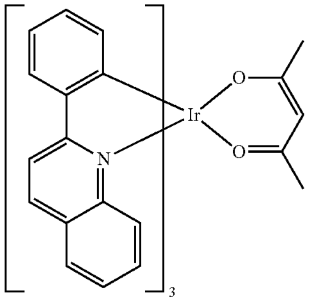
M-a12
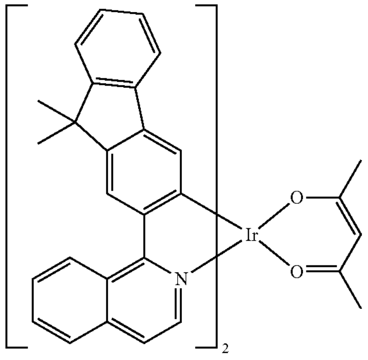
M-a13
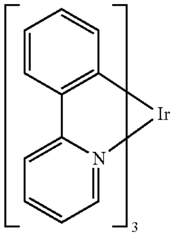

-continued
M-a14
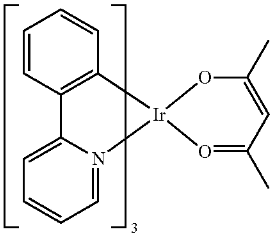
M-a15
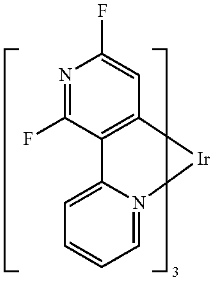
M-a16
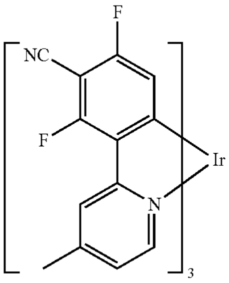
M-a17
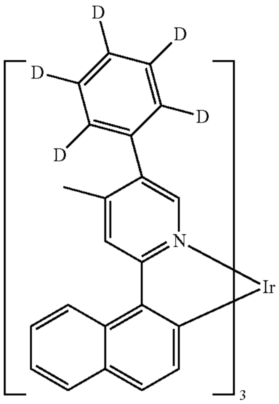
M-a18
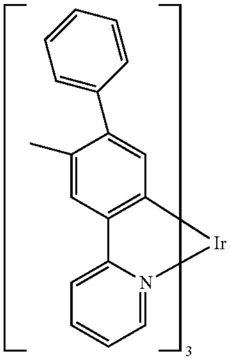
-continued
M-a19
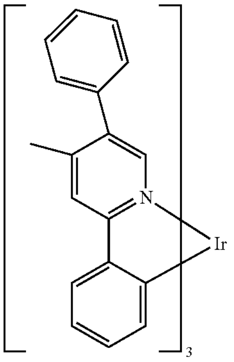
M-a20
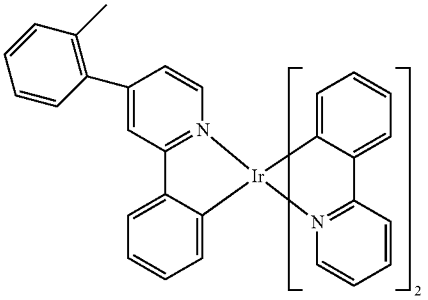
M-a21
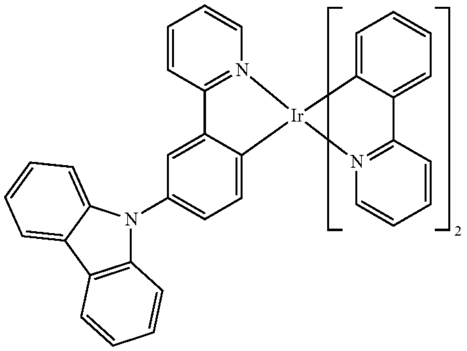
M-a22
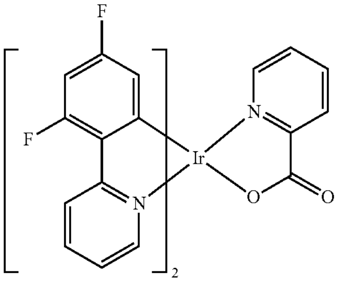
M-a23
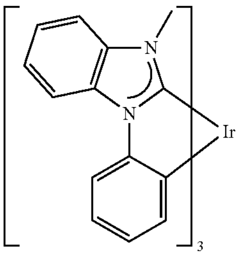

-continued

M-a24

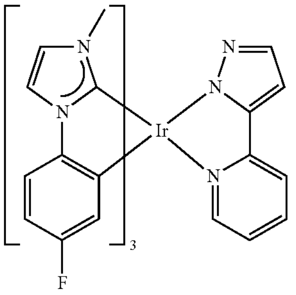

M-a25

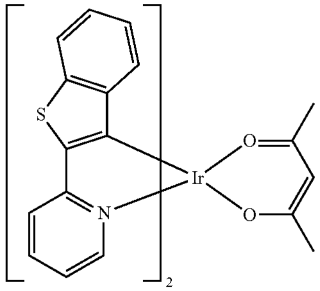

The emission layer EML may include a compound represented by any one of Formula F-a to Formula F-c. The compounds represented by Formula F-a to Formula F-c may be used as fluorescence dopant materials.

[Formula F-a]

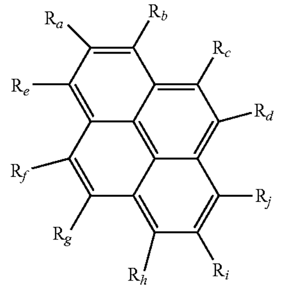

In Formula F-a, two of $R_a$ to $R_j$ may each independently be substituted with a group represented by $*—NAr_1Ar_2$. The remainder of $R_a$ to $R_j$ which are not substituted with the group represented by $*—NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group represented by $*—NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ or $Ar_2$ may be a heteroaryl group including O or S as a ring-forming atom.

[Formula F-b]

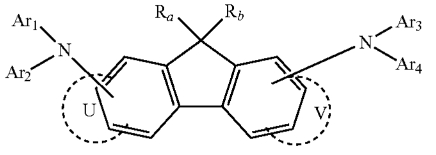

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula F-b, $Ar_1$ to $Ar_4$ may each independently be a substituted or unsubstituted aryl group of 6 to 30 ring-forming carbon atoms, or a substituted or unsubstituted heteroaryl group of 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. In Formula F-b, if the number of U or V is 1, a fused ring may be present at the part designated by U or V, and if the number of U or V is 0, a fused ring may not be present at the part designated by U or V. If the number of U is 0 and the number of V is 1, or if the number of U is 1 and the number of V is 0, a fused ring having the fluorene core of Formula F-b may be a polycyclic compound with four rings. If the number of both U and V is 0, a fused ring having the fluorene core of Formula F-b may be a polycyclic compound with three rings. If the number of both U and V is 1, a fused ring having the fluorene core of Formula F-b may be a polycyclic compound with five rings.

[Formula F-c]

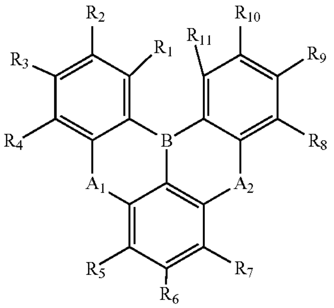

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include a dopant material of the related art, such as styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The EML may include a phosphorescence dopant material of the related art. For example, the phosphorescence dopant may include a metal complex including iridium (Ir), platinum (Pt), osmium (Os), gold (Au), titanium (Ti), zirconium (Zr), hafnium (Hf), europium (Eu), terbium (Tb), or thulium (Tm). For example, iridium(III) bis(4,6-difluorophenylpyridinato-N,C2') (Firpic), bis(2,4-difluorophenylpyridinato)-tetrakis(1-pyrazolyl)borate iridium(III) (Fir6), or platinum octaethyl porphyrin (PtOEP) may be used as the phosphorescence dopant. However, embodiments are not limited thereto.

The emission layer EML may include a quantum dot. The quantum dot may be selected from a Group II-VI compound, a Group III-VI compound, a Group I-III-VI compound, a Group III-V compound, a Group III-II-V compound, a Group IV-VI compound, a Group IV element, a Group IV compound, or a combination thereof.

The Group II-VI compound may be selected from: a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof, or any combination thereof.

The Group III-VI compound may include: a binary compound such as $In_2S_3$, and $In_2Se_3$; a ternary compound such as $InGaS_3$, and $InGaSe_3$; or any combination thereof.

The Group I-III-VI compound may be selected from: a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, a quaternary compound such as $AgInGaS_2$, and $CuInGaS_2$; or any combination thereof.

The Group III-V compound may be selected from: a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof, or any combination thereof. The Group III-V compound may further include a Group II metal. For example, InZnP, etc. may be selected as a Group III-II-V compound.

The Group IV-VI compound may be selected from: a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, a quaternary compound selected from the group consisting of SnPbSSe, SnPbSeTe, SnPbSTe, and mixtures thereof, or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration or may be present at a partially different concentration distribution state. In an embodiment, the quantum dot may have a core/shell structure in which a quantum dot surrounds another quantum dot. A quantum dot having a core/shell structure may have a concentration gradient at an interface between the core and the shell in which the concentration of an element that is present in the shell decreases toward the center.

In embodiments, the quantum dot may have a core-shell structure including a core including a nanocrystal and a shell surrounding the core. The shell of the quantum dot may function as a protection layer that prevents the chemical deformation of the core to maintain semiconductor properties and/or may function as a charging layer that imparts the quantum dot with electrophoretic properties. The shell may be a single layer or a multilayer. Examples of the shell of the quantum dot may include a metal oxide, a non-metal oxide, a semiconductor compound, or combinations thereof.

For example, the metal oxide or the non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but embodiments are not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within these ranges, color purity or color reproducibility may be improved. Light emitted through a quantum dot may be emitted in all directions, so that light viewing angle properties may be improved.

The shape of the quantum dot may be a shape that is used in the related art, without specific limitation. For example, the quantum dot may have a spherical shape, a pyramidal shape, a multi-arm shape, or a cubic shape, or the quantum dot may be in the form of a nanoparticle, a nanotube, a nanowire, a nanofiber, a nanoplate particle, etc.

The quantum dot may control the color of emitted light according to a particle size thereof, and accordingly, the quantum dot may have various emission colors such as blue, red, or green.

In the light emitting elements ED according to embodiments, as shown in FIG. 3 to FIG. 6, the electron transport region ETR is provided on the double buffer layer DBL. The electron transport region ETR may include at least one of a hole blocking layer HBL, an electron transport layer ETL, or an electron injection layer EIL. However, embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, or a single layer structure formed of an electron injection material and an electron transport material. In other embodiments, the electron transport region ETR may have a single layer structure formed of different materials, or may have a structure in which an electron transport layer ETL/electron injection layer EIL, or a hole blocking layer HBL/electron transport layer ETL/electron injection layer EIL, are stacked in its respective stated order from the double buffer layer DBL, but embodiments are not limited thereto. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1.

[Formula ET-1]

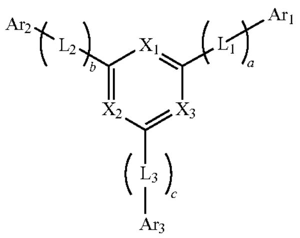

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and mixtures thereof, without limitation.

The electron transport region ETR may include at least one of Compounds ET1 to ET36.

ET1

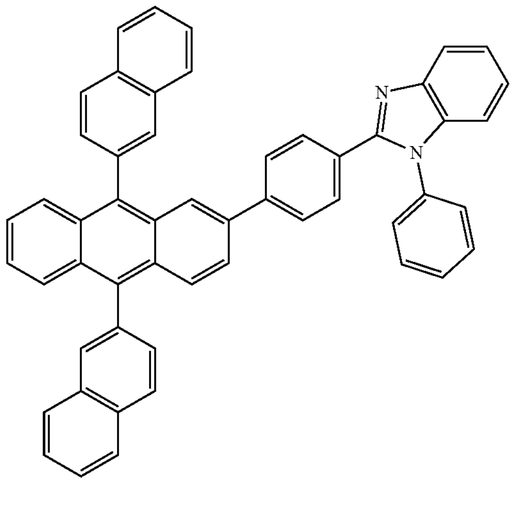

-continued
ET2
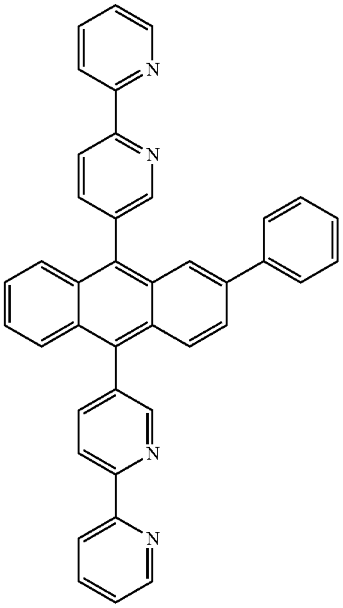
ET3
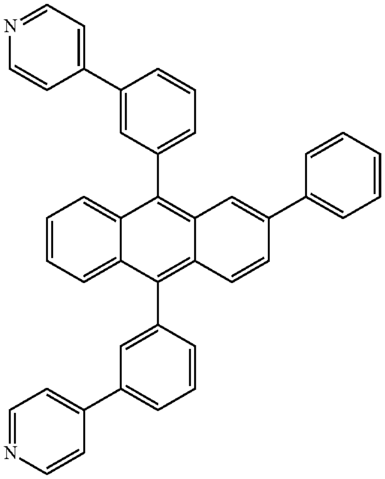
ET4
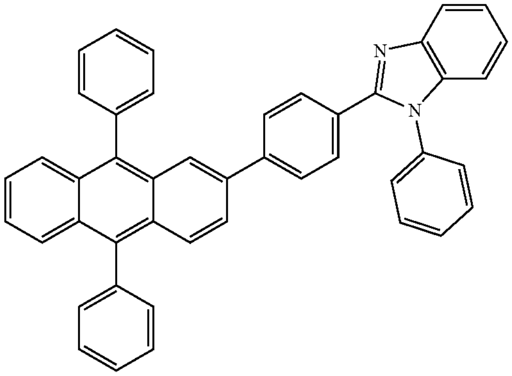
-continued
ET5
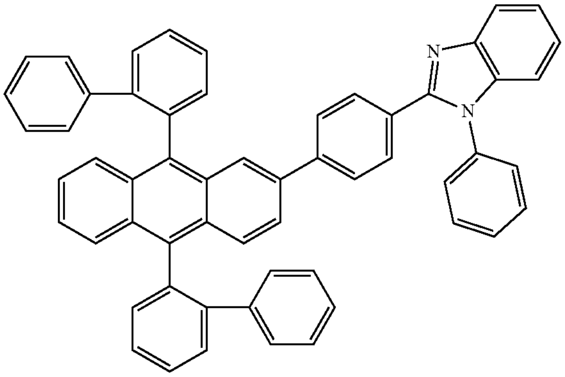
ET6
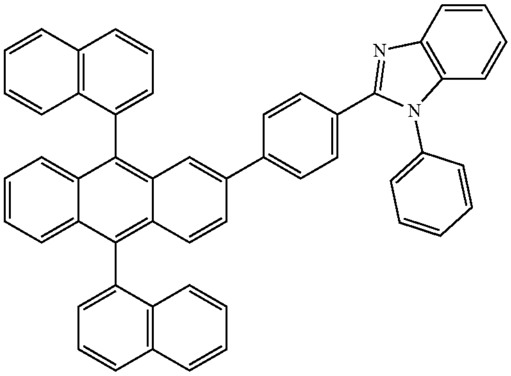
ET7
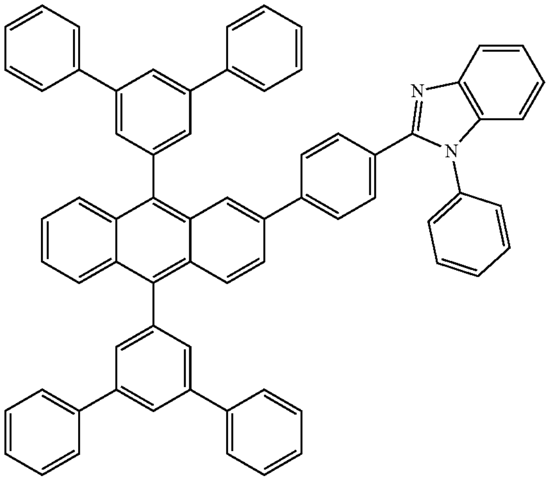

-continued
ET8
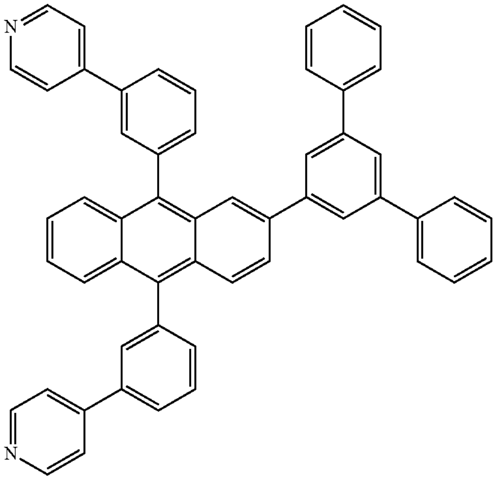
ET9
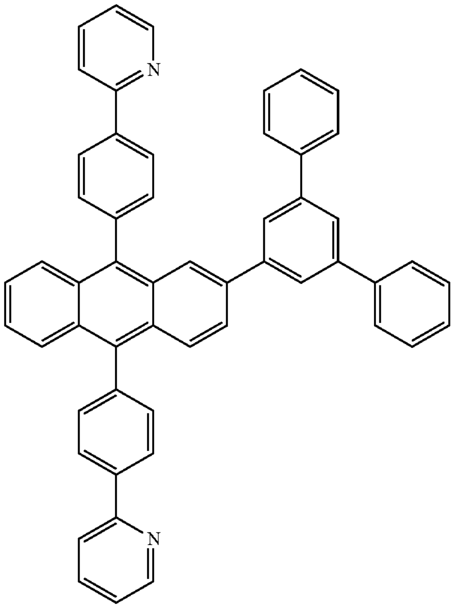
-continued
ET10
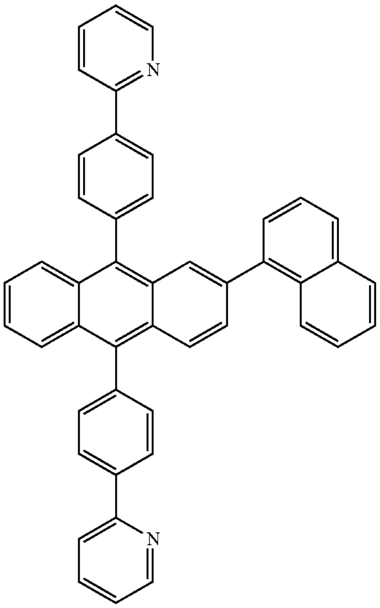
ET11
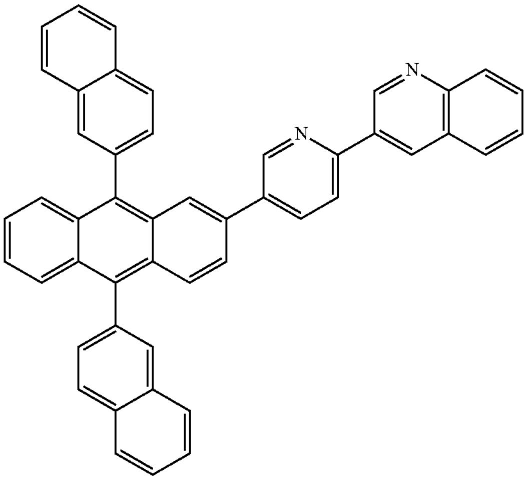
ET12
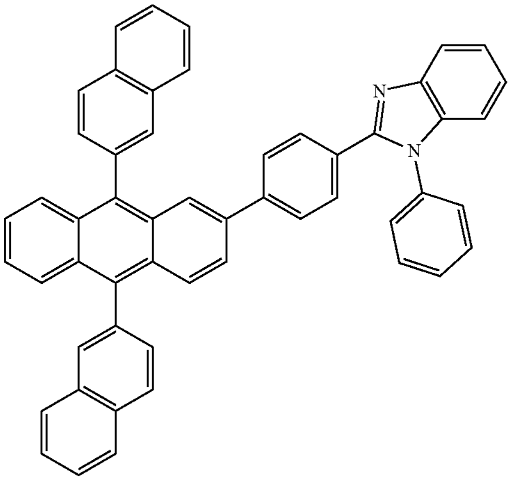

-continued
ET13
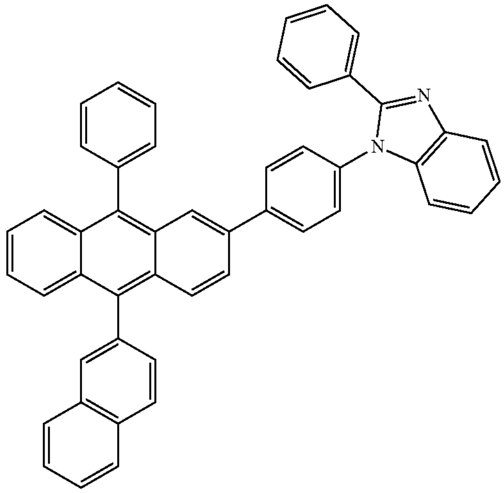
ET14
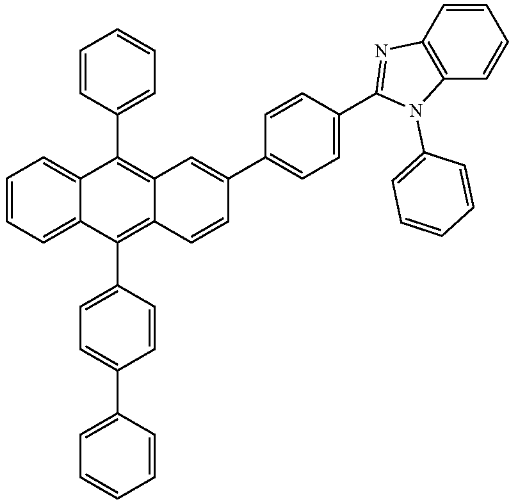
ET15
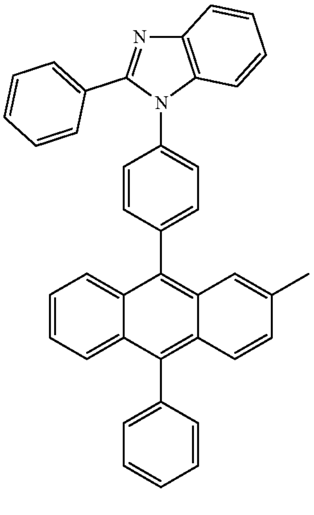
-continued
ET16
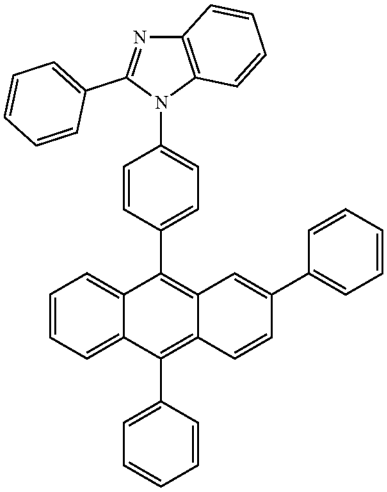
ET17
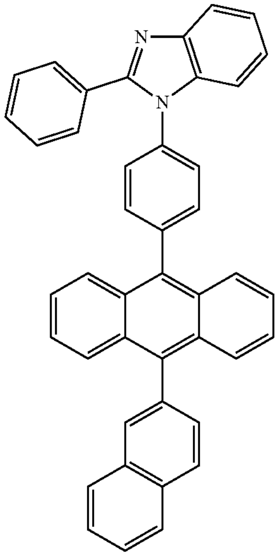
ET18
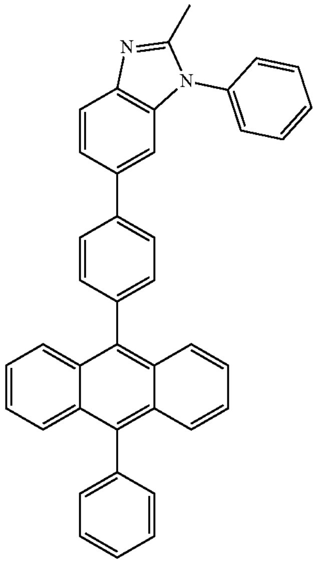

-continued
ET19
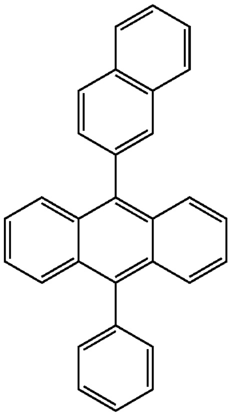
ET20
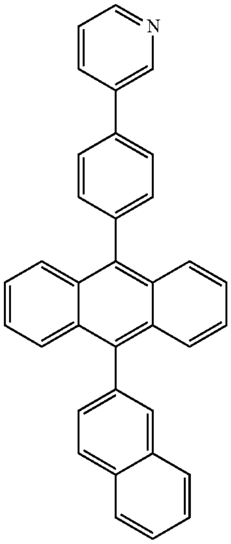
ET21
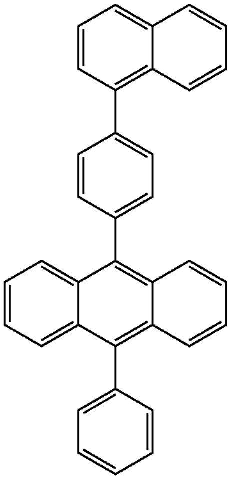
-continued
ET22
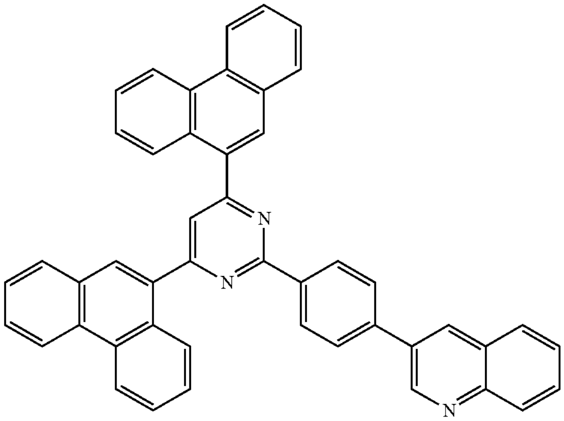
ET23
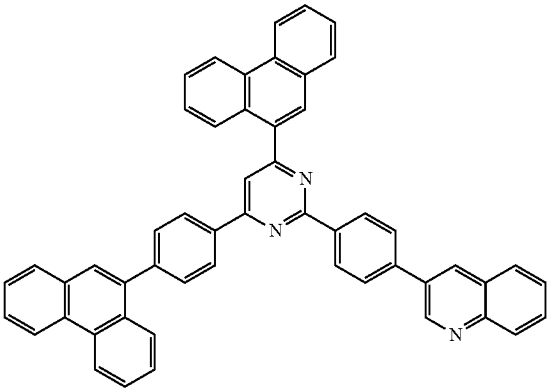
ET24
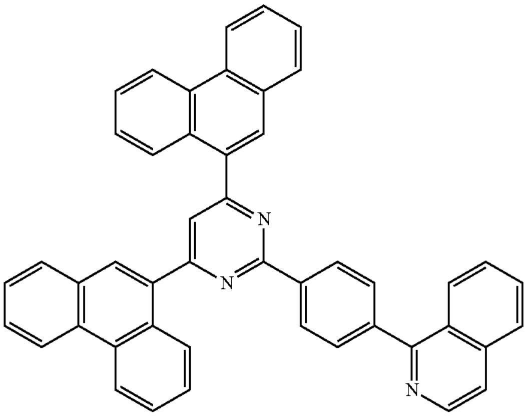

-continued
ET25
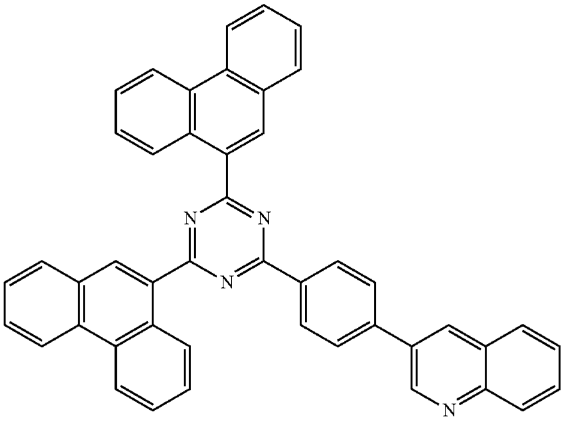
ET26
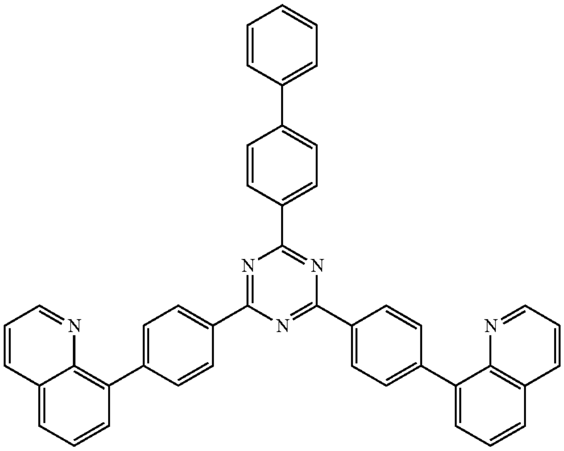
ET27
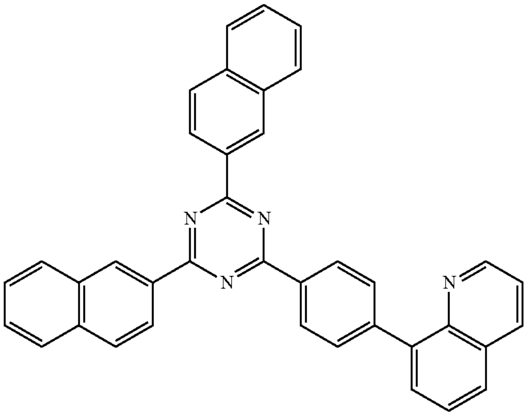
-continued
ET28
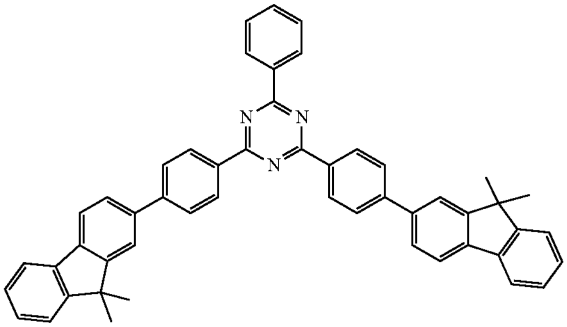
ET29
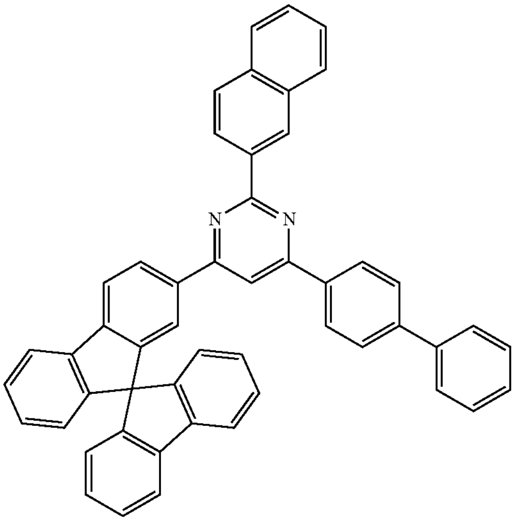
ET30
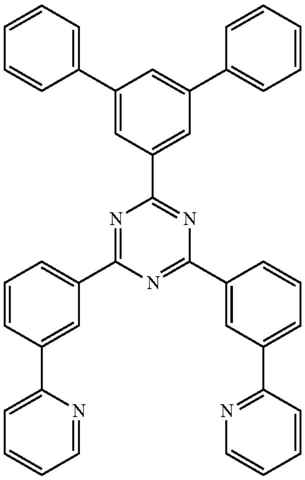

-continued

ET31

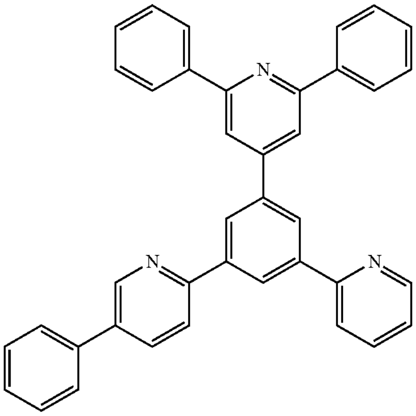

ET32

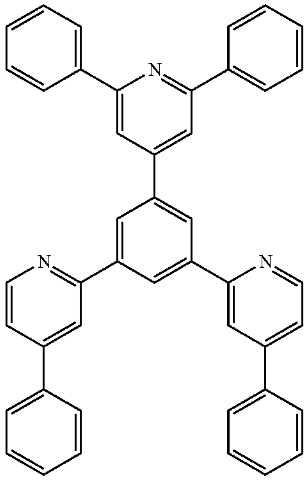

ET33

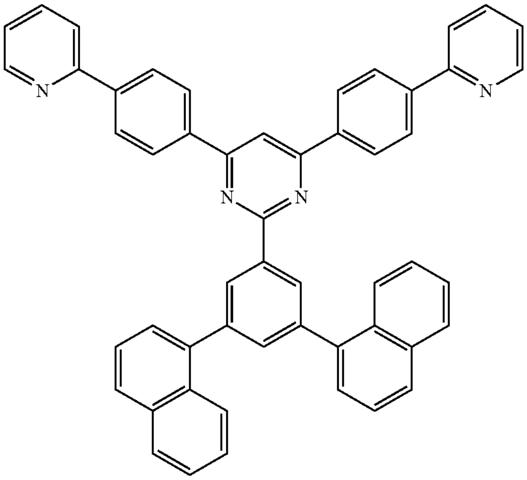

-continued

ET34

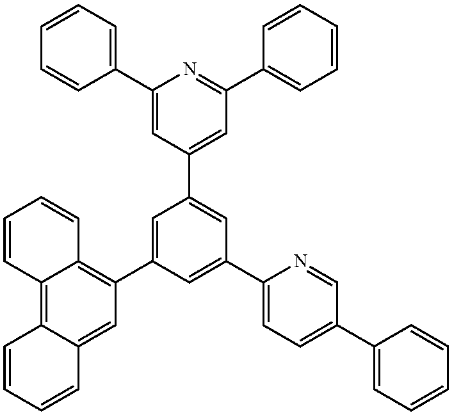

ET35

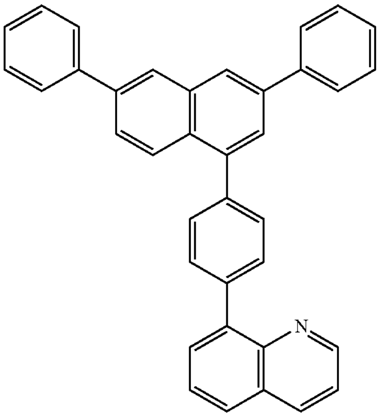

ET36

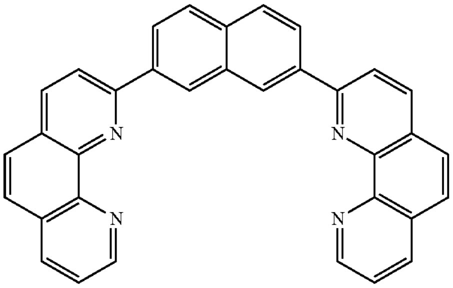

The electron transport region ETR may include a metal halide such as LiF, NaCl, CsF, RbCl, RbI, CuI, or KI, a lanthanide such as Yb, or a co-depositing material of the metal halide and the lanthanide. For example, the electron transport region ETR may include KI:Yb, RbI:Yb, LiF:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed of a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), diphenyl(4-(triphenylsilyl)phenyl)phosphine oxide (TSPO1) or 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, or a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without a substantial increase of driving voltage. If the electron transport region ETR includes an electron injection layer EIL, a thickness of the electron injection layer EIL may be in a range of from about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing a substantial increase of driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In another embodiment, the second electrode EL2 may have a multi-layered structure including a reflective layer or a transflective layer formed of the above-described materials and a transparent conductive layer formed of ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting element ED may further include a capping layer CPL disposed on the second electrode EL2. The capping layer CPL may be a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as $MgF_2$, SiON, SiNx, SiOy, etc.

For example, if the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl) triphenylamine (TCTA), etc., or may include an epoxy resin, or acrylate such as methacrylate. For example, the capping layer CPL may include at least one of Compounds P1 to P5, but embodiments are not limited thereto.

P1

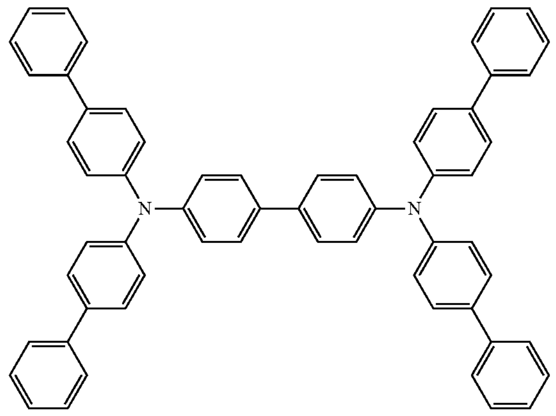

P2

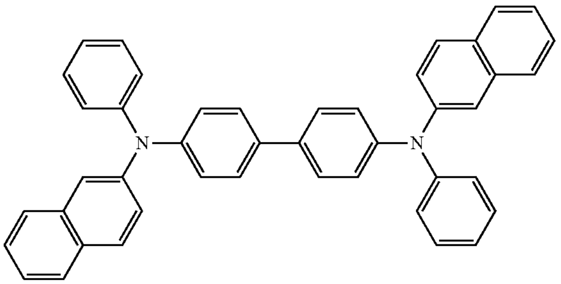

P3

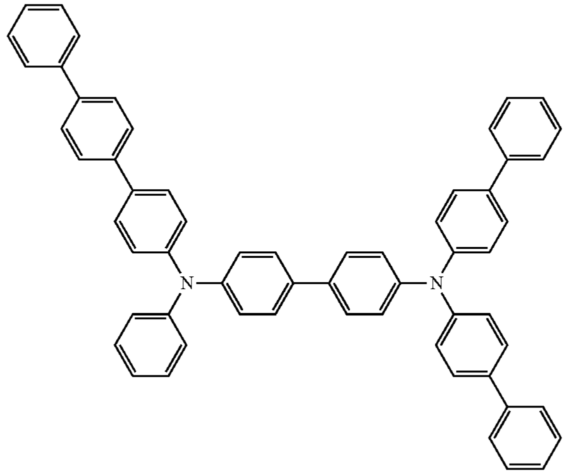

-continued

P4

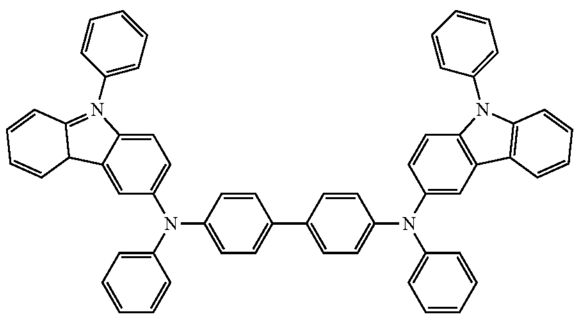

P5

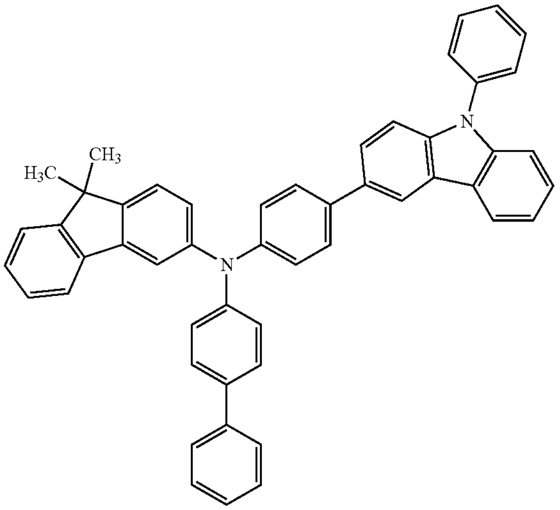

A refractive index of the capping layer CPL may be equal to or greater than about 1.6. For example, the refractive index of the capping layer CPL may be equal to or greater than about 1.6 with respect to light in a wavelength range of about 550 nm to about 660.

FIG. 7 to FIG. 10 are each a schematic cross-sectional view of a display apparatus according to embodiments. In the explanation on the display apparatuses of embodiments according to FIG. 7 to FIG. 10, the features which overlap with the explanation on FIG. 1 to FIG. 6 will not be explained again, and the different features will be explained.

Figure 7:
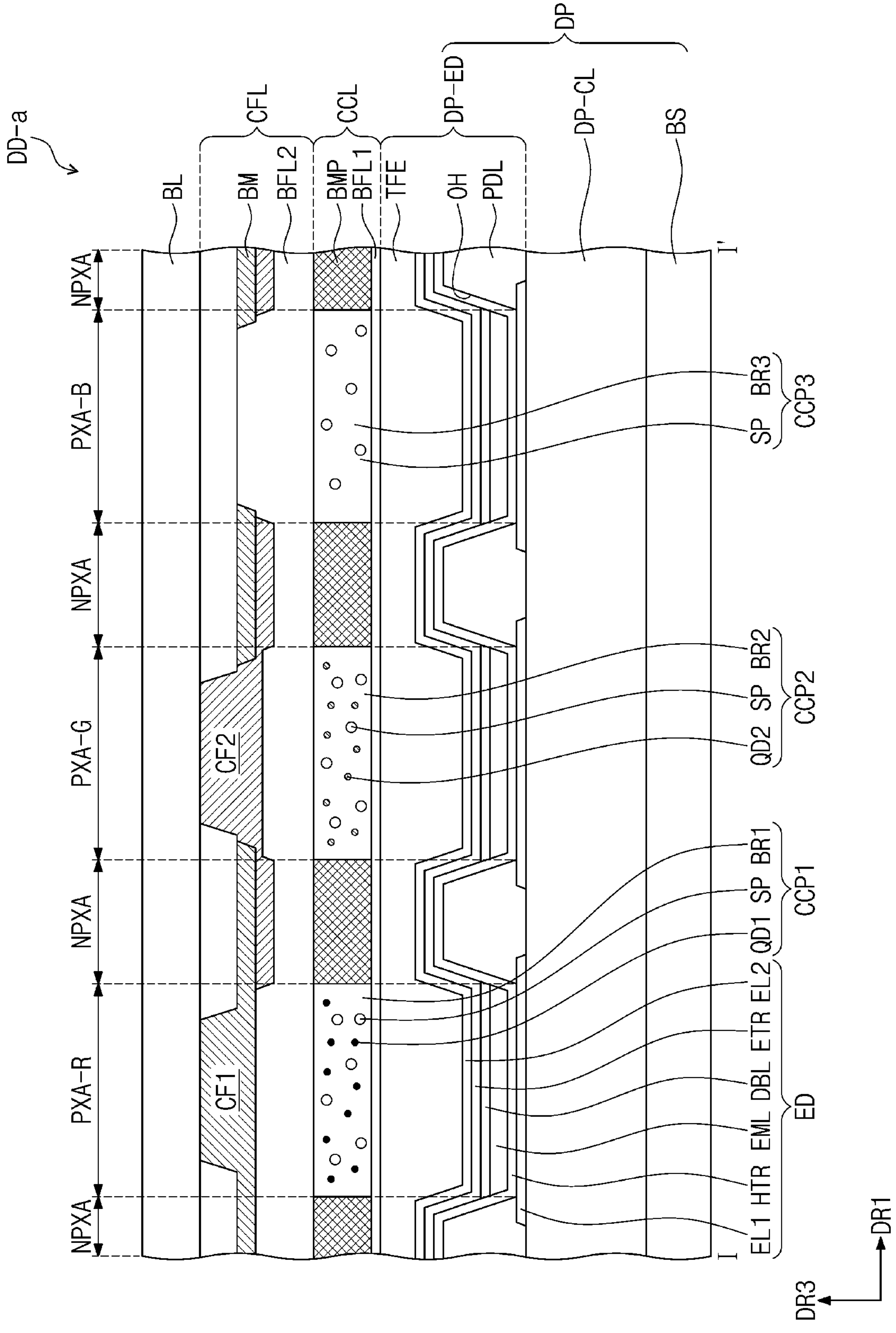
FIG. 7 is a schematic cross-sectional view showing a display apparatus according to an embodiment.

Referring to FIG. 7, a display apparatus DD-a according to an embodiment may include a display panel DP including a display device layer DP-ED, a light controlling layer CCL disposed on the display panel DP, and a color filter layer CFL.

In an embodiment shown in FIG. 7, the display panel DP includes a base layer BS, a circuit layer DP-CL provided on the base layer BS, and a display device layer DP-ED, and the display device layer DP-ED may include a light emitting element ED.

The light emitting element ED may include a first electrode EL1, a hole transport region HTR disposed on the first electrode EL1, an emission layer EML disposed on the hole transport region HTR, a double buffer layer DBL disposed on the emission layer EIL, an electron transport region ETR disposed on the double buffer layer DBL, and a second electrode EL2 disposed on the electron transport region ETR. A structure of the light emitting element ED shown in FIG. 7 may be the same as a structure of a light emitting element according to FIG. 3 to FIG. 6.

Referring to FIG. 7, the emission layer EIL may be disposed in an opening OH defined in a pixel definition layer PDL. For example, the emission layer EIL which is divided by the pixel definition layer PDL and correspondingly provided to each of the luminous areas PXA-R, PXA-G, and PXA-B may emit light in a same wavelength region. In the display apparatus DD-a of an embodiment, the emission layer EIL may emit blue light. Although not shown in the drawings, in an embodiment, the emission layer EIL may be provided as a common layer for all luminous areas PXA-R, PXA-G, and PXA-B.

The light controlling layer CCL may be disposed on the display panel DP. The light controlling layer CCL may include a light converter. The light converter may be a quantum dot or a phosphor. The light converter may transform the wavelength of a provided light and emit the resulting light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 7, the partition pattern BMP is shown so that it does not overlap the light controlling parts CCP1, CCP2, and CCP3, but at least a portion of the edges of the light controlling parts CCP1, CCP2, and CCP3 may overlap the partition pattern BMP.

The light controlling layer CCL may include a first light controlling part CCP1 including a first quantum dot QD1 converting first color light provided from the light emitting element ED into second color light, a second light controlling part CCP2 including a second quantum dot QD2 converting first color light provided from the light emitting element ED into third color light, and a third light controlling part CCP3 transmitting first color light provided from the light emitting element ED.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the light emitting element ED. For example, the first quantum dot QD1 may be a red quantum dot, and the second quantum dot QD2 may be a green quantum dot. The same explanation as provided above with respect to quantum dots may be applied to the quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, or hollow silica. The scatterer SP may include at least one of $TiO_2$, ZnO, $Al_2O_3$, $SiO_2$, or hollow silica, or may be a mixture of two or more materials selected from $TiO_2$, ZnO, $Al_2O_3$, $SiO_2$, and hollow silica.

The first light controlling part CCP1, the second light controlling part CCP2, and the third light controlling part CCP3 may each include base resins BR1, BR2, and BR3 for dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 may each be a medium in which the quantum dots QD1 and QD2 and the scatterer SP are dispersed, and may be composed of various resin compositions which may be generally referred to as a binder. For example, the base resins BR1, BR2, and BR3 may each independently be acrylic resins, urethane-based resins, silicone-based resins, epoxy-based resins, etc. The base resins BR1, BR2, and BR3 may each be transparent resins. In an embodiment, the first base resin BR1, the second base resin BR2, and the third base resin BR3 may be the same as or different from each other.

The light controlling layer CCL may include a barrier layer BFL1. The barrier layer BFL1 may block the penetration of moisture and/or oxygen (hereinafter, will be referred to as "humidity/oxygen"). The barrier layer BFL1 may be disposed on the light controlling parts CCP1, CCP2, and CCP3 to block the exposure of the light controlling parts CCP1, CCP2, and CCP3 to humidity/oxygen. The barrier layer BFL1 may cover the light controlling parts CCP1, CCP2, and CCP3. A barrier layer BFL2 may be provided between the light controlling parts CCP1, CCP2, and CCP3 and a color filter layer CFL.

The barrier layers BFL1 and BFL2 may include at least one inorganic layer. For example, the barrier layers BFL1 and BFL2 may each include an inorganic material. For example, the barrier layers BFL1 and BFL2 may each independently include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film securing light transmittance. The barrier layers BFL1 and BFL2 may each further include an organic layer. The barrier layers BFL1 and BFL2 may be composed of a single layer or of multiple layers.

In the display apparatus DD-a of an embodiment, the color filter layer CFL may be disposed on the light controlling layer CCL. In an embodiment, the color filter layer CFL may be disposed directly on the light controlling layer CCL. For example, the barrier layer BFL2 may be omitted.

The color filter layer CFL may include a light blocking part BM and filters CF1, CF2, and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a polymer photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and may not include a pigment or dye. The third filter CF3 may be transparent. The third filter CF3 may be formed of a transparent photosensitive resin.

In an embodiment, the first filter CF1 and the second filter CF2 may each be yellow filters. The first filter CF1 and the second filter CF2 may be provided as one body without distinction. Each of the first to third filters CF1, CF2, and CF3 may be disposed corresponding to the red luminous area PXA-R, the green luminous area PXA-G, and the blue luminous area PXA-B, respectively.

The color filter layer CFL may include a light blocking part BM. The color filter layer CFL may include the light blocking part BM disposed so as to overlap the boundaries between the neighboring filters CF1, CF2, and CF3. The light blocking part BM may be a black matrix. The light blocking part BM may include an organic light blocking material or an inorganic light blocking material, each including a black pigment or a black dye. The light blocking part BM may distinguish the boundaries between adjacent filters CF1, CF2, and CF3. In an embodiment, the light blocking part BM may be formed of a blue filter.

A base substrate BL may be disposed on the color filter layer CFL. The base substrate BL may provide a base surface on which the color filter layer CFL, the light controlling layer CCL, etc. are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

Figure 8:
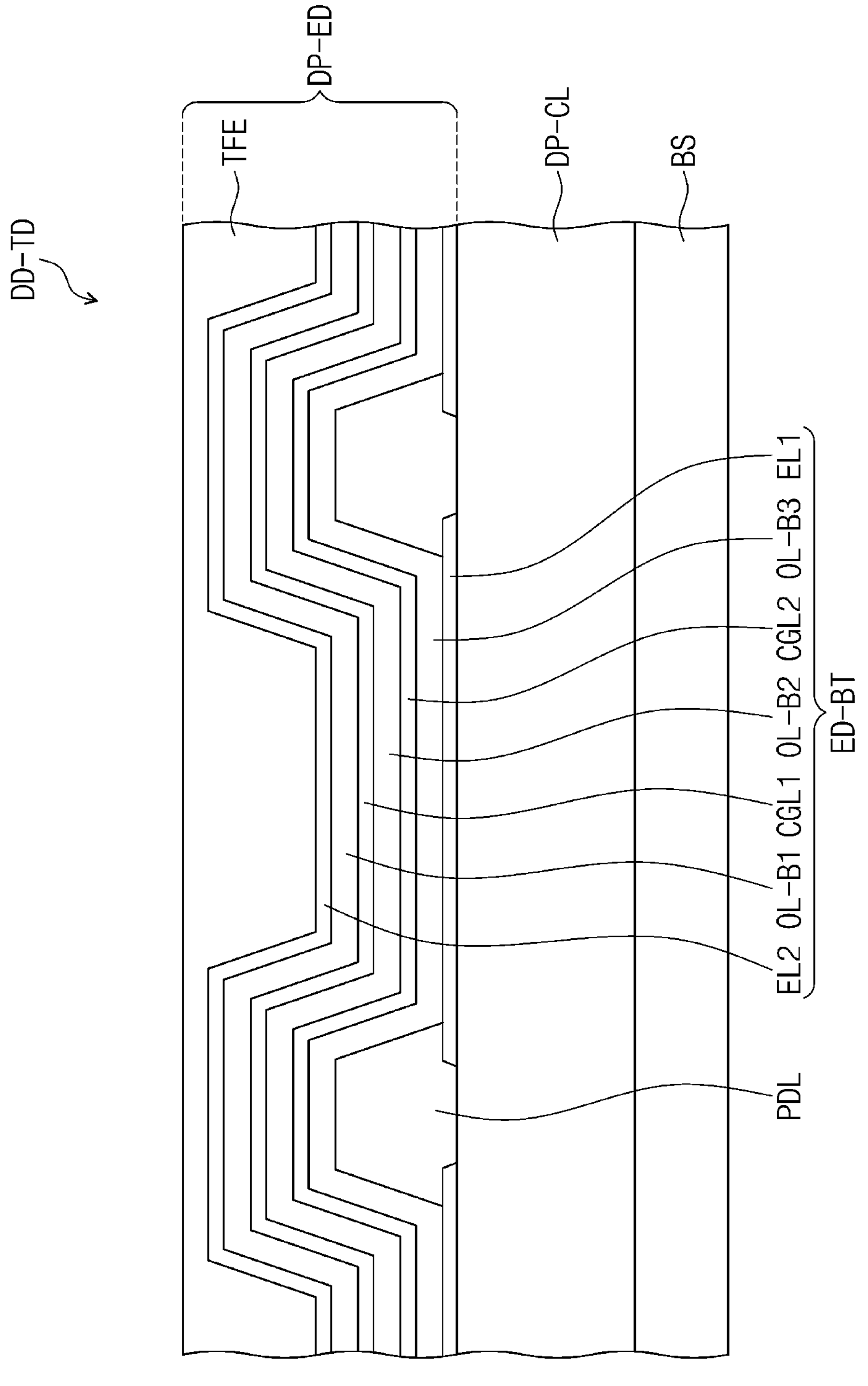
FIG. 8 is a schematic cross-sectional view showing a display apparatus according to an embodiment.

FIG. 8 is a schematic cross-sectional view showing a portion of the display apparatus according to an embodiment. In FIG. 8, a schematic cross-sectional view of a portion corresponding to the display panel DP in FIG. 7 is shown. In a display apparatus DD-TD of an embodiment, the light emitting element ED-BT may include light emitting structures OL-B1, OL-B2, and OL-B3. The light emitting element ED-BT may include a first electrode EL1, an oppositely disposed second electrode EL2, and the light emitting structures OL-B1, OL-B2, and OL-B3 stacked in a thickness direction and provided between the first electrode EL1 and the second electrode EL2. Each of the light emitting structures OL-B1, OL-B2, and OL-B3 may include an emission layer EML, a hole transport region HTR and an electron transport region ETR disposed with the emission layer EML therebetween, and a double buffer layer DBL disposed between the emission layer EML and the electron transport region ETR, as described in FIG. 7.

For example, the light emitting element ED-BT included in the display apparatus DD-TD of an embodiment may be a light emitting element having a tandem structure including multiple emission layers.

In an embodiment shown in FIG. 8, light emitted from each of the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the light emitting element ED-BT including the light emitting structures OL-B1, OL-B2, and OL-B3 emitting light in different wavelength regions may emit white light.

Charge generating layers CGL1 and CGL2 may be disposed between neighboring light emitting structures OL-B1, OL-B2, and OL-B3. The charge generating layers CGL1 and CGL2 may each independently include a p-type charge generating layer and/or an n-type charge generating layer.

Figure 9:
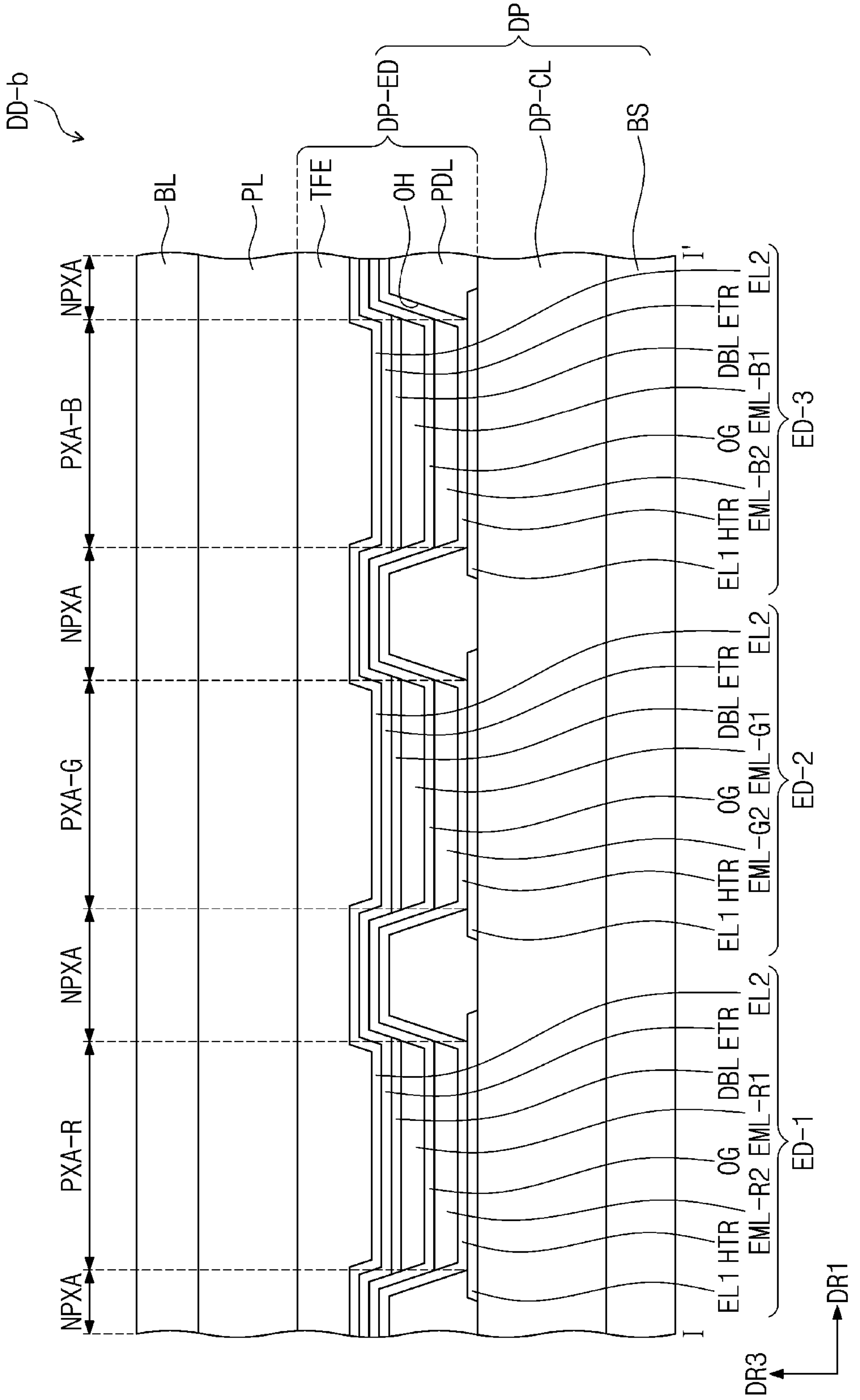
FIG. 9 is a schematic cross-sectional view showing a display apparatus according to an embodiment.

Referring to FIG. 9, a display apparatus DD-b according to an embodiment may include light emitting elements ED-1, ED-2, and ED-3, formed by stacking two emission layers. In comparison to the display apparatus DD of an embodiment shown in FIG. 2, an embodiment shown in FIG.

10 is different in that the first to third light emitting elements ED-1, ED-2, and ED-3 each include two emission layers stacked in a thickness direction. In the first to third light emitting elements ED-1, ED-2, and ED-3, two emission layers may emit light in a same wavelength region.

The first light emitting element ED-1 may include a first red emission layer EML-R1 and a second red emission layer EML-R2. The second light emitting element ED-2 may include a first green emission layer EML-G1 and a second green emission layer EML-G2. The third light emitting element ED-3 may include a first blue emission layer EML-B1 and a second blue emission layer EML-B2. An emission auxiliary part OG may be disposed between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may be a single layer or a multilayer. The emission auxiliary part OG may include a charge generating layer. For example, the emission auxiliary part OG may include an electron transport region, a charge generating layer, and a hole transport region stacked in that order. The emission auxiliary part OG may be provided as a common layer for all of the first to third light emitting elements ED-1, ED-2, and ED-3. However, embodiments are not limited thereto, and the emission auxiliary part OG may be patterned and provided in an opening OH defined in a pixel definition layer PDL.

The second red emission layer EML-R2, the second green emission layer EML-G2 and the second blue emission layer EML-B2 may be disposed between the hole transport region HTR and the emission auxiliary part OG. The first red emission layer EML-R1, the first green emission layer EML-G1 and the first blue emission layer EML-B1 may be disposed between the emission auxiliary part OG and the double buffer layer DBL. The electron transport region ETR may be disposed on the double buffer layer DBL.

For example, the first light emitting element ED-1 may include a first electrode EL1, a hole transport region HTR, a second red emission layer EML-R2, an emission auxiliary part OG, a first red emission layer EML-R1, a double buffer layer DBL, an electron transport region ETR, and a second electrode EL2, stacked in that order. The second light emitting element ED-2 may include a first electrode EL1, a hole transport region HTR, a second green emission layer EML-G2, an emission auxiliary part OG, a first green emission layer EML-G1, a double buffer layer DBL, an electron transport region ETR, and a second electrode EL2, stacked in that order. The third light emitting element ED-3 may include a first electrode EL1, a hole transport region HTR, a second blue emission layer EML-B2, an emission auxiliary part OG, a first blue emission layer EML-B1, a double buffer layer DBL, an electron transport region ETR, and a second electrode, EL2 stacked in that order.

An optical auxiliary layer PL may be disposed on a display device layer DP-ED. The optical auxiliary layer PL may include a polarization layer. The optical auxiliary layer PL may be disposed on a display panel DP and may control light reflected at the display panel DP from an external light. Although not shown in the drawings, in an embodiment, the optical auxiliary layer PL may be omitted from the display apparatus DD-b.

Figure 10:
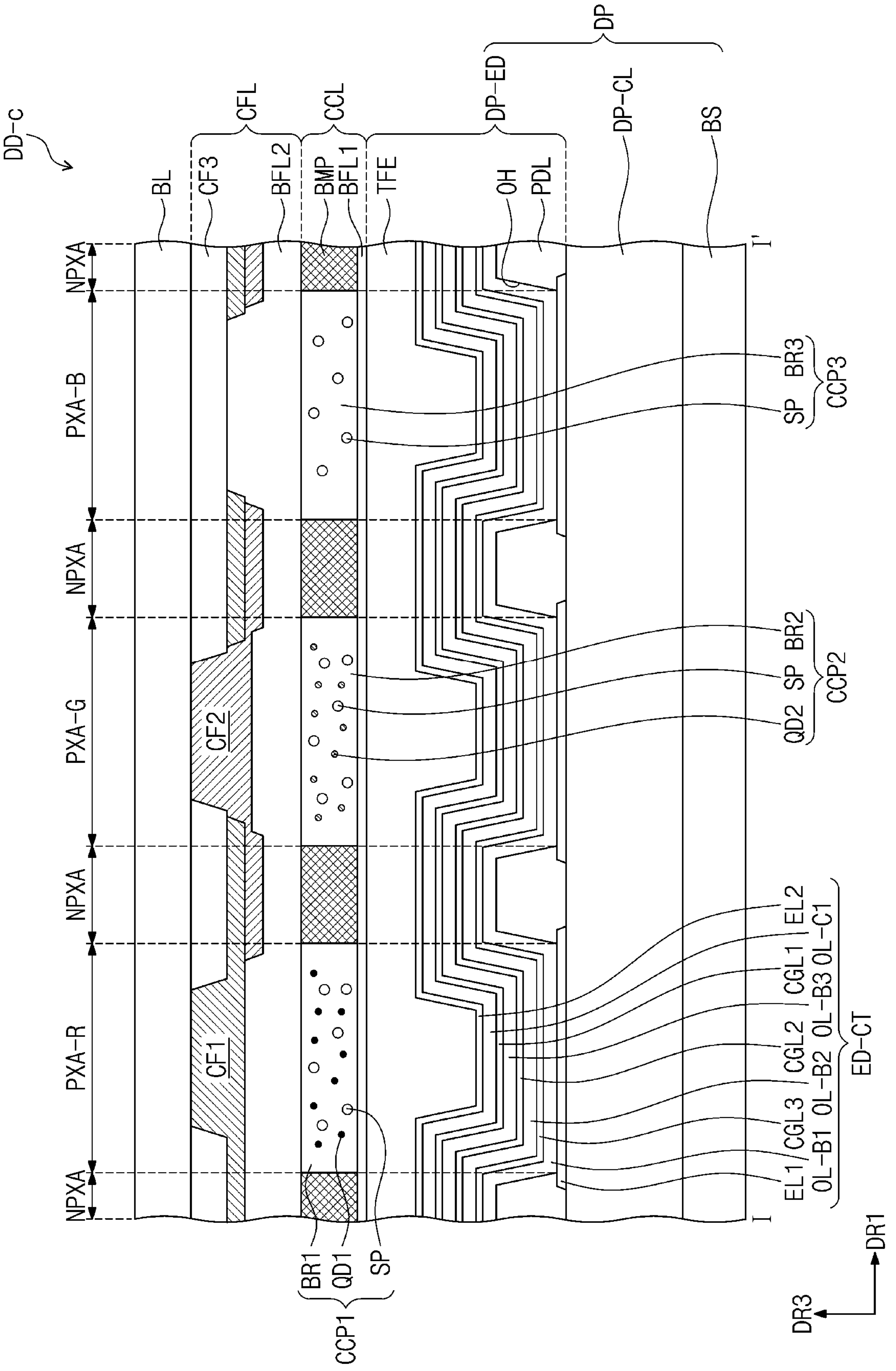
FIG. 10 is a schematic cross-sectional view showing a display apparatus according to an embodiment.

In comparison to FIG. 8 and FIG. 9, FIG. 10 shows a display apparatus DD-c that is different at least in that it includes four light emitting structures OL-B1, OL-B2, OL-B3, and OL-C1. A light emitting element ED-CT may include a first electrode EL1, an oppositely disposed second electrode EL2, and first to fourth light emitting structures OL-B1, OL-B2, OL-B3, and OL-C1 stacked in a thickness direction between the first electrode EL1 and the second electrode EL2. Charge generating layers CGL1, CGL2 and CGL3 may be disposed between the first to fourth light emitting structures OL-B1, OL-B2, OL-B3, and OL-C1. Among the four light emitting structures, the first to third light emitting structures OL-B1, OL-B2, and OL-B3 may each emit blue light, and the fourth light emitting structure OL-C1 may emit green light. However, embodiments are not limited thereto, and the first to fourth light emitting structures OL-B1, OL-B2, OL-B3, and OL-C1 may each emit different wavelengths of light.

Charge generating layers CGL1, CGL2, and CGL3 may be disposed between neighboring light emitting structures OL-B1, OL-B2, OL-B3, and OL-C1. Charge generating layers CGL1, CGL2, and CGL3 may each independently include a p-type charge generating layer and/or an n-type charge generating layer.

The light emitting element ED according to an embodiment includes a double buffer layer DBL disposed between an emission layer EIL and an electron transport region ETR, and includes the above-described first compound and second compound in the double buffer layer DBL, and accordingly, may show improved charge balance in the emission layer EIL, improved emission efficiency, and increased element life.

The light emitting element ED of an embodiment may include the above-described third compound, fourth compound, and fifth compound in an emission layer EIL to include a hole transport host, an electron transport host, and an organometallic complex as a dopant, and may show high efficiency and long-life characteristics.

Hereinafter, the light emitting element according to an embodiment will be explained with reference to the Examples and the Comparative Examples. The Examples below are only provided as illustrations for understanding the disclosure, and the scope thereof is not limited thereto.

EXAMPLES

1. Manufacture and Evaluation of Light Emitting Element 1
(Manufacture of Light Emitting Element 1)

A light emitting element of an embodiment, including a double buffer layer of an embodiment was manufactured by a method below.

An ITO glass substrate was cut into a size of 50 mm×50 mm×0.5 mm, washed by ultrasonic waves using isopropyl alcohol and pure water for about 10 minutes each, and cleaned by exposing to ultraviolet rays for about 10 minutes and exposing to ozone, and the glass substrate was installed in a vacuum deposition apparatus.

On the ITO glass substrate, a material of the related art, m-MTDATA, was vacuum deposited to a thickness of about 40 Å to form a hole injection layer, and a hole transport material of NPB was vacuum deposited to a thickness of about 10 Å to form a hole transport layer.

On the hole transport layer, a mixture of a third compound and a fourth compound in a weight ratio of about 7:3, and a fifth compound were co-deposited in a weight ratio of about 87:13 to form an emission layer with a thickness of about 400 Å.

On the emission layer, a first compound was deposited, and a second compound was deposited thereon to form a double buffer layer with a thickness of about 50 Å.

ETL1 was deposited to a thickness of about 300 Å as an electron transport layer, and Mg was vacuum deposited to a thickness of about 800 Å to form a Mg electrode (negative electrode) and to manufacture a light emitting element.

Each of the above-described first compound, second compound, and third compound was Compound E1 or Compound E30, the above-described fourth compound was Compound H3 or Compound H8, and the above-described fifth compound was Compound BD3.

The light emitting elements of the Comparative Examples were manufactured into a structure in which a double buffer layer was a single layer including at least one among the first compound and the second compound or into a structure excluding a double buffer layer. Other processes were the same as those for manufacturing the light emitting elements of the Examples.

The compounds used for the manufacture of the elements are as follows.

(Example Compounds)

E1

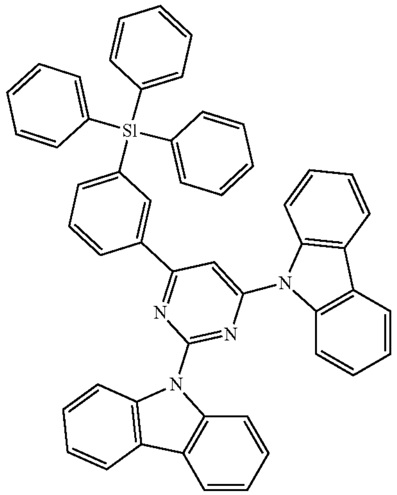

E30

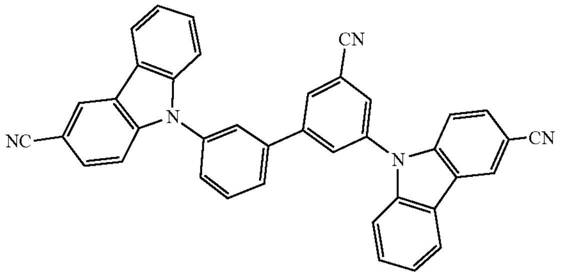

-continued

H3

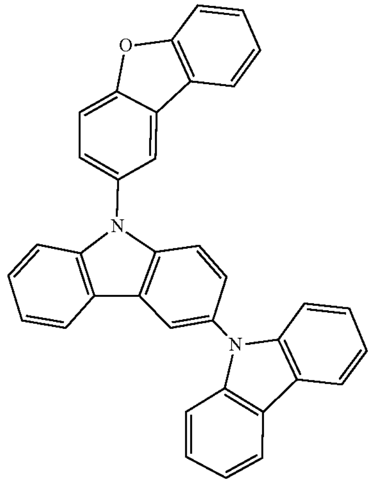

H8

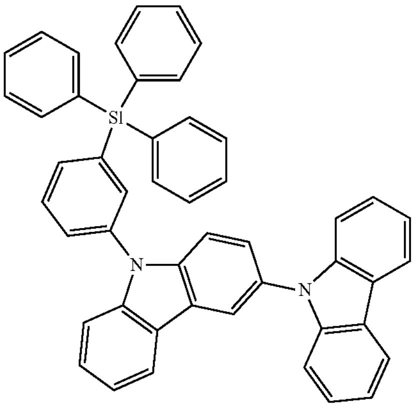

BD3

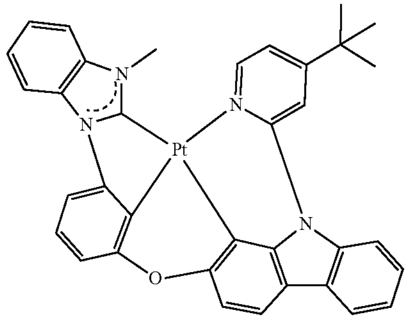

(Other Compounds Used for the Manufacture of Elements)

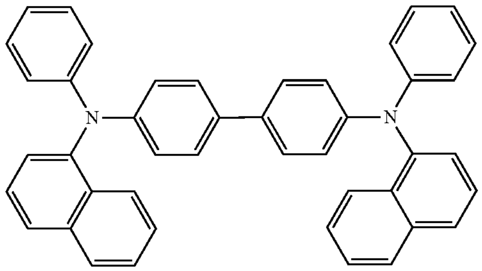

NPB

ETL1

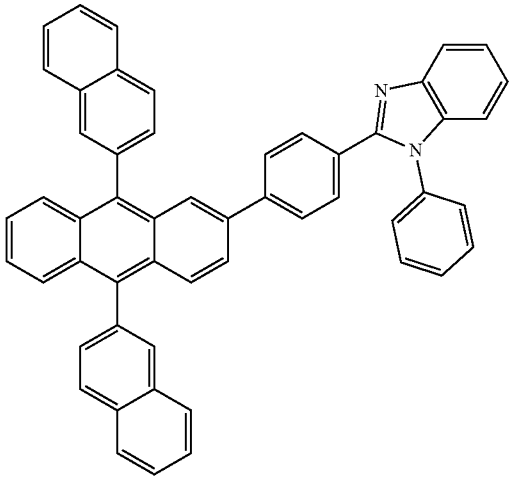

-continued

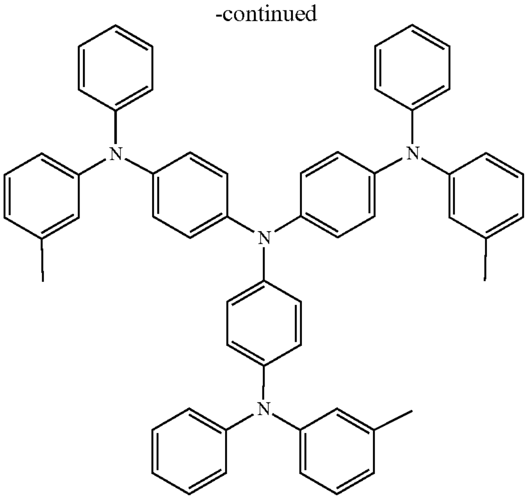

m-MTDATA (Evaluation of Properties of Light Emitting Element 1)

In Table 1, the evaluation results of the light emitting elements of Example 1 to Example 4, and Comparative Example 1 to Comparative Example 12 are shown.

In Table 1, the materials of an emission layer, the materials of a double buffer layer, the driving voltages, the relative conversion efficiency, and the relative life of the light emitting elements thus manufactured were compared and shown.

In Table 1 to Table 3, the driving voltage was measured using a source meter (Keithley Instrument Co., 2400 series), and the relative conversion efficiency was measured using an external quantum efficiency measurement apparatus, C9920-12 of Hamamatsu Photonics Co. The relative life (T95) was measured based on a time where the brightness of a pixel was deteriorated to about 5% from the initial brightness using a life measurement apparatus (Mcscience Co., M6000 Plus). The relative conversion efficiency and the relative life were evaluated as relative values on the basis of 100% of those of Example 3.

TABLE 1

| | Emission layer | | Double buffer layer | | Driving | Relative conversion | Relative |
|---|---|---|---|---|---|---|---|
| Division | Fourth compound | Third compound | First compound | Second compound | voltage (V) | efficiency (Cd/A/y) | life (T95) |
| Example 1 | H3 | E1 | E1 | E30 | 4.1 | 95.6 | 84.3 |
| Comparative Example 1 | | | E1 | — | 4.2 | 80.1 | 75.4 |
| Comparative Example 2 | | | — | E30 | 4.2 | 72.4 | 73.2 |
| Comparative Example 3 | | | — | — | 4.4 | 64.8 | 69.7 |
| Example 2 | | E30 | E30 | E1 | 3.9 | 82.6 | 53.7 |
| Comparative Example 4 | | | — | E1 | 4.2 | 74.9 | 49.8 |
| Comparative Example 5 | | | E30 | — | 4.2 | 74.9 | 48.2 |
| Comparative Example 6 | | | — | — | 4.4 | 60.1 | 45.3 |
| Example 3 | H8 | E1 | E1 | E30 | 3.9 | 100 | 100 |
| Comparative Example 7 | | | E1 | — | 4.1 | 91.5 | 90.3 |
| Comparative Example 8 | | | — | E30 | 4.2 | 89.6 | 89.7 |
| Comparative Example 9 | | | — | — | 4.5 | 70.1 | 60.4 |
| Example 4 | | E30 | E1 | E30 | 3.8 | 74.7 | 80.1 |

TABLE 1-continued

| Division | Emission layer Fourth compound | Emission layer Third compound | Double buffer layer First compound | Double buffer layer Second compound | Driving voltage (V) | Relative conversion efficiency (Cd/A/y) | Relative life (T95) |
|---|---|---|---|---|---|---|---|
| Comparative Example 10 | | | — | E1 | 4.0 | 60.2 | 55.4 |
| Comparative Example 11 | | | E30 | — | 4.1 | 60.1 | 53.4 |
| Comparative Example 12 | | | — | — | 4.4 | 52.6 | 40.9 |

Referring to the results of Table 1, Example 1 showed a low driving voltage, high relative conversion efficiency and high relative life when compared to Comparative Example 1 to Comparative Example 3. Example 2 showed a low driving voltage, high relative conversion efficiency and high relative life when compared to Comparative Example 4 to Comparative Example 6. Example 3 showed a low driving voltage, high relative conversion efficiency and high relative life when compared to Comparative Example 7 to Comparative Example 9. Example 4 showed a low driving voltage, high relative conversion efficiency and high relative life when compared to Comparative Example 10 to Comparative Example 12. The light emitting element according to embodiments includes a double buffer layer disposed between an emission layer and an electron transport region, and the double buffer layer includes a first layer including a first compound and a second layer including a second compound which is different from the first compound, thereby showing excellent light emitting element properties.

In Table 2, the evaluation results on the light emitting elements of Example 5 to Example 16 are shown. In the light emitting elements of Table 2, the weight ratio of the first compound and the second compound was controlled during manufacturing the double buffer layer.

In Table 2, the materials of an emission layer, the materials of a double buffer layer, the driving voltages, the relative conversion efficiency, and the relative life of the light emitting elements thus manufactured are compared and shown.

TABLE 2

| Division | Emission layer Fourth compound | Emission layer Third compound | Double buffer layer First compound | Double buffer layer Second compound | Double buffer layer Weight ratio of (first compound: second compound) | Driving voltage (V) | Relative conversion efficiency (Cd/A/y) | Relative life (T95) |
|---|---|---|---|---|---|---|---|---|
| Example 5 | H3 | E1 | E1 | E30 | 7:3 | 4.1 | 95.6 | 84.3 |
| Example 6 | | | | | 5:5 | 4.2 | 94.5 | 83.3 |
| Example 7 | | | | | 3:7 | 4.2 | 94.2 | 84.0 |
| Example 8 | | E30 | E30 | E1 | 3:7 | 3.9 | 82.6 | 53.7 |
| Example 9 | | | | | 5:5 | 4.1 | 82.2 | 53.1 |
| Example 10 | | | | | 7:3 | 4.2 | 81.9 | 53.2 |
| Example 11 | H8 | E1 | E1 | E30 | 7:3 | 3.9 | 100 | 100 |
| Example 12 | | | | | 5:5 | 4.0 | 99.8 | 99.1 |
| Example 13 | | | | | 3:7 | 4.0 | 99.2 | 99.3 |
| Example 14 | | E30 | E30 | E1 | 3:7 | 3.8 | 74.7 | 80.1 |
| Example 15 | | | | | 5:5 | 3.8 | 74.5 | 79.5 |
| Example 16 | | | | | 7:3 | 3.9 | 74.6 | 79.8 |

Referring to the results of Table 2, Example 5 to Example 16 include a double buffer layer disposed between an emission layer and an electron transport region, and the double buffer layer includes a first compound and a second compound, different from each other, thereby show a low driving voltage, high relative conversion efficiency and high relative life. In the double buffer layer, the deposition ratio of the first compound to the second compound may be set to various proportions, including 7:3, 5:5, 3:7, or the like.

2. Manufacture and Evaluation of Light Emitting Element 2

(Manufacture of Light Emitting Element 2)

A light emitting element of an embodiment, including a double buffer layer of an embodiment was manufactured by a method below.

An ITO glass substrate was cut into a size of 50 mm×50 mm×0.5 mm, washed by ultrasonic waves using isopropyl alcohol and pure water for about 10 minutes each, and cleaned by exposing to ultraviolet rays for about 10 minutes and exposing to ozone, and the glass substrate was installed in a vacuum deposition apparatus.

On the ITO glass substrate, a material of the related art, m-MTDATA, was vacuum deposited to a thickness of about 40 Å to form a hole injection layer, and a hole transport material of NPB was vacuum deposited to a thickness of about 10 Å to form a hole transport layer.

On the hole transport layer, a mixture of a third compound and a fourth compound in a weight ratio of about 7:3, and a fifth compound were co-deposited in a weight ratio of about 87:13 to form an emission layer with a thickness of about 400 Å.

On the emission layer, a first compound was deposited, and a second compound was deposited thereon to form a double buffer layer with a thickness of about 50 Å. The first compound and the second compound were deposited in a weight ratio of 7:3.

ETL1 was deposited to a thickness of about 300 Å as an electron transport layer, and Mg was vacuum deposited to a thickness of about 800 Å to form a Mg electrode (negative electrode) to manufacture a light emitting element.

Each of the above-described first compound, second compound, and third compound was Compound E1, Compound E30, and Compound E1, the above-described fourth compound was Compound H8, and the above-described fifth compound was Compound BD3.

For the manufacture of the light emitting elements of the Comparative Examples, Compound E1 was used as the first compound, and the Comparative Compound was deposited as the second compound to manufacture a double buffer layer into a thickness of about 50 Å. Other processes were the same as those for manufacturing the light emitting elements of the Examples.

The compounds used for the manufacture of the elements are as follows.

(Example Compounds)

E1

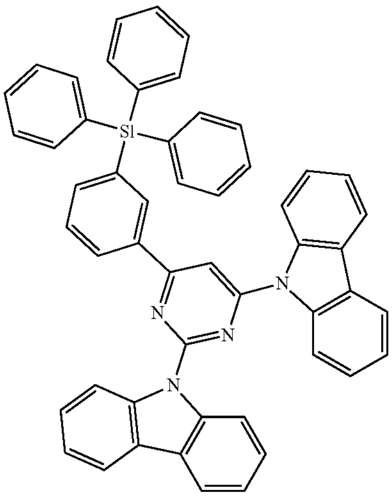

E30

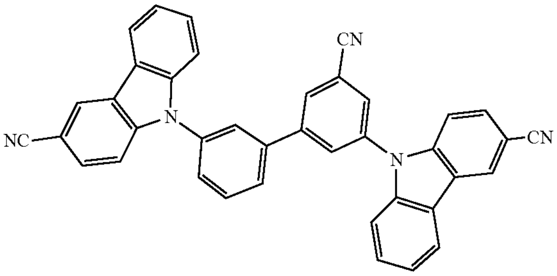

-continued

H8

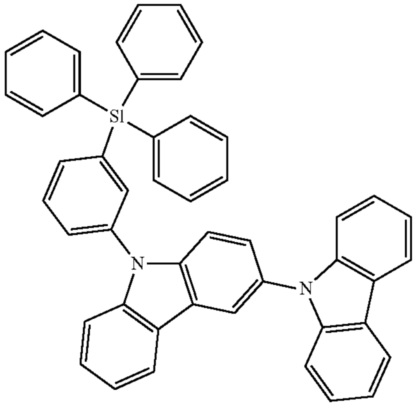

BD3

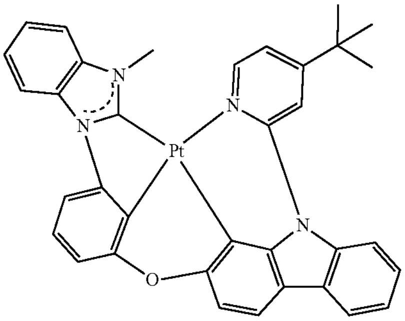

(Other Compounds Used for the Manufacture of Elements)

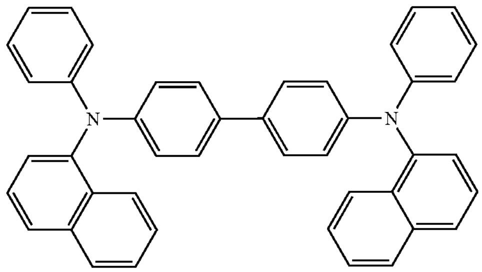

NPB

ETL1

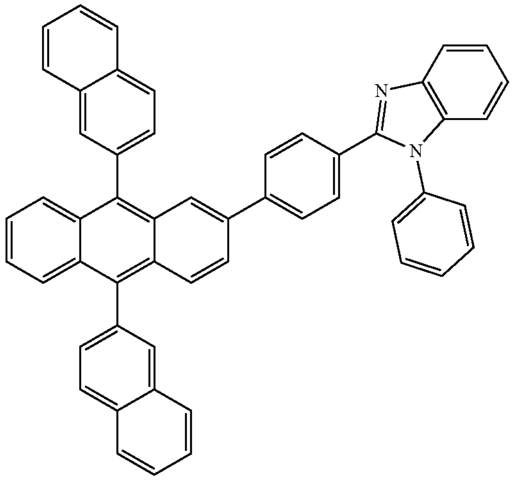

-continued

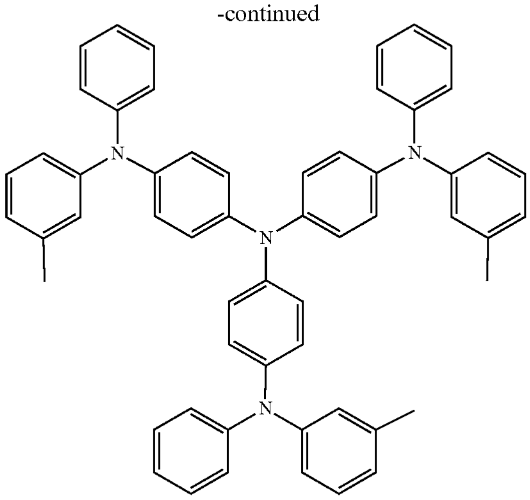

m-MTDATA (Comparative Compounds)

BF1

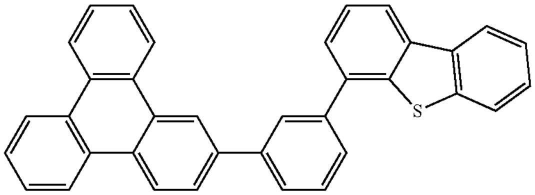

BF2

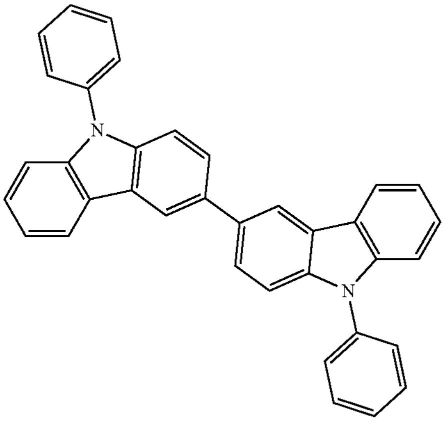

-continued

BF3

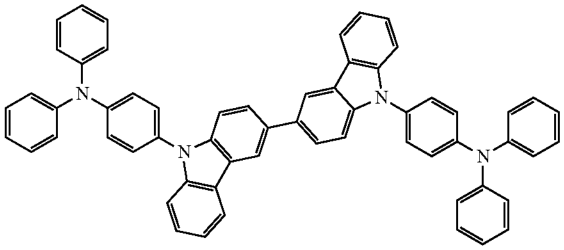

BF4

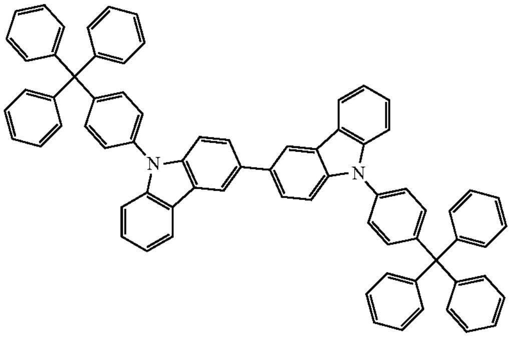

BF5

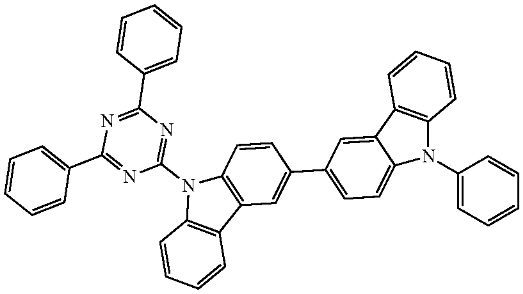

In Table 3, the evaluation results on the light emitting elements of Example 17 and Comparative Example 13 to Comparative Example 17 are shown.

In Table 3, the materials of an emission layer, the materials of a double buffer layer, the driving voltages, the relative conversion efficiency, and the relative life of the light emitting elements thus manufactured are compared and shown.

TABLE 3

| Division | Emission layer Fourth compound | Emission layer Third compound | Double buffer layer First compound | Double buffer layer Second compound | Driving voltage (V) | Relative conversion efficiency (Cd/A/y) | Relative life (T95) |
|---|---|---|---|---|---|---|---|
| Example 17 | H8 | E1 | E1 | E30 | 3.9 | 100 | 100 |
| Comparative Example 13 | | | | BF1 | 4.3 | 40.2 | 30.1 |
| Comparative Example 14 | | | | BF2 | 4.5 | 86.3 | 65.2 |
| Comparative Example 15 | | | | BF3 | 4.3 | 70.5 | 10.1 |
| Comparative Example 16 | | | | BF4 | 4.8 | 60.8 | 8.7 |
| Comparative Example 17 | | | | BF5 | 5.0 | 89.1 | 50.2 |

Referring to the results of Table 3, it could be found that the light emitting element of Example 17 showed a low driving voltage, high relative conversion efficiency and improved relative life when compared to Comparative Example 13 to Comparative Example 17. Referring to Table 3, the light emitting element of Example 17 includes a first compound and a second compound, represented by Formula 1 or 2, thereby showing improved charge balance of an emission layer.

The light emitting elements of Comparative Example 12 to Comparative 17 include a double buffer layer including two different compounds, but include Comparative Compound BF1 to Comparative Compound BF5, which were not represented by Formula 1 or 2, and accordingly, it is thought that the light emitting element properties were deteriorated when compared to the light emitting element of Example 17.

The light emitting element according to an embodiment includes a double buffer layer disposed between an emission layer and an electron transport region, and has a double layer structure in which the double buffer layer includes different electron transport hosts each, thereby improving the electron balance of the emission layer. Accordingly, the light emitting element of an embodiment may show high efficiency and long-life characteristics.

The light emitting element of an embodiment includes a hole transport host, an electron transport host, and an organometallic complex as a dopant in an emission layer and may show high efficiency and long-life characteristics.

The light emitting element of an embodiment includes a double buffer layer and may show high efficiency and long-life characteristics.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting element, comprising:

a first electrode;

a second electrode disposed on the first electrode;

an emission layer disposed between the first electrode and the second electrode; and a double buffer layer comprising:

a first layer disposed on the emission layer; and a second layer disposed on the first layer, wherein the first layer comprises a first compound, the second layer comprises a second compound which is different from the first compound, and the first compound and the second compound each independently comprises a pyrimidine group or a carbazole group substituted with at least one cyano group.

2. The light emitting element of claim 1, wherein the first compound and the second compound are each independently represented by Formula 1 or Formula 2:

[Formula 1]

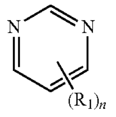

wherein in Formula 1, $R_1$ is a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, and n is an integer from 0 to 4,

[Formula 2]

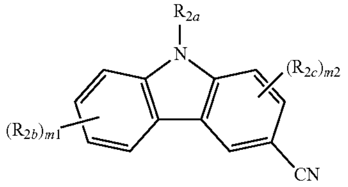

wherein in Formula 2, $R_{2a}$, $R_{2b}$, and $R_{2c}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, m1 is an integer from 0 to 4, and m2 is an integer from 0 to 3.

3. The light emitting element of claim 2, wherein the emission layer comprises:

a third compound represented by Formula 1 or Formula 2;

a fourth compound represented by Formula 3; and a fifth compound represented by Formula 4, and the third compound is different from at least one of the first compound and the second compound:

[Formula 3]

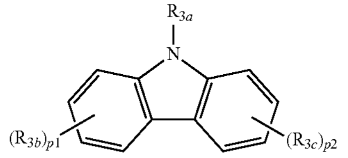

wherein in Formula 3, $R_{3a}$, $R_{3b}$, and $R_{3c}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and p1 and p2 are each independently an integer from 0 to 4,

[Formula 4]

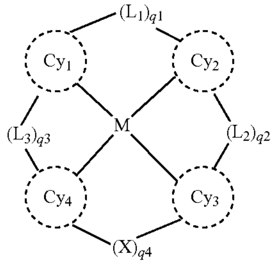

wherein in Formula 4,

M is Pt, Pd, Cu, Au, or Os,

X is O or $C(R_{4a})(R_{4b})$, $Cy_1$, $Cy_2$, $Cy_3$, and $Cy_4$ are each independently a substituted or unsubstituted hydrocarbon ring of 5 to 60 ring-forming carbon atoms, or a substituted or unsubstituted heterocycle of 1 to 60 ring-forming carbon atoms, $L_1$ to $L_3$ are each independently a direct linkage,

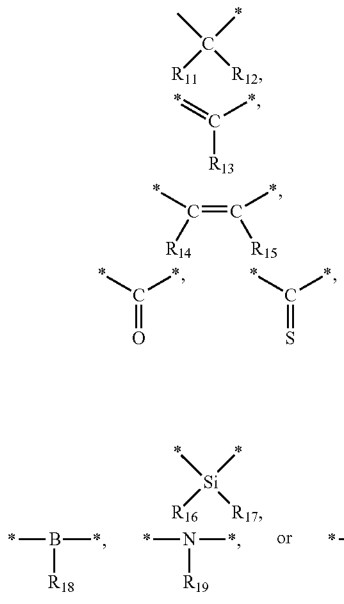

or

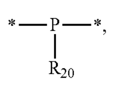

q1 to q4 are each independently 0 or 1, and $R_{4a}$, $R_{4b}$, and $R_{11}$ to $R_{20}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

4. The light emitting element of claim 3, wherein at least one of the first compound, the second compound, and the third compound is represented by Formula 1, and the at least one of the first compound, the second compound, and the third compound that is represented by Formula 1 is represented by Formula 1-1:

[Formula 1-1]

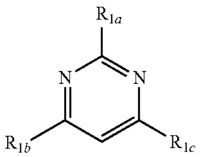

wherein in Formula 1-1, $R_{1a}$, $R_{1b}$, and $R_{1c}$ are each independently a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

5. The light emitting element of claim 3, wherein at least one of the first compound, the second compound, and the third compound is represented by Formula 2, and the at least one of the first compound, the second compound, and the third compound that is represented by Formula 2 is represented by one of Formula 2-1, Formula 2-2, or Formula 2-3:

[Formula 2-1]

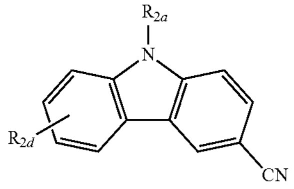

[Formula 2-2]

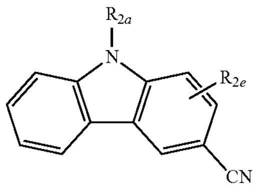

[Formula 2-3]

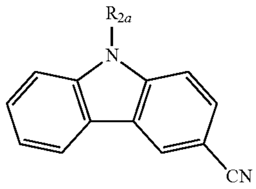

wherein in Formula 2-1 to Formula 2-3, $R_{2d}$ and $R_{2e}$ are each independently a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and $R_{2a}$ is the same as defined in Formula 2.

6. The light emitting element of claim 3, wherein the fourth compound represented by Formula 3 is represented by Formula 3-1:

[Formula 3-1]

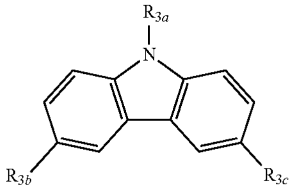

wherein in Formula 3-1, $R_{3a}$, $R_{3b}$, and $R_{3c}$ are the same as defined in Formula 3.

7. The light emitting element of claim 3, wherein in Formula 4, M is Pt.

8. The light emitting element of claim 3, wherein the first compound, the second compound, and the third compound each independently comprises at least one selected from Compound Group 1:

[Compound Group 1]

E1

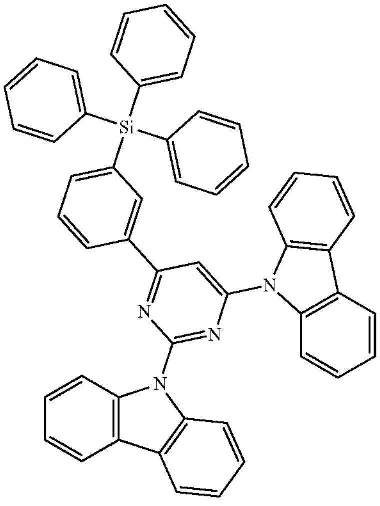

-continued

E2

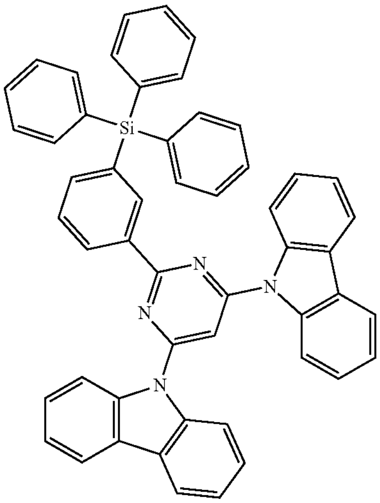

E3

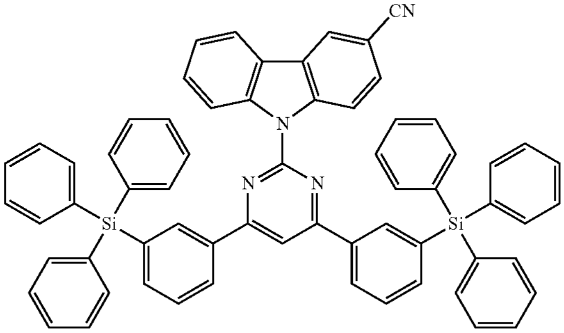

E4

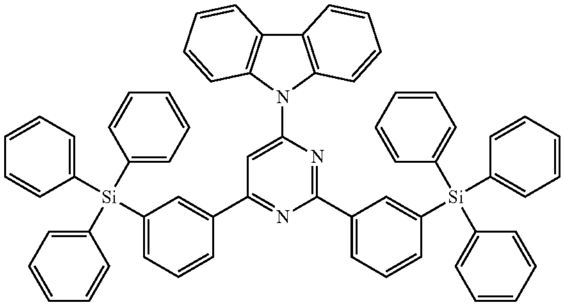

E5

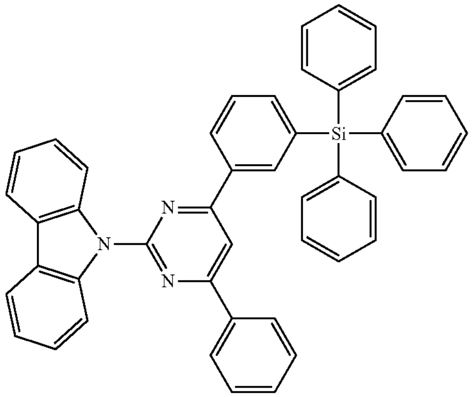

-continued
E6
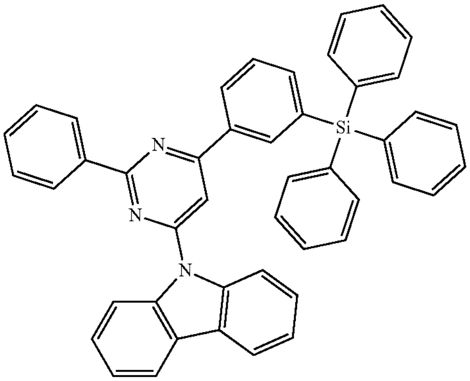
E7
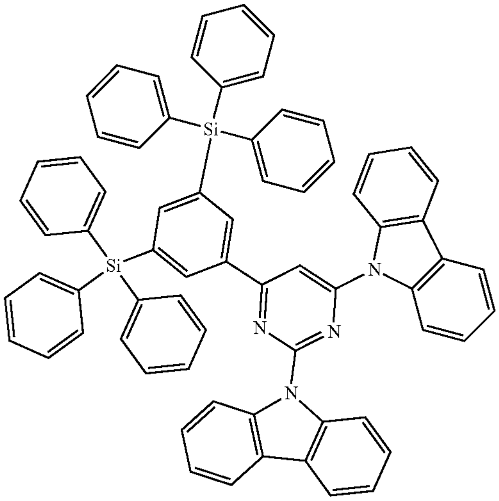
E8
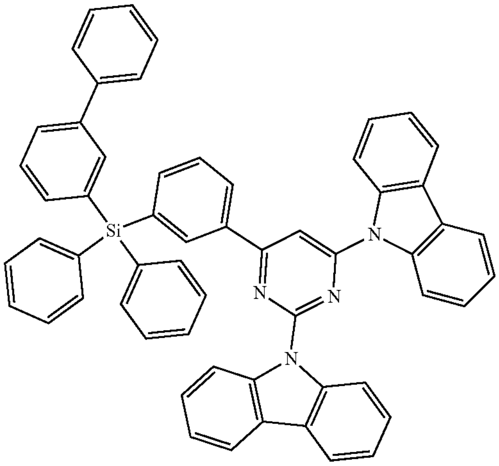
-continued
E9
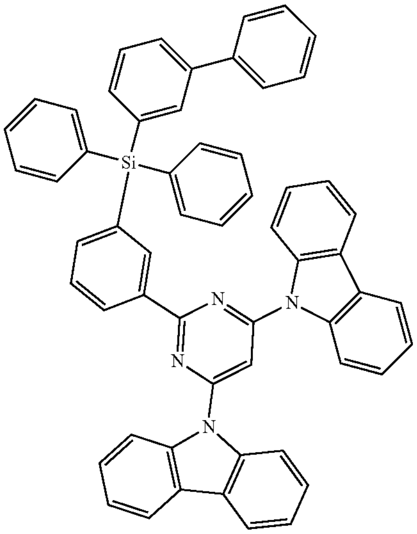
E10
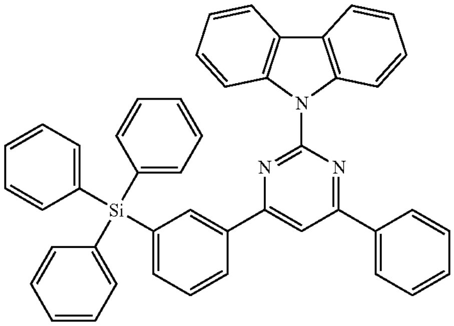
E11
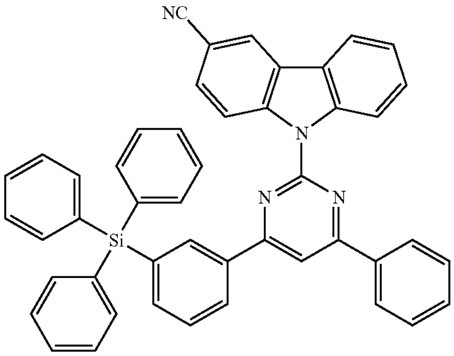
E12
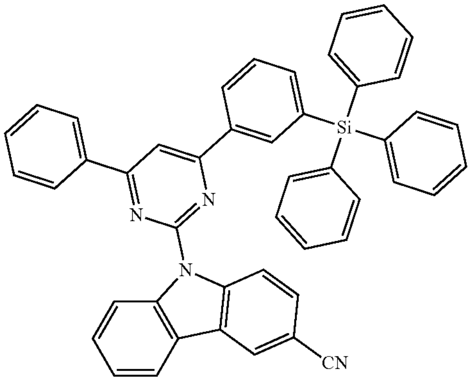

-continued
E13
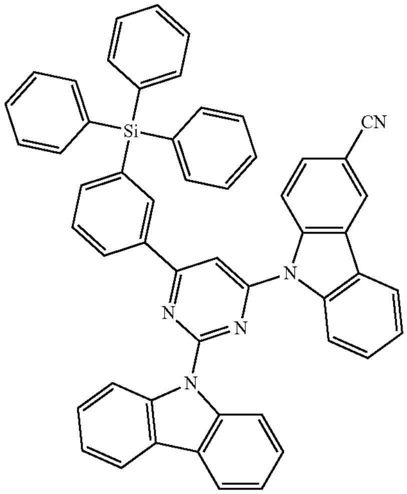
E14
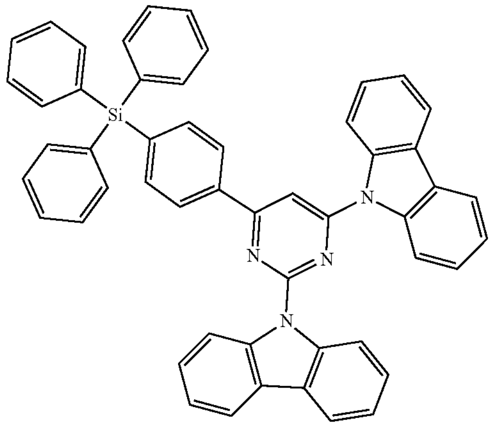
E15
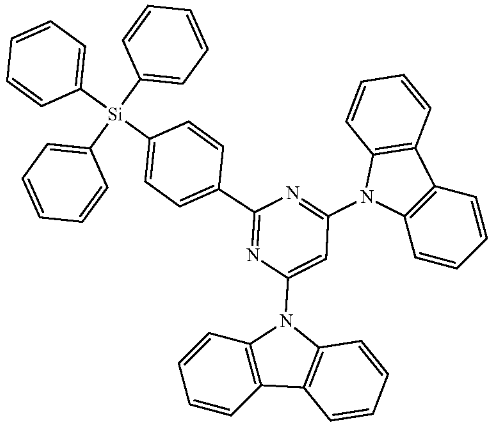
-continued
E16
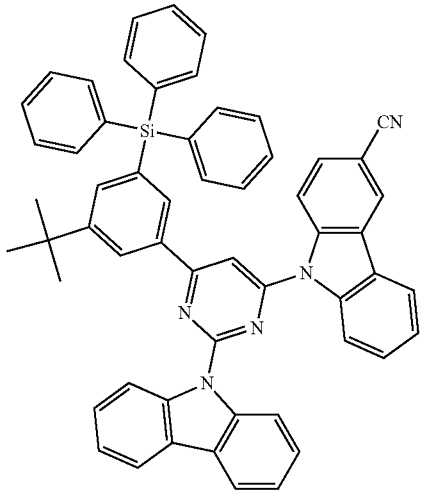
E17
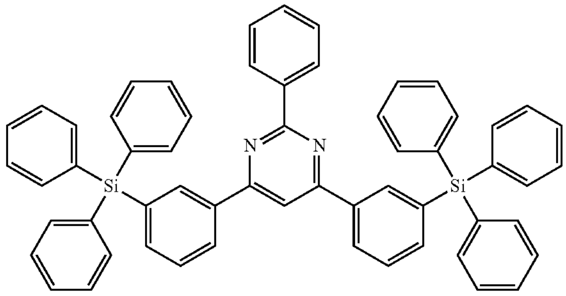
E18
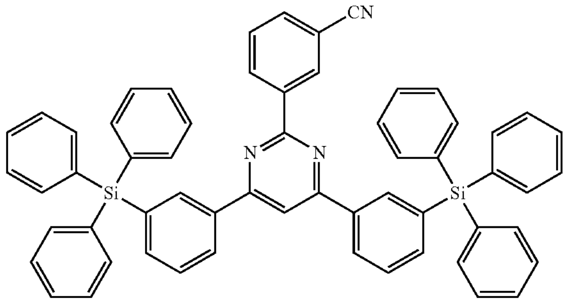
E19
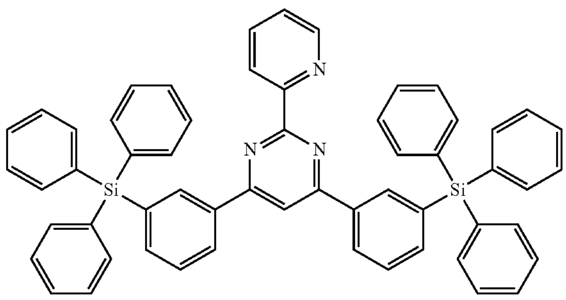

-continued
E20
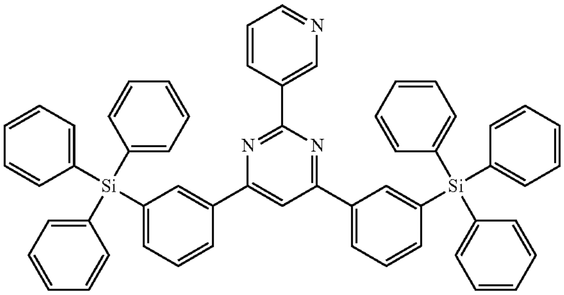
E21
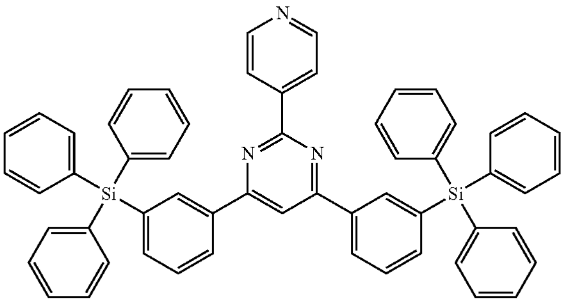
E22
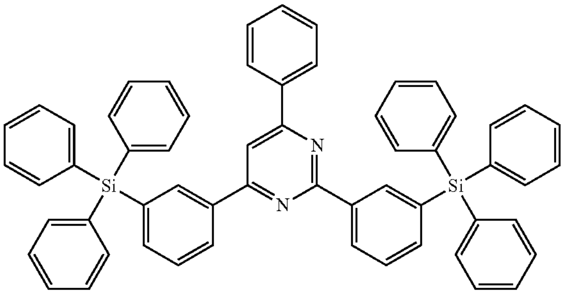
E23
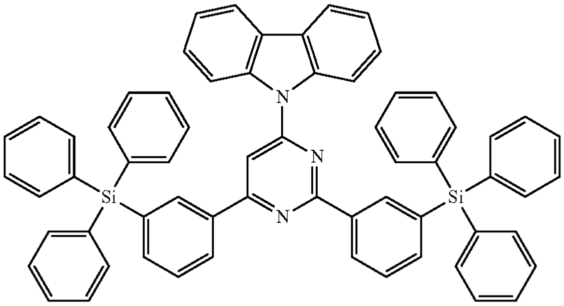
E24
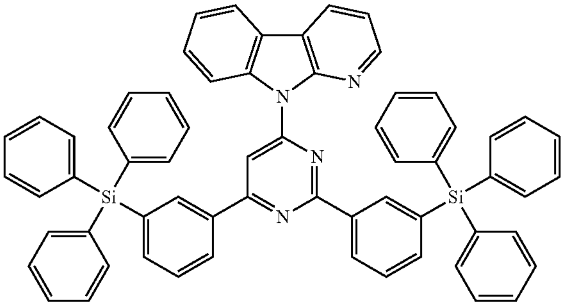
-continued
E25
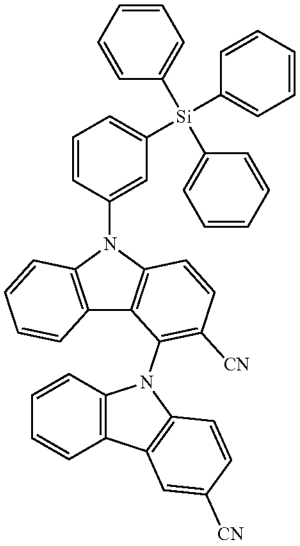
E26
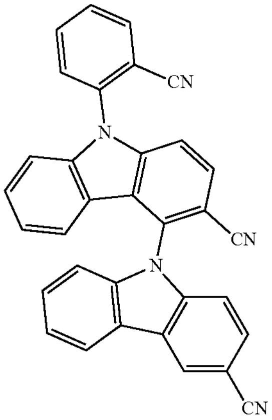
E27
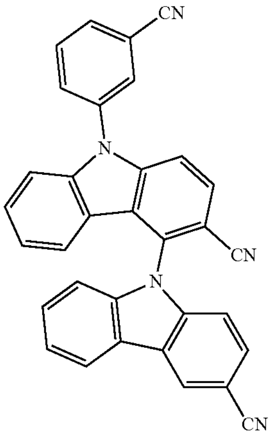

-continued
E28
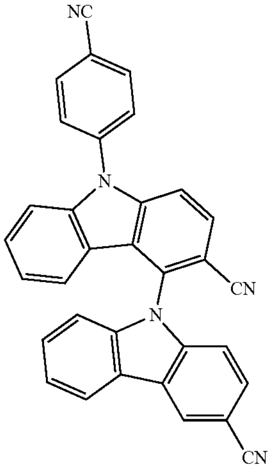
E29
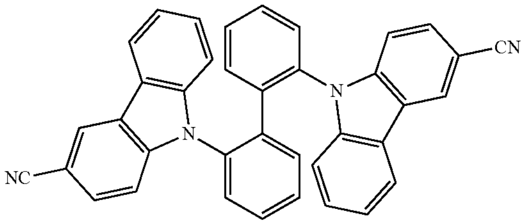
E30
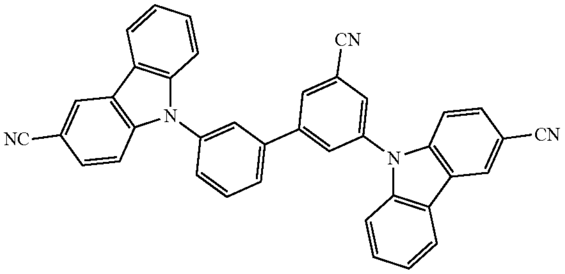
E31
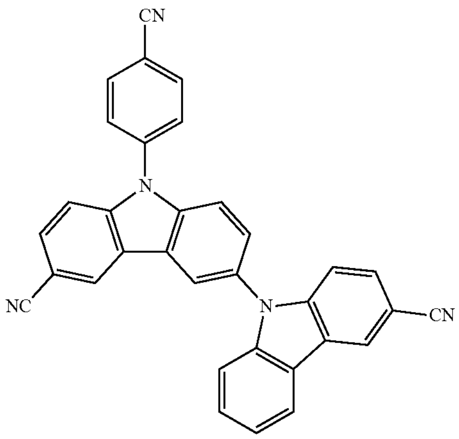
-continued
E32
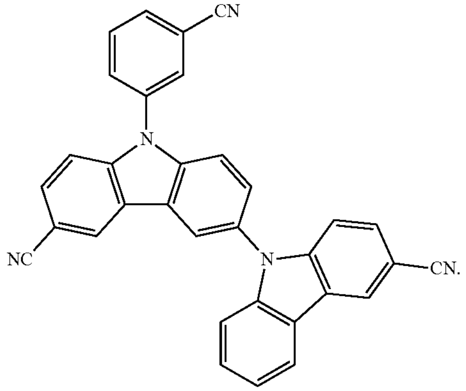
9. The light emitting element of claim 3, wherein the fourth compound comprises at least one selected from Compound Group 2:
[Compound Group 2]
H1
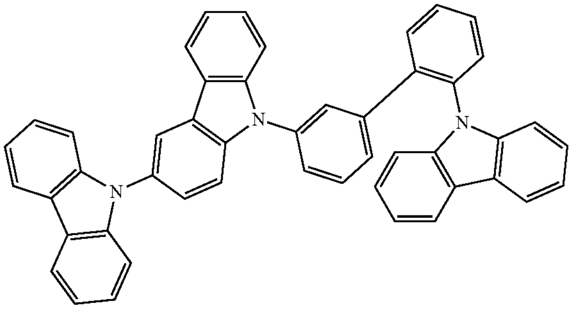
H2
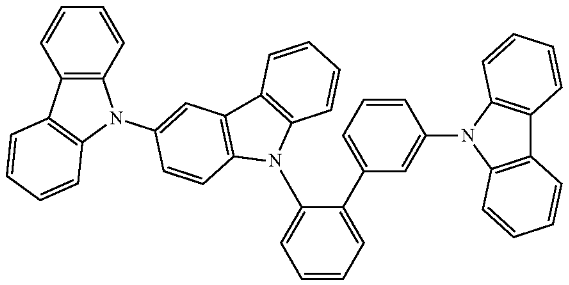

-continued
H3
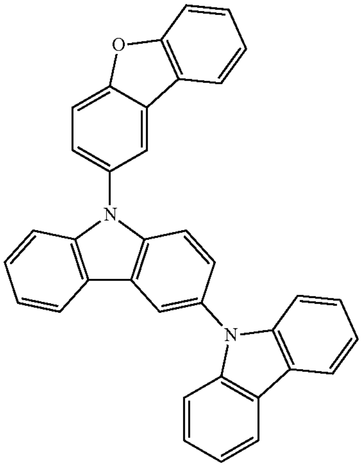
H4
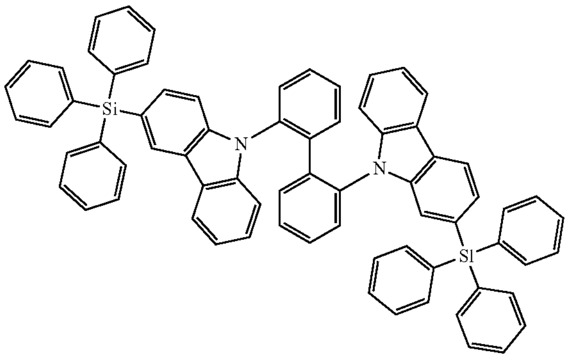
H5
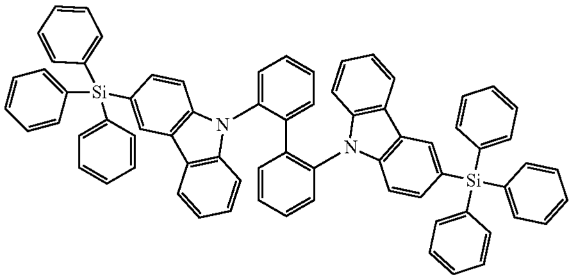
H6
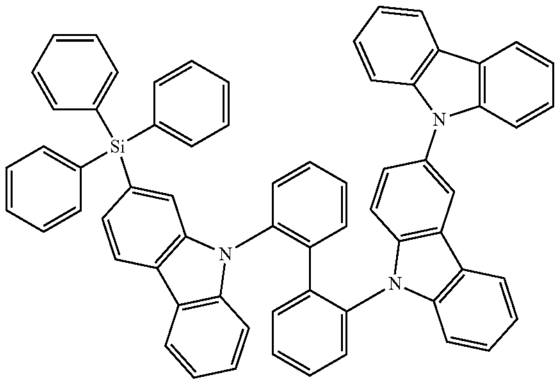
-continued
H7
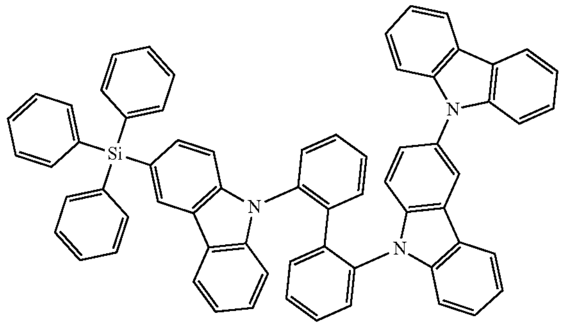
H8
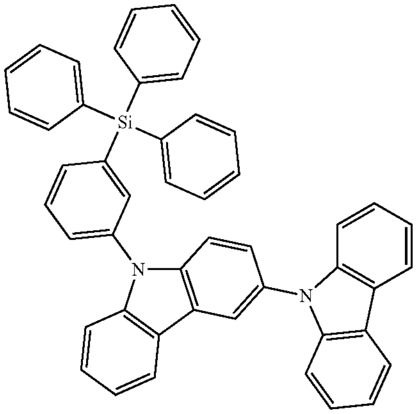
H9
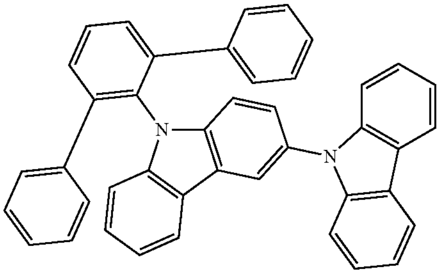
H10
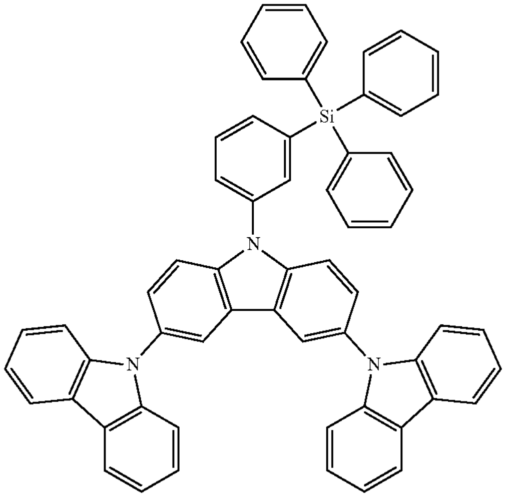

-continued
H11
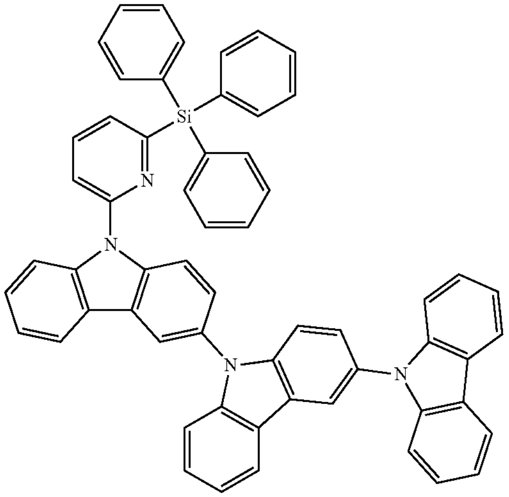
H12
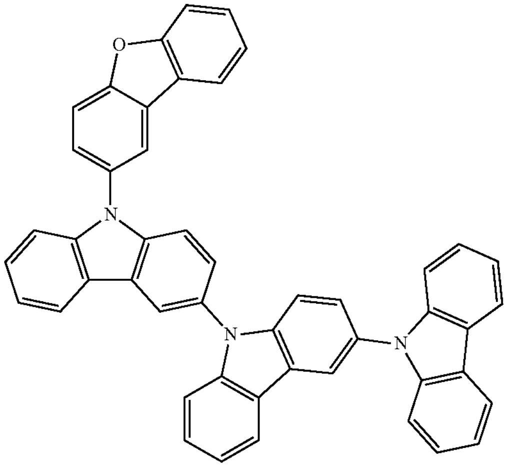
H13
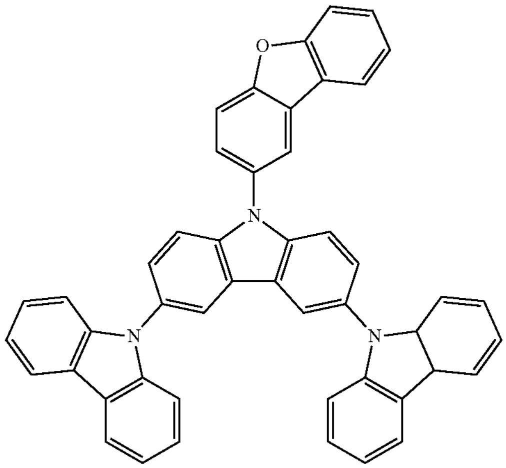
-continued
H14
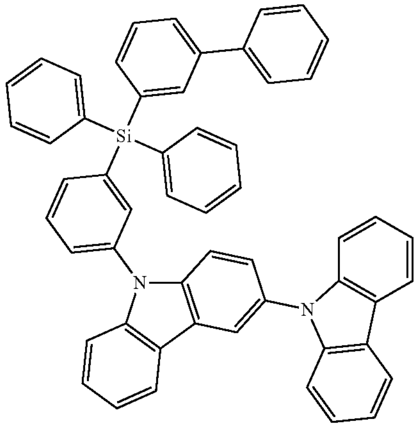
H15
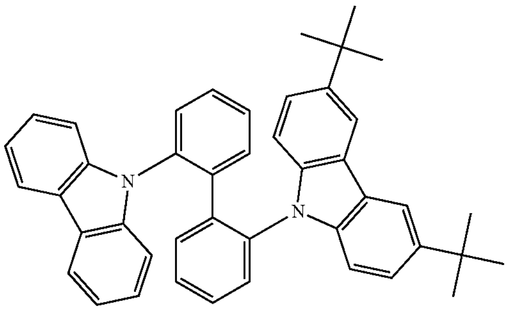
H16
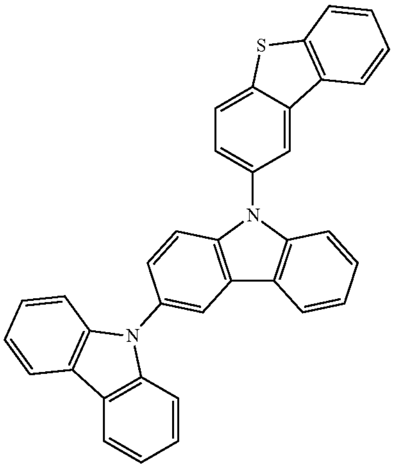

-continued
H17
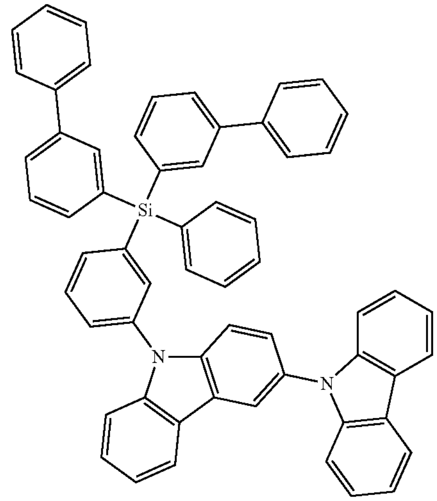
H18
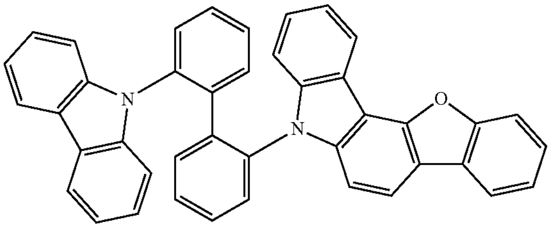
H19
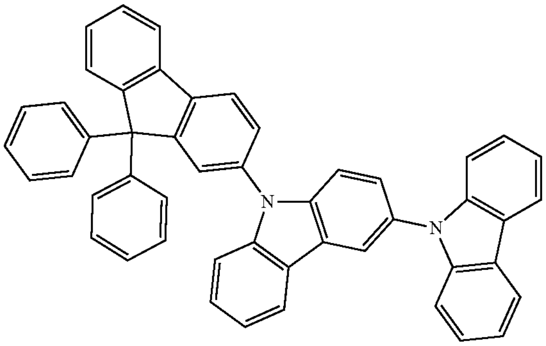
H20
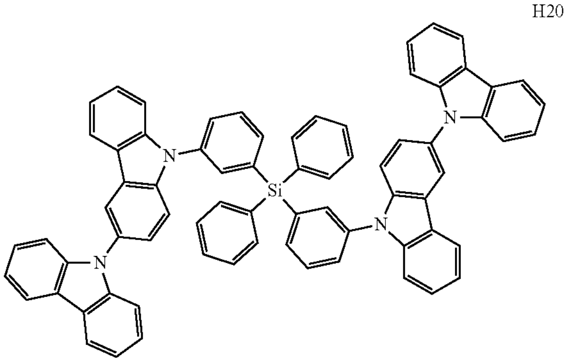
-continued
H21
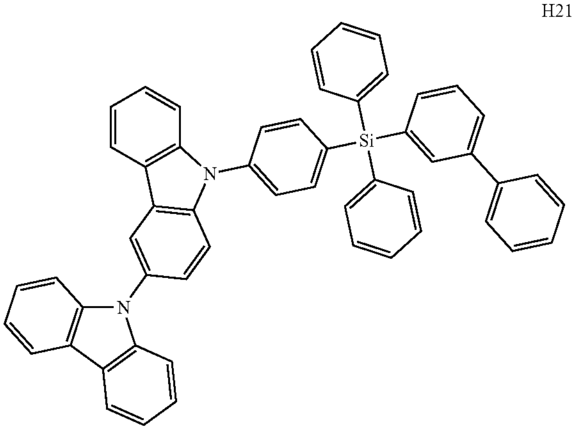
H22
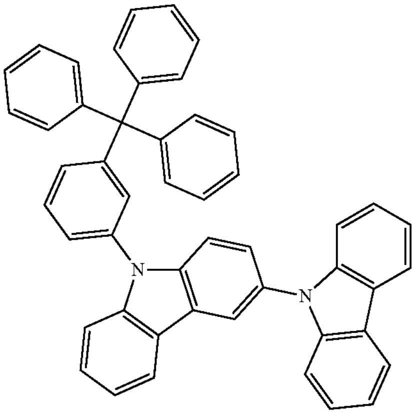
H23
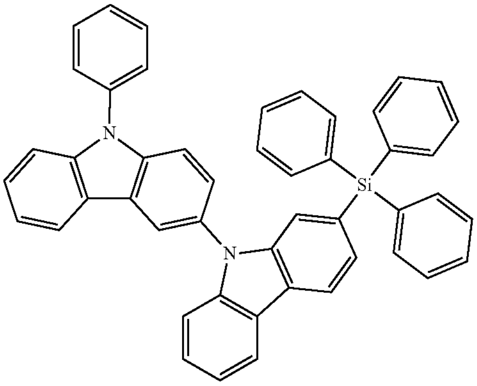

-continued
H24
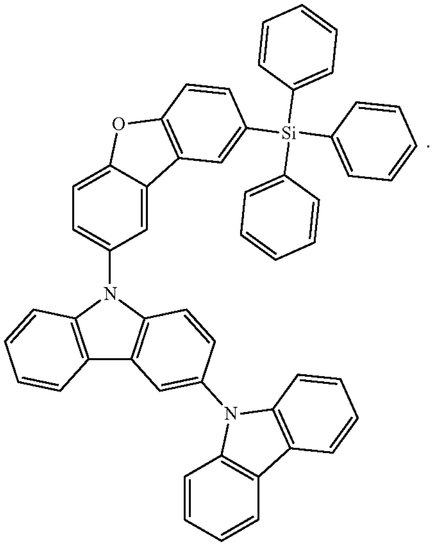
10. The light emitting element of claim 3, wherein the fifth compound comprises at least one selected from Compound Group 3:
[Compound Group 3]
BD1
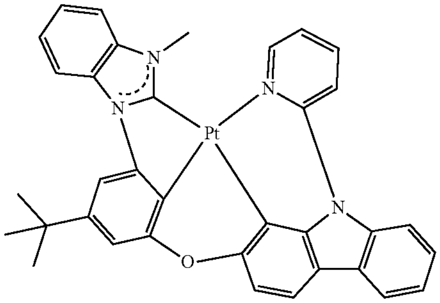
BD2
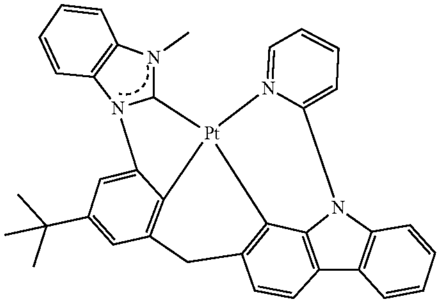
-continued
BD3
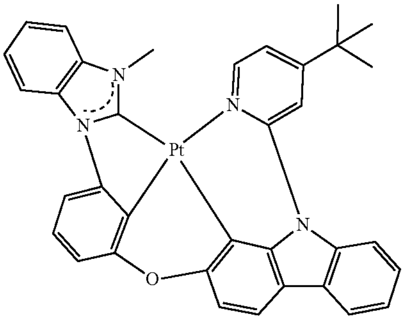
BD4
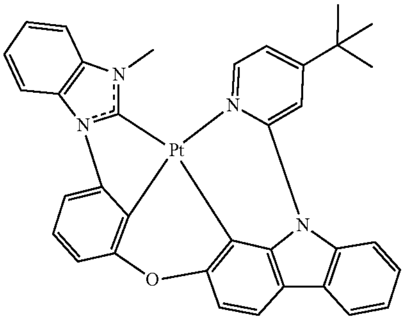
BD5
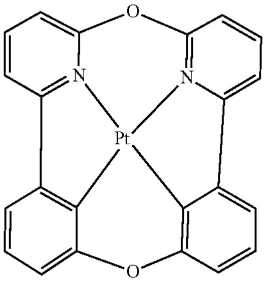
BD6
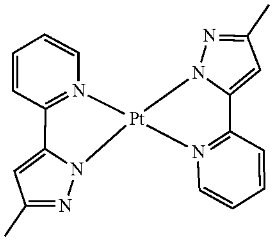
BD7
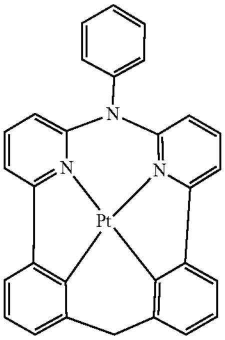

-continued

BD8

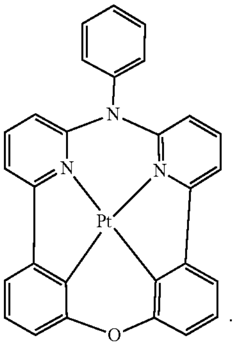

11. The light emitting element of claim 1, further comprising an electron transport region disposed between the double buffer layer and the second electrode.

12. A light emitting element, comprising:

a first electrode;

a second electrode disposed on the first electrode;

an emission layer disposed between the first electrode and the second electrode; and a double buffer layer comprising:

a first layer disposed on the emission layer; and a second layer disposed on the first layer, wherein the first layer comprises a first compound, the second layer comprises a second compound which is different from the first compound, and the first compound and the second compound are each independently represented by Formula 1 or Formula 2:

[Formula 1]

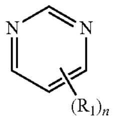

wherein in Formula 1, $R_1$ is a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, and n is an integer from 0 to 4,

[Formula 2]

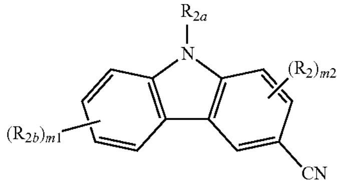

wherein in Formula 2, $R_{2a}$, $R_{2b}$, and $R_{2c}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, m1 is an integer from 0 to 4, and m2 is an integer from 0 to 3.

13. The light emitting element of claim 12, wherein the emission layer comprises:

a third compound represented by Formula 1 or Formula 2;

a fourth compound represented by Formula 3; and a fifth compound represented by the following Formula 4, and the third compound is different from at least one of the first compound and the second compound:

[Formula 3]

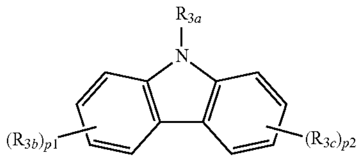

wherein in Formula 3, $R_{3a}$, $R_{3b}$, and $R_{3c}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and p1 and p2 are each independently an integer from 0 to 4,

[Formula 4]

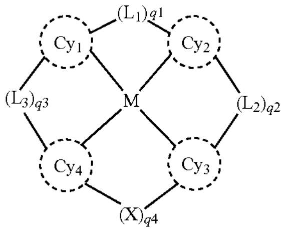

wherein in Formula 4,

M is Pt, Pd, Cu, Au, or Os,

X is O or $C(R_{4a})(R_{4b})$, $Cy_1$, $Cy_2$, $Cy_3$, and $Cy_4$ are each independently a substituted or unsubstituted hydrocarbon ring of 5 to 60 ring-forming carbon atoms, or a substituted or unsubstituted heterocycle of 1 to 60 ring-forming carbon atoms, $L_1$ to $L_3$ are each independently a direct linkage,

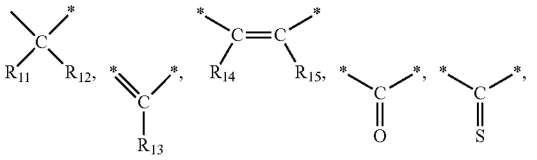

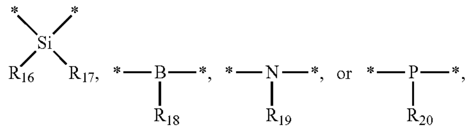

q1 to q4 are each independently 0 or 1, and $R_{4a}$, $R_{4b}$, and $R_{11}$ to $R_{20}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

14. The light emitting element of claim 13, wherein at least one of the first compound, the second compound, and the third compound is represented by Formula 1, and the at least one of the first compound, the second compound, and the third compound that is represented by Formula 1 is represented by Formula 1-1:

[Formula 1-1]

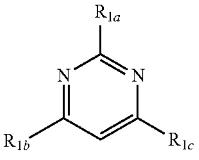

wherein in Formula 1-1, $R_{1a}$, $R_{1b}$, and $R_{1c}$ are each independently a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

15. The light emitting element of claim 14, wherein $R_{1a}$, $R_{1b}$, and $R_{1c}$ each independently comprises at least one substituent selected from Substituent Group S-1:

[Substituent Group S-1]

A1

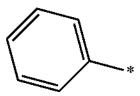

A2

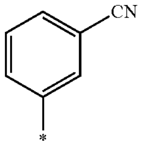

A3

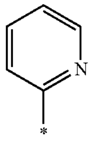

A4

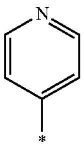

A5

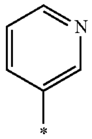

A6

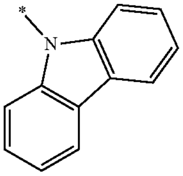

A7

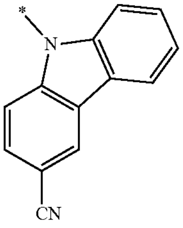

A8

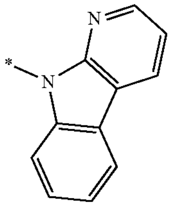

-continued

A9

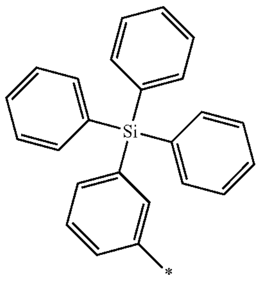

A10

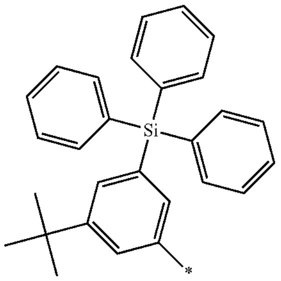

A11

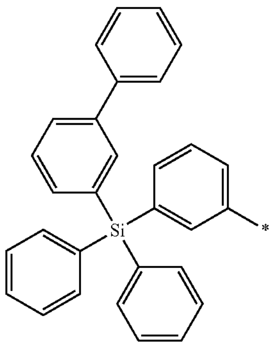

A12

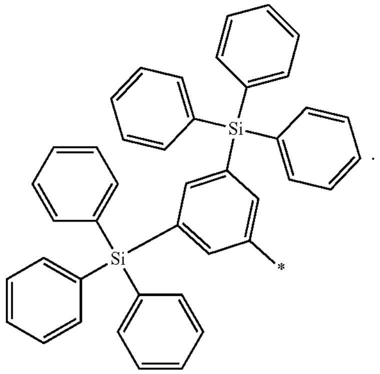

16. The light emitting element of claim 13, wherein at least one of the first compound, the second compound, and the third compound is represented by Formula 2, and the at least one of the first compound, the second compound, and the third compound that is represented by Formula 2 is represented by one of Formula 2-1, Formula 2-2, or Formula 2-3:

[Formula 2-1]

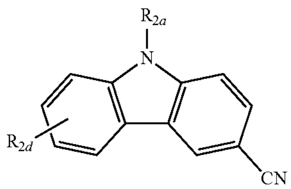

[Formula 2-2]

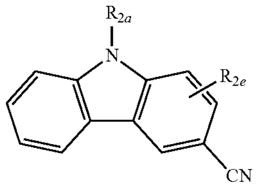

[Formula 2-3]

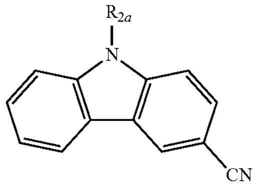

wherein in Formula 2-1 to Formula 2-3, $R_{2d}$ and $R_{2e}$ are each independently a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, are or combined with an adjacent group to form a ring, and $R_{2a}$ is the same as defined in Formula 2.

17. The light emitting element of claim 16, wherein $R_{2a}$ comprises at least one substituent selected from Substituent Group S-2:

[Substituent Group S-2]

B1

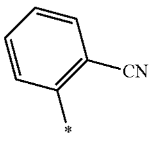

B2

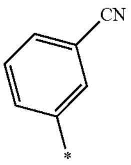

B3

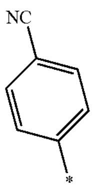

-continued

B4

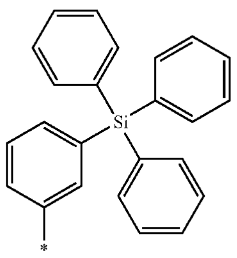

B5

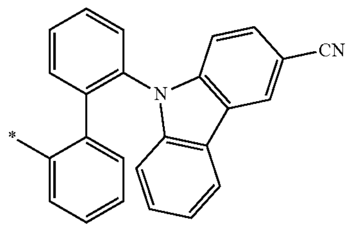

B6

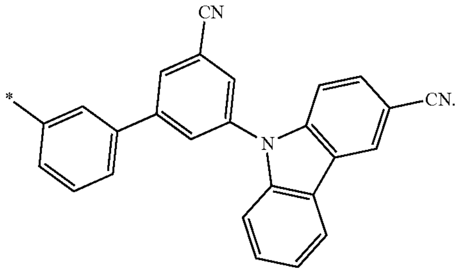

18. The light emitting element of claim 16, wherein $R_{2b}$ and $R_{2c}$ are each independently a hydrogen atom or a substituted or unsubstituted carbazole group.

19. A light emitting element, comprising:

a first electrode;

a second electrode disposed on the first electrode;

an emission layer disposed between the first electrode and the second electrode;

a double buffer layer comprising:

a first layer disposed on the emission layer; and a second layer disposed on the first layer; and an electron transport region disposed on the double buffer layer, wherein the first layer comprises a first compound, the second layer comprises a second compound which is different from the first compound, the emission layer comprises a third compound which is different from at least one of the first compound and the second compound, and the first compound, the second compound, and the third compound are each independently represented by Formula 1 or Formula 2:

[Formula 1]

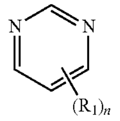

wherein in Formula 1, $R_1$ is a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or is combined with an adjacent group to form a ring, and n is an integer from 0 to 4,

[Formula 2]

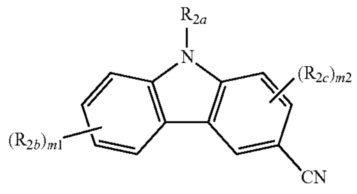

wherein in Formula 2, $R_{2a}$, $R_{2b}$, and $R_{2c}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, m1 is an integer from 0 to 4, and m2 is an integer from 0 to 3.

20. The light emitting element of claim 19, wherein the emission layer further comprises:

a fourth compound represented by Formula 3; and a fifth compound represented by Formula 4:

[Formula 3]

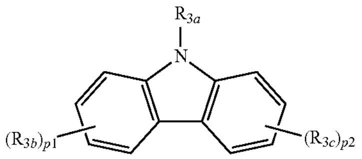

wherein in Formula 3, $R_{3a}$, $R_{3b}$, and $R_{3c}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and p1 and p2 are each independently an integer from 0 to 4,

[Formula 4]

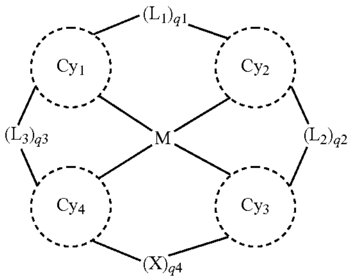

wherein in Formula 4,

M is Pt, Pd, Cu, Au, or Os,

X is O or $C(R_{4a})(R_{4b})$, $Cy_1$, $Cy_2$, $Cy_3$, and $Cy_4$ are each independently a substituted or unsubstituted hydrocarbon ring of 5 to 60 ring-forming carbon atoms, or a substituted or unsubstituted heterocycle of 1 to 60 ring-forming carbon atoms, $L_1$ to $L_3$ are each independently a direct linkage,

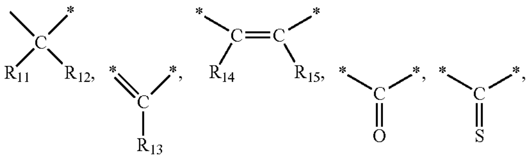

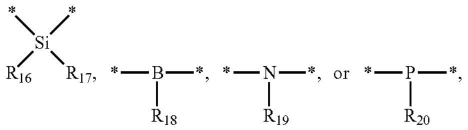

q1 to q4 are each independently 0 or 1, and $R_{4a}$, $R_{4b}$, and $R_{11}$ to $R_{20}$ are each independently a hydrogen atom, a deuterium atom, a halogen atom, a substituted or unsubstituted silyl group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring.

* * * * *